(12) United States Patent
Kawasaki

(10) Patent No.: US 7,898,608 B2
(45) Date of Patent: Mar. 1, 2011

(54) LIQUID CRYSTAL DISPLAY DEVICE AND A MANUFACTURING METHOD OF THE SAME

(75) Inventor: Kiyohiro Kawasaki, Osaka (JP)

(73) Assignee: Au Optronics Corporation, Hsin-Chu (TW)

( * ) Notice: Subject to any disclaimer, the term of this patent is extended or adjusted under 35 U.S.C. 154(b) by 733 days.

(21) Appl. No.: 11/902,259

(22) Filed: Sep. 20, 2007

(65) Prior Publication Data

US 2008/0020501 A1   Jan. 24, 2008

Related U.S. Application Data

(62) Division of application No. 10/963,800, filed on Oct. 14, 2004, now Pat. No. 7,292,288.

(30) Foreign Application Priority Data

Mar. 29, 2004   (JP) .................................. 2004-093944

(51) Int. Cl.
   *G02F 1/136*   (2006.01)
(52) U.S. Cl. ............................................ 349/43; 438/30
(58) Field of Classification Search ................... 349/43, 349/47; 438/30
   See application file for complete search history.

(56) References Cited

U.S. PATENT DOCUMENTS

| | | | |
|---|---|---|---|
| 5,459,092 A | * | 10/1995 | Kawasaki et al. ............... 438/30 |
| 5,691,782 A | * | 11/1997 | Nishikawa et al. ............. 349/47 |
| 6,124,904 A | | 9/2000 | Sato |
| 6,417,906 B2 | | 7/2002 | Ohta et al. |
| 6,493,046 B1 | | 12/2002 | Ueda |
| 2003/0038901 A1 | | 2/2003 | Baek et al. |

FOREIGN PATENT DOCUMENTS

| | | |
|---|---|---|
| JP | 63085586 (A) | 4/1988 |
| JP | 5313187 (A) | 11/1993 |
| JP | 7333275 (A) | 12/1995 |
| JP | 2002311454 (A) | 10/2002 |
| JP | 2002368011 (A) | 12/2002 |
| JP | 2003077933 (A) | 3/2003 |

\* cited by examiner

*Primary Examiner* — James A Dudek
(74) *Attorney, Agent, or Firm* — Bacon & Thomas, PLLC.

(57) ABSTRACT

A four-mask process and a three-mask process proposal are constructed for a TN-type liquid crystal display device and an IPS-type liquid crystal device in which the formation of a passivation insulating layer is not required by streamlining the formation of a scan line and a pseudo-pixel element, both comprising a laminate made of a transparent conductive layer and a metal layer, at the same time and the formation of the transparent conductive pixel electrode by removing the metal layer on the pseudo-pixel electrode at the time of the formation of the opening in the gate insulating layer, by streamlining the treatment of the formation process of the contact and the formation process of the protective insulating layer using one photomask due to the introduction of half-tone exposure technology, and the formation of source-drain wires for etch-stop type insulating gate-type transistor using a photosensitive organic insulating layer and leaving the photosensitive organic insulating layer unchanged on source-drain wires or on the source wire (signal line), or by forming an anodized layer, which is an insulating layer, on source-drain wires.

2 Claims, 35 Drawing Sheets

LIQUID CRYSTAL DISPLAY DEVICE AND A MANUFACTURING METHOD OF THE SAME

FIELD OF THE INVENTION

The present invention relates to a liquid crystal display device with a color image display function, and in particular to an active-type liquid crystal display device.

DESCRIPTION OF THE RELATED ART

Televisions and various other image display devices that have a liquid crystal display 5 to 50 cm in diagonal length are commercially available in mass quantity through the progress in recent years in micro-fabrication, liquid crystal material, high-density packaging technology, and other such technologies. In addition, color displays can easily be obtained by forming an RGB color layer on one of the two glass substrates composing the liquid crystal panel. In particular, in a so-called active liquid crystal panel with a switching element inside each pixel, there is little cross-talk, the response rate is high, and images with a high contrast ratio are guaranteed.

For these liquid crystal displays (liquid crystal panels), the matrix organization generally comprises from 200 to 1200 scan lines and from around 300 to 1600 signal lines, but recently increases in screen size and definition are progressing simultaneously in response to the increase in display capacity.

FIG. 29 shows a state of liquid crystal panel packaging in which electric signals are provided to an image display part using packaging means such as COG (Chip-On-Glass) in which a conductive adhesive is used to connect a semiconductor integrated-circuit chip 3 for supplying a drive signal to an electrode terminals 5 on scan lines formed on one of the transparent insulating substrates composing a liquid crystal panel 1, for example a glass substrate 2, or TCP (Tape-Carrier-Package) for fixing a TCP film 4, to an electrode terminals 6 on signal lines using pressure and a suitable adhesive including a conductive medium using, for example, a thin polyamide-base plastic film with copper foil terminals plated with gold or solder as a base. Herein, both of these packaging methods are shown at the same time for convenience, but in actual practice, either method may be arbitrarily selected.

Wire paths connecting the interval between the pixels in the image display area positioned nearly in the center of a liquid crystal panel 1 and terminals 5 and 6 of scan lines and signal lines are 7 and 8, and do not necessarily need to be constructed of the same conductive material as the electrode terminals 5 and 6. 9 is a color filter or an opposing glass filter that is another transparent insulating substrate having a transparent conductive opposing electrode on its opposing side, which is common to all the liquid crystal cells.

FIG. 30 shows an equivalent circuit of an active-type liquid crystal display device with an insulating gate-type transistor 10 disposed as a switching element at each pixel. In the figure, 11 (7 in FIG. 29) is a scan line, 12 (8 in FIG. 28) is a signal line, 13 is a liquid crystal cell, and the liquid crystal cell 13 is treated as a capacitance element electrically. The elements drawn with solid lines are formed on the glass substrate 2, one of the glass substrates composing the liquid crystal panel, and an opposing electrode 14 drawn with dotted lines common to all the liquid crystal cells 13 are formed on the main surface opposite the other glass substrate 9. If the "off" resistance of the insulating gate-type transistor 10 or the resistance of the liquid crystal cell 13 is low, or if gradation in the displayed image is to be emphasized, circuitry innovation may be introduced such as adding an auxiliary storage capacitor 15 in parallel with the liquid crystal 13 as a load to increase the time constant thereof. 16 is a storage capacitor line forming a mother line common to the storage capacitors 15.

FIG. 31 shows a cross-sectional view of the essential part of an image display area of a liquid crystal display device. The two glass substrates 2 and 9 composing the liquid crystal panel 1 are formed separated by a specified distance of several μm by a spacer material (not illustrated) such as pillar-shaped resin spacers formed on a color filter 9, plastic fibers, or plastic beads, and that gap is a closed space sealed by a sealing material and an end sealing material made from an organic resin (neither of which are illustrated) at the periphery of the glass substrate 9, and the gap is filled with liquid crystal 17.

To obtain a color display, a thin organic film of about 1 to 2 μm thick, including either a dye or pigment or both, called a color layer 18, is deposited on the closed space side of the glass substrate 9, providing a color display function, in which case the glass substrate 9 may also be referred to by the name a color filter (abbreviated as CF). Depending on the property of the liquid crystal material 17, a polarization plate 19 is attached to the top of the glass substrate 9 or the bottom of the glass substrate 2 or both, so the liquid crystal panel 1 functions as an electro-optical element. TN (Twisted Nematic)-type liquid crystal material is currently used in most liquid crystal panels available commercially, and two polarization plates 19 are normally required. Although not illustrated, a back light source is disposed as a light source in the transmission-type liquid crystal panel, irradiating white light from below.

A thin polyimide-type resin film 20 about 0.1 μm thick, for example, formed on the two glass substrates 2 and 9 and in contact with the liquid crystal 17 is an alignment film for orientating liquid crystal molecules in a fixed direction. 21 is a drain electrode (wire) for connecting a drain of the insulating gate-type transistor 10 and a transparent conductive pixel electrode 22, and is often formed at the same time as a signal line (source line) 12. A semiconductor layer 23 is positioned between the signal line 12 and the drain electrode 21 and is described in further detail below. A thin Cr film layer 24 about 0.1 μm thick formed at the interface of the adjacent color layer 18 on the color filter 9 is a light shield material for preventing external light from radiating on the semiconductor layer 23, the scan line 11, or the signal line 12. This is an established technology referred to as black matrix (abbreviated as BM).

Next, a description is given of the structure of an insulating gate-type transistor as a switching element and its manufacturing method. Two types of insulating gate-type transistors are currently used commonly, one of which will be introduced as a prior art example and be referred to as an etch-stop type. FIG. 32 is a plane view of a unit pixel of an active substrate (semiconductor device for display devices) composing a conventional liquid crystal panel. Cross-section views of lines A-A', B-B' and C-C' in FIG. 32(e) are shown in FIG. 33. The manufacturing process is described briefly below.

First, a first metal layer about 0.1 to 0.3 μm thick is deposited over the main surface of a glass substrate 2, product name 1737 manufactured by Corning, Incorporated, for example, about 0.5 to 1.1 mm thick as an insulating substrate with high transparency, chemical-resistance, and heat-resistance, and scan lines doubling as gate electrodes 11A and storage capacitor lines 16 are selectively formed using a photosensitive resin pattern with micro-fabrication technology as shown in FIG. 32(a) and FIG. 33(a). The material for the scan line may be selected taking into consideration the combined properties of heat-resistance, chemical-resistance, hydrofluoric acid resistance, and conductance, though an alloy or a metal with a high heat resistance such as a Cr, Ta or MoW alloy is generally used.

While using Al (aluminum) as the material for the scan lines is reasonable for lowering the resistance value of the scan lines in response to the larger screens and higher definition of liquid crystal panels, by itself, Al has a low heat resistance, so adding an oxide layer ($Al_2O_3$) in anodization of the Al surface or laminating with Cr, Ta or Mo or a silicide thereof as the heat resistance metal is currently the general technology in use. In other words, the scan lines 11 are constructed of one or more metal layers.

Next, a PCVD (plasma CVD) equipment is used to successively deposit three thin film layers about 0.3, 0.05, and 0.1 μm thick, for example, comprising a first $SiN_x$ (silicon nitride) layer 30 composing a gate insulating layer, a first amorphous silicon (a-Si) layer 31 composing a channel for an insulating gate-type transistor including almost no impurities, and a second $SiN_x$ layer 32 composing an insulating layer for protecting the channel, over the entire surface of the glass substrate 2, and micro-fabrication technology is used to selectively leave the second $SiN_x$ layers above the gate electrodes 11A narrower than the gate electrodes 11A to form protection layers 32D as shown in FIGS. 32(b) and 33(b), exposing the first amorphous silicon layer 31.

Continuing, the second amorphous silicon layer 33 including phosphorous, for example as an impurity, is deposited about 0.05 μm thick, for example, over the entire surface similarly using the PCVD equipment. Then, a thin film layer 34 of Ti, Cr, Mo, or the like, for example, is deposited as a heat-resistant metal layer about 0.1 μm thick, an Al thin film layer 35 about 0.3 μm thick is deposited as a low-resistance wiring layer, and a Ti thin layer, for example, is deposited as an intermediate conductive layer about 0.1 μm thick. Drain electrodes of insulating gate-type transistors comprising a laminate made of the three thin film layers 34A, 35A, and 36A, which are source-drain materials, and signal lines 12 doubling as source electrodes are selectively formed with micro-fabrication technology using a photosensitive resin pattern as shown in FIG. 32(c) and FIG. 33(c). This selective patterning is made by successively etching the Ti thin film layer 36, the Al thin film layer 35, and the Ti thin film layer 34 using a photosensitive resin pattern used in forming the source-drain wires as a mask, and then removing the second amorphous silicon layer 33 between the source-drain electrodes 12 and 21 to expose the protective insulating layers 32D as well as removing the first amorphous silicon layer 31 in other regions to expose the gate insulating layer 30. Because the second SiNx layers 32D (protective insulating layers, etch stop layers), which are layers for protecting the channels, are thus present, and the etching of the second amorphous silicon layer 33 automatically ends, this manufacturing method is called etch-stop.

Next, after removing the said photosensitive resin pattern, an SiNx layer about 0.3 μm thick is deposited over the entire surface of the glass substrate 2 similarly to the gate insulating layer as a transparent insulating layer using the PCVD equipment to form a passivation insulating layer 37. The passivation insulating layer 37 is selectively removed using a photosensitive resin pattern with micro-fabrication technology to form openings 62 on the drain electrodes 21, openings 63 on the scan lines, and openings 64 on the signal line 12 outside an image display area to expose the drain electrodes 21, part 5 of the scan lines 11, and part 6 of the signal lines 12 as shown in FIG. 37(d) and 38(d). Openings 65 are similarly formed on the electrode patterns bundled and in parallel with the storage capacitor lines 16 to expose part of the storage capacitor lines 16.

Finally, ITO (Indium-Tin-Oxide) or IZO (Indium-Zinc-Oxide), for example, is deposited as a transparent conductive layer about 0.1 to 0.2 μm thick using an SPT or other vacuum film-depositing equipment, and pixel electrodes 22 are selectively formed on the passivating insulating layer 37 containing the openings 62 using a photosensitive resin pattern with micro-fabrication technology to complete the active substrate 2 as shown in FIGS. 32(e) and 33(e). Part of the scan lines 11 exposed in the openings 63 may be used as the electrode terminals 5, and part of the signal lines 12 exposed in the openings 64 as the electrode terminals 6, and the electrode terminals 5A and 6A made from ITO on the passivating insulating layer 37 containing the openings 63 and 64 may be selectively formed as illustrated, but a transparent conductive short line 40 is ordinarily formed at the same time connecting the electrode terminals 5A and 6A. The reason for this is so a high resistance can be made as a measure against static electricity by forming the interval between the electrode terminals 5A and 6A and the short wire 40 into a long, narrow striped form to increase the resistance (not illustrated). Similarly, electrode terminals (not illustrated) are formed on the storage capacitor lines 16 containing the openings 65, though a number thereof is not provided.

If wiring resistance of the signal wire 12 is not a problem, a low-resistance wire layer 35 made from Al is not necessarily required, in which case it is possible to simplify the layers of the source-drain wires 12 and 21 by selecting a heat-resistant metal material such as Cr, Ta, or Mo. Ensuring an electrical connection with the second amorphous silicon layer using a heat-resistant metal layer is thus more important for the source-drain wires; the heat resistance of an insulating gate-type transistor is described in detail in Unexamined Patent Application Number H 7-74368 [i.e., 1995-74368] as an example of prior art. A region 50 (a right-slanting oblique portion) over which the storage capacitor line 16 and the drain electrode 21 are superimposed in a planar manner via the gate insulating layer 30 in FIG. 32(c) forms a storage capacitor 15, though a detailed description is omitted here.

A detailed history of the five-mask process described above is omitted, but it is obtained as the result of streamlining the semiconductor islanding processing and decreasing the number of contact formation processes. Photomasking, which initially required seven to eight processes, has been reduced to the current five layers by the introduction of dry etching technology, which greatly contributes to the decreasing process costs. It is a well-known target of development that lowering the process cost in the manufacture of the active substrate and the material cost in the panel assembly and module packaging processes is effective in lowering the production costs of liquid crystal display devices. To lower process costs, either process may be eliminated to make the process shorter, or inexpensive process development or inexpensive process replacement is available. Here, a four-mask process resulting in an active substrate with four photomasks is described as an example of eliminating processes. The photo-etching process is eliminated by introducing half-tone exposure technology. FIG. 34 shows a plane view of a unit pixel in an active substrate corresponding to the four-mask process. The cross-section views of lines A-A', B-B' and C-C' in FIG. 34(e) are shown in FIG. 35. As already mentioned, two types of insulating gate-type transistors are commonly in use. Here, a channel etch-type insulating gate-type transistor is used.

First, a first metal layer about 0.1 to 0.3 μm thick is deposited on the main surface of the glass substrate 2 using an SPT or other vacuum film-depositing equipment similar to as done in the five-mask process, and the storage capacitor lines 16 and scan lines 11 doubling as the gate electrodes 11A are selectively formed using a photosensitive resin pattern with micro-fabrication technology as shown in FIGS. 34(a) and 35(a).

Next, three thin film layers comprising the SiNx layer 30 composing a gate insulating layer, a first amorphous silicon layer 31 composing a channel for an insulating gate-type transistor including hardly any impurities, and a second amorphous silicon layer 33 composing a source and drain for an insulating gate-type transistor including impurities are successively deposited about 0.3 to 0.2 to 0.05 μm, for example, over the entire surface of the glass substrate 2 using a PCVD equipment. Next, a Ti thin film layer 34, for example, as a heat-resistant metal layer about 0.1 μm thick, an Al thin film layer 35 as a low-resistance wire layer about 0.3 μm thick, and a Ti thin film layer 36, for example, as an intermediate conductive layer about 0.1 μm thick, that is, source-drain wire materials are successively deposited using an SPT or other vacuum film-depositing equipment. Drain electrode of insulating gate-type transistors and signal lines 12 doubling as source electrodes are selectively formed, but in this selective patterning, forming photosensitive resin patterns 80A and 80B thinner than the 3 μm of source-drain wiring formation regions 80A(12) and 80A(21) with the channel formation region 80B (oblique portion) between the source-drain 1.5 μm thick, for example, as shown in FIGS. 34(b) and 35(b) using half-tone exposure technology is a major feature of the streamlined four-mask process.

For such photosensitive resin patterns 80A and 80B, a positive photosensitive resin is ordinarily used in the production of substrates for liquid crystal display devices, so a black, that is, a thin Cr film is formed for the source-drain wiring formation region 80A, a gray, line and space Cr pattern is formed with a width of 0.5 to 1 μm, for example, for the channel region 80B, and for other regions, a photomask may be used to make them white, that is, remove the thin Cr film. It is possible to transmit about half of the photomask transmissive light from a lamp source because the lines and spaces are not resolved due to inadequate resolution of exposure equipments, so the photosensitive resin patterns 80A and 80B may be obtained in the gray region having a concave cross-section shape such as that shown in FIG. 35(b) corresponding to the residual film characteristics of the positive-type photosensitive resin. By forming an $MoSi_2$ thin film having different transmission of light from the lamp source, for example, rather than a Cr thin film slit in the gray region, a photomask with an equivalent function may be obtained.

After successively etching the Ti thin film layer 36, the Al thin film layer 35, the Ti thin film layer 34, the second amorphous silicon layer 33, and the first amorphous silicon layer 31 using the said photosensitive plastic patterns 80A and 80B as masks to expose the gate insulating layer 30 as shown in FIG. 35(b), the photosensitive resin patterns 80A and 80B are decreased at least 1.5 μm by ashing means such as oxygen plasma, eliminating the photosensitive resin pattern 80B to expose the channel region, and leaving 80C (12) and 80C (21) only on the source-drain wiring formation region as shown in FIGS. 34(c) and 35(c). The Ti thin film layer, Al thin film layer, Ti thin film layer, second amorphous silicon layer 33A, and first amorphous silicon layer 31A are successively etched again using the reduced photosensitive resin patterns 80C (12) and 80C (21) as masks, and then the first amorphous silicon layer 31A is etched leaving around 0.05 to 0.1 μm.

After the metal layer is etched, the first amorphous silicon layer 31A is etched leaving around 0.05 to 0.1 μm, forming the source-drain wires, so the insulating gate-type transistor obtained with such a method is referred to as a channel-etch. The resist pattern 80A is reduced so as to be converted to 80C in the said plasma treatment, so it is desirable to strengthen the anisotropicity to suppress changes in the pattern dimensions. In further detail, RIE (Reactive Ion Etching) oxygen plasma treatment is desirable, and ICP (Inductive Coupled Plasma), or TCP (Transfer Coupled Plasma) oxygen plasma treatment with a higher density plasma source is even more desirable.

After removing the said photosensitive resin patterns 80C (12) and 80C (21), a second SiNx layer about 0.3 μm thick is deposited as a transparent insulating layer over the entire surface of the glass substrate 2 to make a passivation insulating layer 37; openings 62, 63, and 64 are formed on the drain electrodes 21 and in regions to be formed for the electrode terminals of the scan line 11 and the signal line 12 respectively, using a photosensitive resin pattern with micro-fabrication technology as shown in FIG. 34(d) and FIG. 35(d); the gate insulating layer 30 and the passivation insulating layer 37 in the openings 63 are removed to expose part 5 of the scan lines in the openings 63; and the passivation insulating layer 37 in the openings 62 and 64 is removed to expose part of the drain electrodes 21 and part 6 of the signal lines. Similarly, openings 65 are formed on the storage capacitor lines 16 to expose part thereof.

Finally, ITO or IZO, for example, is deposited as a transparent conductive layer about 0.1 to 0.2 μm thick using an SPT or other vacuum film-depositing equipment, and transparent conductive pixel electrodes 22 containing the openings 62 are selectively formed on the passivation insulating layer 37 using a photosensitive resin pattern with micro-fabrication technology to complete the active substrate 2 as shown in FIG. 34(e) and FIG. 35(e). For the electrode terminals, transparent conductive electrode terminals 5A and 6A made from ITO are selectively formed on the passivation insulating layer 37 containing the openings 63 and 64.

In this manner, the contacts formation processes for the drain electrode 21 and the scan line 11 are carried out at the same time in both the five-mask and four-mask processes, so the thickness and type of the insulating layers in the openings 62 and 63 corresponding thereto differ. The film deposition temperature is lower and the film quality inferior in the passivation insulating layer 37 than in the gate insulating layer 30, the etching rate when using a hydrofluoric acid etching liquid differs by a magnitude of 10 at several thousand Å/minute and several hundred Å/minute respectively, and because the hole diameter cannot be controlled due to an excess of over-etching on the top of the cross-sectional shape of the opening 62 on the drain electrode 21, dry etching utilizing a fluoride gas is used.

Even if dry etching is used, the opening 62 on the drain electrode 21 is only in the passivation insulating layer 37, so unlike the opening 63 of the scan line 11, over-etching of the opening 62 cannot be avoided, and depending on the material, the intermediate conductive layer 36A may be decreased by the etching gas. In the removal of the photosensitive resin pattern after the etching is complete, about 0.1 to 0.3 μm of the surface of the photosensitive resin pattern is first etched away with oxygen plasma ashing to remove the polymer on the fluoridated surface, then chemical treatment is generally carried out using an organic stripper such as stripper 106 manufactured by Tokyo Ohka Kogyo or the like, though when the intermediate conductive layer 36A is reduced to expose the base aluminum layer 35A, an $Al_2O_3$ insulator is formed on the surface of the aluminum layer 35A in oxygen plasma ashing treatment, losing good ohmic contact with the pixel electrode 22. This problem may be avoided by setting the film thickness to 0.2 μm, for example, so the intermediate conductive layer 36A may be reduced. Alternately, an avoidance measure is possible wherein the aluminum layer 35A is removed when forming the openings 62 to 65 to expose the thin film layer 34A which is the base heat-resistant metal layer and then form the pixel electrode 22. This measure has the advantage that the intermediate conductive layer 36A is not required from the beginning.

Still, with the former measure, if the uniformity in these film thickness surfaces is unfavorable, this approach may not necessarily act effectively either, and this applies identically to cases where the surface uniformity in the etch rate is also unfavorable. With the latter measure, the intermediate conductive layer 36A is unneeded, but a removal process for the aluminum layer 35A is added, and there is the danger that the picture element electrode 22 may be cut off if the cross-section control of the opening 62 is inadequate.

In addition, if the first amorphous silicon layer 31 not including impurities in the channel region is in no way deposited such as to be on the thick side (ordinarily 0.2 μm or thicker) in the channel etch-type insulating gate-type transistor, the uniformity in the glass substrate surface is greatly affected, leading to a tendency for the transistor characteristics and particularly the "off" current to be irregular. This is greatly affected by the PCVD operation rate and the generation of particles, and is an extremely important item from the perspective of production costs.

Further, in the channel formation process applied in the four-mask process, the source-drain wire material between the source-drain wires 12 and 21 and the semiconductor layers are selectively removed, so this channel formation process determines the length of the channel (4 to 6 μm in products currently being mass produced), which greatly affects the "on" characteristics of the insulating gate-type transistor. Fluctuation in the channel length greatly alters the "on" current value of the insulating gate-type transistor, so strict manufacturing controls are ordinarily required, but the channel length, that is, the pattern dimensions of the half-tone exposure region, is greatly affected by many parameters such as the exposure value (light source strength and photomask pattern precision and particularly the line and space dimensions), coating thickness of the photosensitive resin, developing of the photosensitive resin, and the amount of reduction in the photosensitive resin in the etching process; in addition, stable production with a high yield is not necessarily possible while keeping uniformity in these quantities in the surface, and even stricter production control is required than that in conventional manufacturing, so it definitely cannot be said that the art is currently at a high level of completion. This tendency is particularly noticeable when the channel length is 6 μm or shorter. That is because when the photosensitive resin patterns 80A and 80B are anisotropically reduced during the reduction of the photosensitive resin patterns 80A and 80B 1.5 μm, the dimension between the photosensitive resin patterns 80A(12) and 80A(21) naturally grows 3 μm, so the channel winds up being formed 3 μm longer than the set value.

The present invention takes into account the present state of the art, not only avoiding the defects in forming the contacts common to the conventional five-mask process and the four-mask process, but also decreasing the manufacturing processes used in half-tone exposure technology having a large manufacturing margin. The need to achieve lower-priced liquid crystal panels and earnestly pursue a further decrease in the number of manufacturing processes in response to increased demand is clear. The value of the present invention is thus further enhanced by its contribution of technology to simplify other major manufacturing processes and provide lower costs.

A streamlined form of the formation process of the pixel electrode disclosed in Unexamined Patent Application Number 7-175088 [i.e., 1995-75088], which is prior art, is first applied in the present invention to reduce the number of manufacturing processes. Next, half-tone exposure technology is applied to the etch-stop layer formation process and contact formation process, for which pattern dimension control is simple, to further decrease the number of manufacturing processes. Then, an insulating gate-type transistor having a protective insulating layer on the channel is introduced, source-drain wires are formed using a photosensitive organic insulating layer disclosed in Unexamined Patent Application Number 2-275925 [i.e., 1990-275925], which is prior art, to effectively passivate only the source-drain wires, and the photosensitive organic insulating layer is left unchanged to form an insulating layer on the surfaces of the source-drain wires, making it unnecessary to form a passivation insulating layer. Alternatively, this may be fused with anodization technology for forming an insulating layer in the surface of the source-drain wires comprising aluminum that is disclosed in Unexamined Patent Application Number 2-216129 [i.e., 1990-216129] to streamline the process and lower the process temperature. In order to decrease the number of processes therein, half-tone exposure technology is applied to the anodized layer formation of the source-drain wires to streamline the protective layer formation process of the electrode terminals.

[Patent Document 1] Unexamined Patent Application Number 7-74368 [i.e., 1995-74368]

[Patent Document 2] Unexamined Patent Application Number 7-175088 [i.e., 1995-175088]

[Patent Document 3] Unexamined Patent Application Number 2-275925 [i.e., 1990-275925]

[Patent Document 4] Unexamined Patent Application Number 2-216129 [i.e., 1990-216129]

[Patent Document 5]Unexamined Patent Application Number 59-9962 [i.e., 1984-9962]

SUMMARY OF THE INVENTION

In the liquid crystal display device described above in the present invention, an insulating gate-type transistor has a protective insulating layer on the channel, so a passivation function is provided by selectively forming a photosensitive organic insulating layer only on source-drain wires in an image display area or only on the signal line or by anodizing the source-drain wires comprising anodizable source-drain material and forming an insulating layer on the surfaces of the source-drain wires. Because of this, an exceptionally heating process is not used, so excess heat resistance is not required in the insulating gate-type transistor made in which an amorphous silicon layer is used as a semiconductor layer. To put it another way, effects are added wherein the electrical performance does not deteriorate in the formation of passivation. Also, in the anodization of the source-drain wires, it is possible to selectively protect the tops of electrode terminals for the scan line and the signal line by introducing half-tone exposure technology, obtaining the effect of preventing an increase in the number of photo-etching processes.

Additionally, the formation process of pixel electrodes is streamlined by forming pseudo-pixel electrodes and scan lines comprising a laminate made of a transparent conductive layer and a first metal layer, and removing the first metal layer from the top of the pseudo-pixel electrodes during the formation of contacts (openings) on the pseudo-pixel electrodes to obtain transparent conductive pixel electrodes. As a result, a four-mask process without concomitant use of half-tone exposure technology is achieved unlike a conventional four-mask process with concomitant use of half-tone exposure technology, simplifying channel length management.

Also, by using half-tone exposure technology with a lower pattern accuracy during the formation of the source-drain wires, it is possible to obtain electrodes for the signal line and the scan line comprising a metal layer, so variety can be provided in the device.

Further, coupled with the process reduction where the formation process of protective insulating layers (etch-stop layers) and the formation process of openings (contacts formation process) in the gate insulating layer with one photomask is made possible by introducing half-tone exposure technology, the number of photo-etching processes is further decreased from five photomasks, making it possible to produce a liquid crystal display device using four or three photomasks. This is the result of decreasing the number of manufacturing processes of the active substrate, and is the greatest feature from the perspective of decreasing costs of the overall liquid crystal display device. Moreover, the pattern precision of these processes is not so high, so controlling production without greatly affecting quality or yield is an easy matter.

An electric field generated between the counter electrode and the pixel electrode in an IPS-type liquid crystal display device according to Embodiments 11 and 13 is applied only to the gate insulating layer, and an electric field generated between the counter electrode and the pixel electrode in an IPS-liquid crystal display device according to Embodiments 12 and 14 is applied to the gate insulating layer and the anodized layer of the pixel electrode, so a conventional inferior passivation insulating layer with many defects is not used, and the advantage of the rarity of the display image sticking phenomenon is enjoyed. The reason for this is that no charge accumulates due to the anodized layer of the drain wire (pixel electrode) functions as a high resistance layer rather than an insulating layer.

As is made clear in the above description, the requirements of the present invention are a process for utilizing an etch stop-type insulating gate-type transistor to form a pseudo-pixel electrode and a scan line comprising a laminate made of a transparent conductive layer and a first metal layer, and removing a first metal layer on a pseudo-pixel electrode during the formation of a contact on the pseudo-pixel electrode to obtain a transparent conductive pixel electrode; a process for treating the protective insulating layer formation process and contact formation process with one photomask by introducing half-tone exposure technology; and that a photosensitive organic insulating layer is selectively left on source-drain wires or only on a signal line during the formation of source-drain wires or surfaces of source-drain wires are anodized using anodizable source-drain wire material to making formation of a passivation insulating layer unnecessary; as for the construction, the fact that a semiconductor device for a display device with different materials for the pixel electrode, gate insulating layer, and the like or with different film thicknesses as well as that differences in the manufacturing process belong to this category of invention is self-evident; the usefulness of the present invention does not change in a reflection type liquid crystal display device or a vertically aligned liquid crystal display device; and the fact that the semiconductor layer of the insulating gate type transistor is not limited to amorphous silicon is also obvious.

BRIEF DESCRIPTION OF THE DRAWINGS

The objects and advantages of the present invention will be apparent from the following detailed description of the preferred embodiments of the invention with references to the following drawings.

DETAILED DESCRIPTION OF THE EMBODIMENTS

Figure 1:
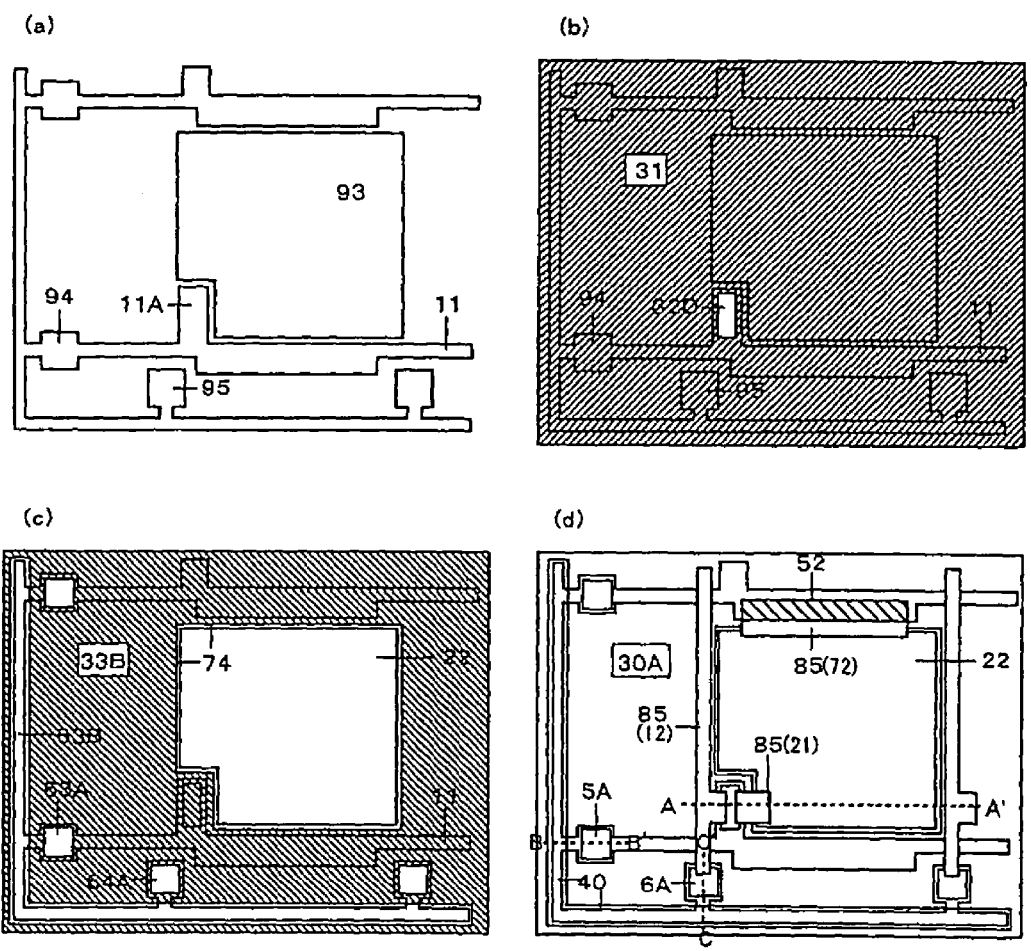
FIG. 1 shows a plane view of the active substrate in Embodiment 1 of the present invention.
Figure 2:
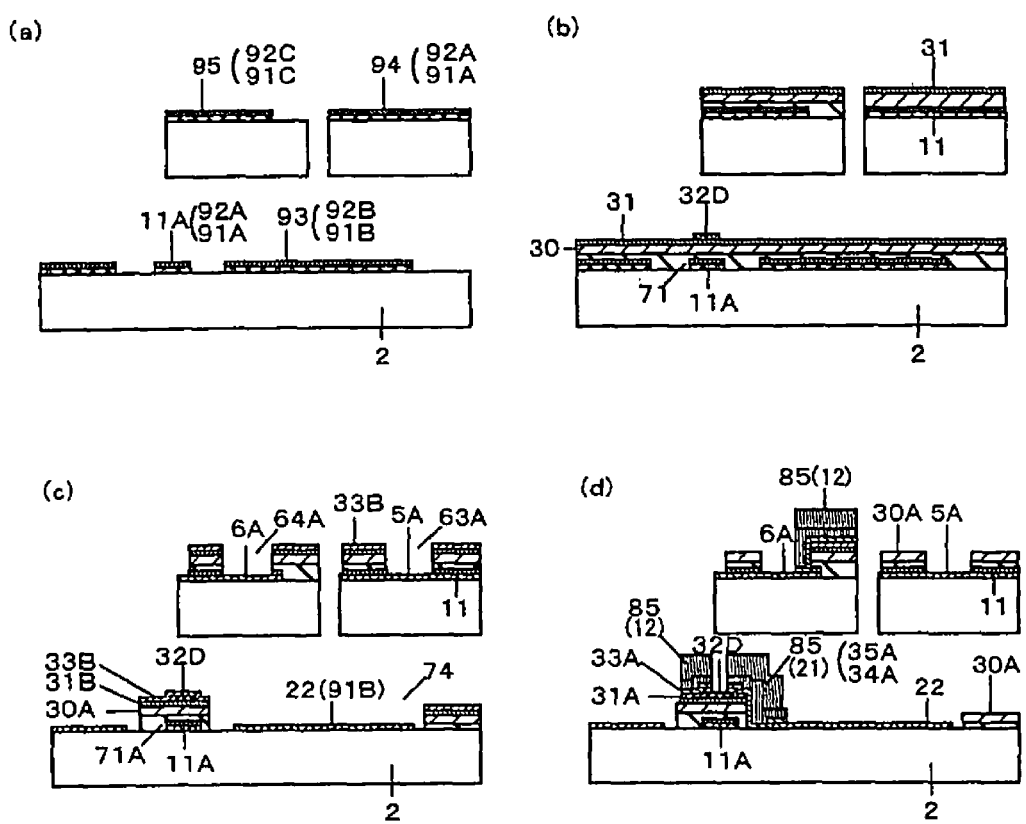
FIG. 2 shows a cross-sectional view for the manufacturing process of the active substrate in Embodiment 1 of the present invention.
Figure 3:
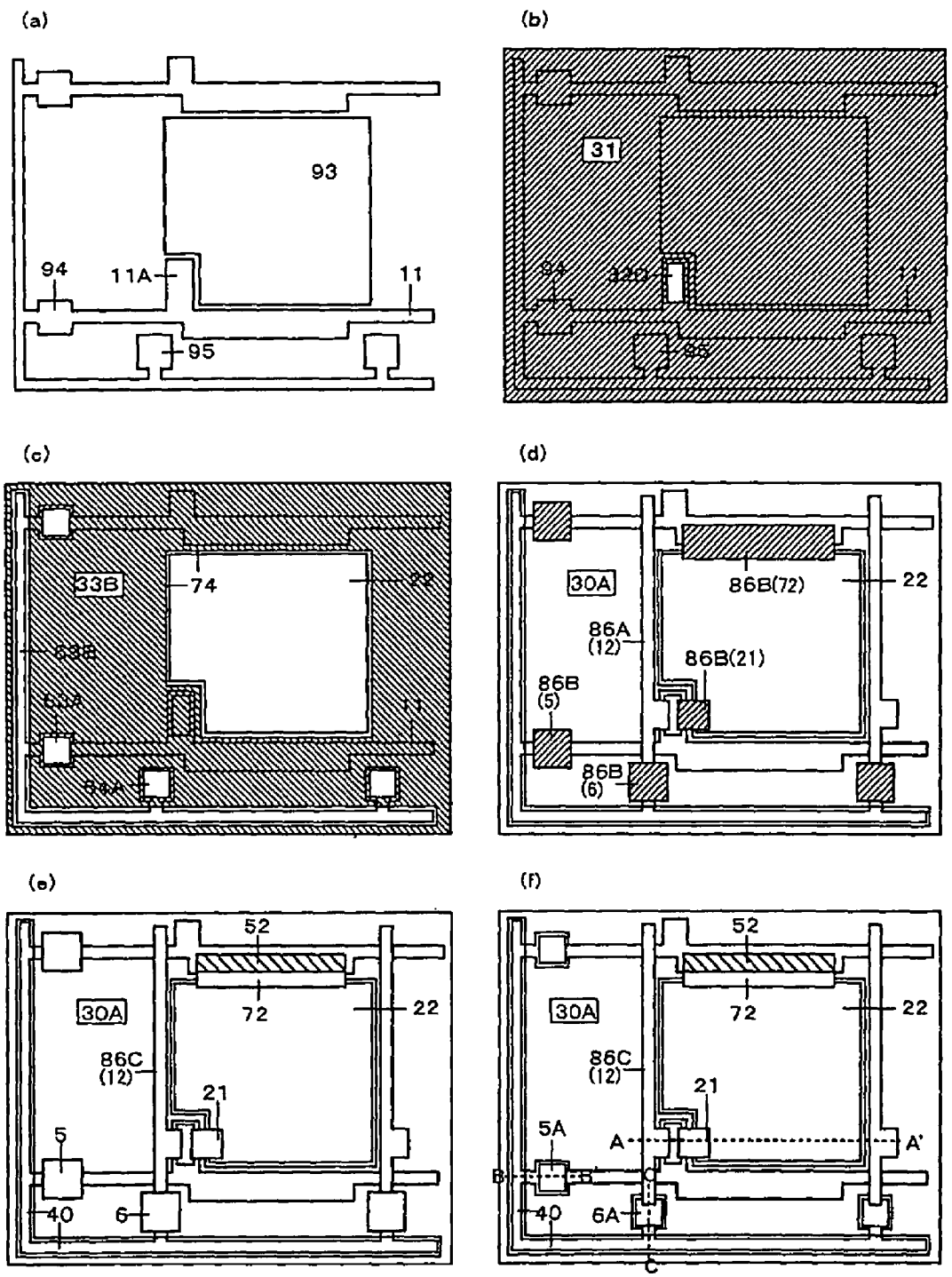
FIG. 3 shows a plane view of the active substrate in Embodiment 2 of the present invention.
Figure 4:
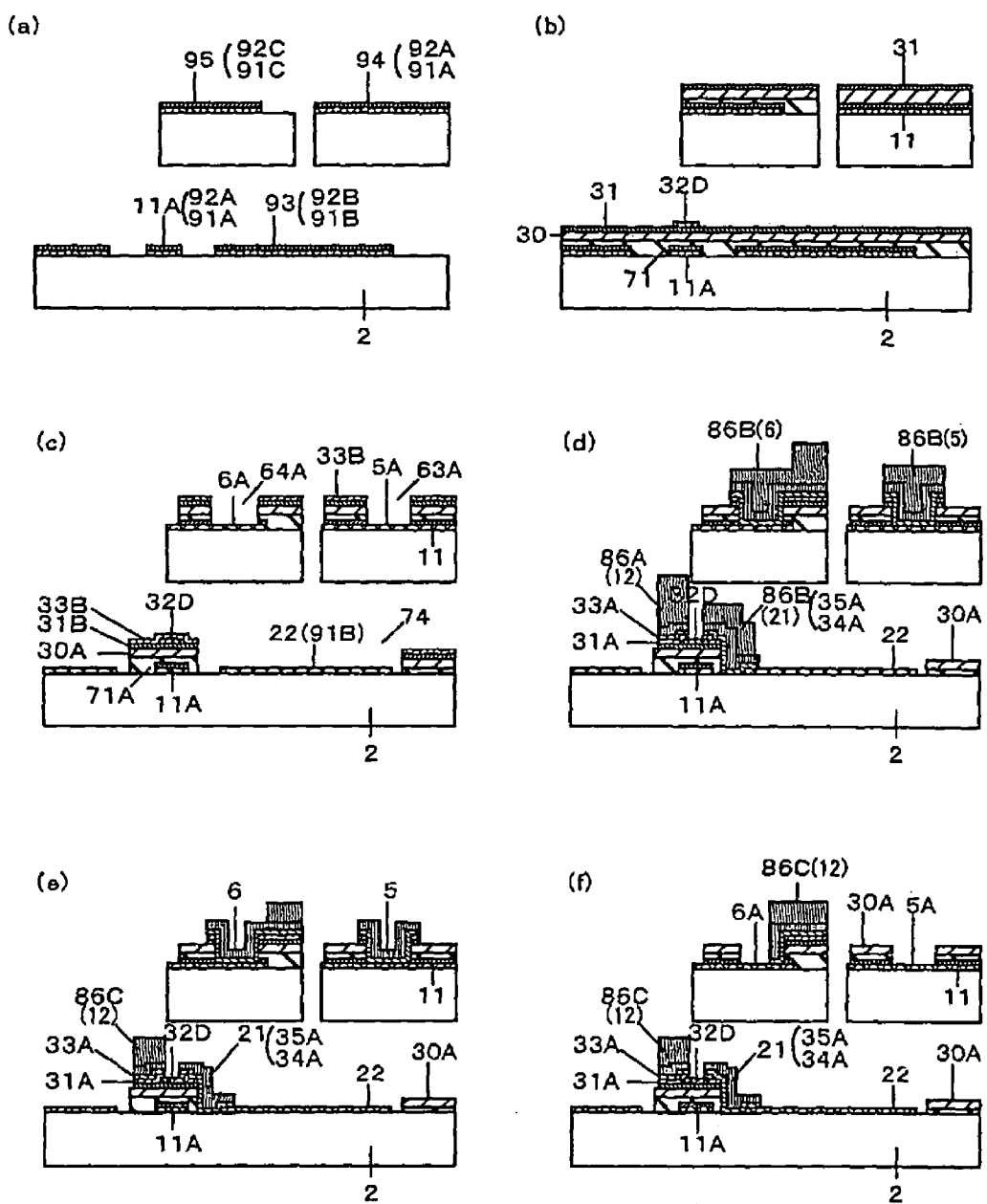
FIG. 4 shows a cross-sectional view for the manufacturing process of the active substrate in Embodiment 2 of the present invention.

Embodiments of the invention are described below with reference to FIGS. 1 to 28. FIG. 1 shows a plane view of an active substrate according to Embodiment 1; FIG. 2 shows a cross-sectional view of the manufacturing process along the line A-A', the line B-B', and the line C-C' in FIG. 1. Similarly, oddly numbered drawings from FIG. 3 to FIG. 27 and evenly numbered drawings from FIG. 4 to FIG. 28 show plane views and cross-sectional views of the manufacturing process respectively of an active substrate. The reference numerals used in one portion of the conventional example are used similarly in other examples, so a detailed description is omitted here.

Embodiment 1

In Embodiment 1, first, an SPT or other vacuum film depositing equipment is used to deposit ITO, for example, as a transparent conductive layer 91 about 0.1 to 0.2 μm thick and a first metal layer 92 about 0.1 to 0.3 μm thick on the main surface of glass substrate 2. Then, scan lines 11 doubling as gate electrodes 11A comprising a laminate made of a transparent conductive layer 91A and first metal layer 92A and pseudo-electrode terminals 94 of the scan lines; pseudo-pixel electrodes 93 comprising a laminate made of a transparent conductive layer 91B and a first metal layer 92B; and pseudo-electrode terminals 95 of signal lines comprising a laminate made of a transparent conductive layer 91C and a first metal layer 92C, are selectively formed using photosensitive resin patterns using micro-fabrication technology as shown in FIG. 1 (a) and FIG. 2. A metal with a high melting point such as Cr, Ta, or Mo, for example, or an alloy or a silicide thereof may be selected for the first metal layer. An aluminum layer or an aluminum alloy layer including Nd sandwiched by a heat-resistant metal layer such that a battery reaction does not occur between the ITO in an alkaline developing solution or resist stripping solution due to lowered resistance of the scan line may also be selected. Improving insulation break-down voltage with the signal through a gate insulating layer and controlling the tapering of the cross-section shape on the electrodes thereof through dry etching in order to increase the yield is desirable; however, sediment volume from reaction products in a gas exhaust system has not be greatly developed despite ITO dry etching technology being developed in which hydrogen iodide and hydrogen bromide are used, so for the time being, employing sputter etching that uses Ar (gas), for example, is preferred. If IZO is used as transparent conductive layer 91, patterns can be formed by continuously applying the same etching solution due to the properties of the first metal layer 92, and it is also easy to taper the cross-section shape.

Next, a transparent insulating layer of, for example, TaOx or $SiO_2$ is deposited as a plasma protection layer about 0.1 μm thick on the entire surface of the glass substrate 2, and numbered 71. The plasma protection layer 71 is necessary to prevent variation in the film quality of SiNx when the transparent conductive layers 91A and 91B exposed in an edge part of the pseudo-pixel electrode 93 and the scan line 11 are reduced during subsequent production of SiNx, a gate insulating layer, by a PCVD equipment. Refer to the prior art example of Published Unexamined Patent Application 59-9962 [i.e., 1984-9962] for further details.

After depositing the plasma protection layer 71, three thin films comprising a first SiNx layer 30 composing a gate insulating layer, a first amorphous silicon layer 31 composing channels of insulating gate-type transistors including hardly any impurities, and a second SiNx layer 32 composing an insulating layer to protect the channels, are successively deposited about 0.2, 0.05 and 0.1 μm, for example, using a PCVD equipment similarly to the prior art example. Then, as shown in FIG. 1 (b) and FIG. 2 (b), the second SiNx layer 32 is selectively etched using photosensitive resin patterns using micro-fabrication technology to form second SiNx layers 32D (protective insulating layers) whose pattern width are narrower than the gate electrodes 11A and to expose the first amorphous silicon layer 31. Because the gate insulating layer forms a laminate made of the plasma protecting layer 71 and the first SiNx layer 30, the first SiNx layer may be formed thinner than conventionally, a favorable advantage.

Continuing, after using a PCVD equipment to deposit a second amorphous silicon layer 33 about 0.05 μm thick, for example, including phosphorous, for example, as an impurity over the entire surface of the glass substrate 2, openings 74 are formed on the pseudo-pixel electrodes 93, and openings 63A and openings 64A are formed on the pseudo-electrode terminals 94 and the pseudo-electrode terminals 95 respectively outside an image display area with photosensitive resin patterns using micro-fabrication technology. The second amorphous silicon layer 33, the first amorphous silicon layer 31, the gate insulating layer 30 and the plasma protecting layer 71 in the said openings as well as the first metal layers 92A to 92C are then successively etched. The transparent conductive layers 91A of the pseudo-electrode terminals 94 are exposed to make electrode terminals 5A of the scan lines, the transparent conductive layers 91C of the pseudo-electrode terminals 95 are exposed to make electrode terminals 6A of the signal lines, and the transparent conductive layers 91B of the pseudo-pixel electrodes 93 are exposed to make pixel electrodes 22. Additionally, it is possible to form openings 63B on the lines against static electricity outside the image display area and to form short lines 40 as a countermeasure against static electricity.

Continuing, a thin film layer 34 of Ti, Ta, or the like, for example, is deposited as a heat-resistant metal layer about 0.1 μm thick, and an Al thin film layer 35 is successively deposited as a low-resistance wire film about 0.3 μm thick using an SPT or other vacuum film depositing equipment. Then, the source-drain wire materials comprising these two thin film layers, the second amorphous silicon layer 33B, and the first amorphous silicon layer 31B are successively etched using the photosensitive organic insulating layer patterns 85 using micro-fabrication technology to expose the gate insulating layer 30A as shown in FIG. 1 (d) and FIG. 2 (d), and the drain electrodes 21 of the insulating gate-type transistors containing part of the pixel electrodes 22 and the signal lines 12 doubling as source electrodes and containing part of the electrode terminals 6A, both comprising a laminate made of 34A and 35A, are selectively formed. Then, the manufacturing process of the active substrate 2 is ended without removing the photosensitive organic insulating layer patterns 85. It should be understood that by ending the etching of the source-drain wires 12 and 21, the electrode terminals 5A of the scan lines and the electrode terminals 6A of the signal lines are formed exposed on the glass substrate 2. If the limitations of the resistance value are not strict, the construction of the source-drain wires 12 and 21 may be simplified by using a single layer of Ta, Cr, MoW, or the like.

The active substrate 2 thus obtained and a color filter 9 are attached together to form a liquid crystal panel, thereby completing Embodiment 1 of the present invention. In Embodiment 1, the photosensitive organic insulating layer patterns 85 are in contact with liquid crystal, so it is important to use photosensitive organic insulating layers with a high heat-resistance including a highly pure acrylic resin or polyimide resin as the main ingredient, not ordinary photosensitive resins having a Novolak-type resin as the main ingredient for the photosensitive organic insulating layers 85; depending on the property of the material, they may be heated so as to fluidize and cover the side surfaces of the source-drain wires 12 and 21, which would increase the reliability of the liquid crystal panel a level. The construction of the storage capacitor 15 is exemplified in FIG. 1 (d) (a right-slanting oblique portion 52), where a protruding part provided at the scan line 11 in the upper pixel and the capacitor electrode 72 formed containing part of the pixel electrode 22 at the same time as the source-drain wires 12 and 21 are overlaid in a planar fashion via the plasma protective layer 71A, the gate insulating layer 30A, the first amorphous silicon layer 31E, and the second amorphous silicon layer 33E (all of which are not illustrated), though the construction of the storage capacitor 15 is not limited thereto, and the construction may be made via an insulating layer including the gate insulating layer 30A between the storage capacitor line 16 and the pixel electrode 22 formed as the scan line 11 as in the prior art example. Other constructions are also possible, though a detailed description is omitted here.

In this manner, limitations in the construction of the device, in which both the electrode terminals of the scan lines and the signal lines are transparent conductive layers, arise in Embodiment 1, though those limitations may be overcome in the device and process as is explained in Embodiment 2.

Embodiment 2

In Embodiment 2, the process proceeds nearly identically to that in Embodiment 1 up until the contact formation process as shown in FIG. 3(c) and FIG. 4(c). Because of the reason described below, the pseudo-electrode terminal and 95 of the signal line and are not necessarily required. A thin film layer 34 of Ti, Ta, or the like, for example, is deposited about 0.1 μm thick as a heat-resistant metal layer, and then an Al thin film layer 35 is subsequently deposited as a low-resistance wire layer about 0.3 μm thick using an SPT or other vacuum film depositing equipment in the source-drain wires formation process. Then, the source-drain wire materials comprising these two thin film layers, the second amorphous silicon layer 33B, and the first amorphous silicon layer 31B are successively etched using the photosensitive organic insulating layer patterns 86A and 86B, using micro-fabrication technology to expose the protective insulating layers 32D and the gate insulating layer 30A as shown in FIG. 3(d) and FIG. 4(d). Drain electrodes 21 of the insulating gate-type transistors containing part of the pixel electrodes 22 and signal lines 12 doubling as source wires, both comprising a laminate made of 34A and 35A, are selectively formed. Electrode terminals 5 of the scan lines containing part 5A of the exposed scan lines and electrode terminals 6 composing part of the signal lines are formed at the same time as the formation of the source-drain wires 12 and 21. In further detail, the pseudo-electrode terminals 95 as used in Embodiment 1 are not necessarily required.

Forming photosensitive organic insulating layer patterns 86A and 86B at this point thicker than the 1.5-μm thickness of 86B (gray-tone) on the drain electrodes 21, the electrode terminals 5 and 6, and the capacitor electrodes 72, and the 3-μm thickness, for example, of 86A (black region) on the signal lines 12 using half-tone exposure technology is an important feature of Embodiment 2. With the smallest dimension of 86B corresponding to the electrode terminals 5 and 6 large at several tens of μm, producing the photomask and controlling the finishing dimensions are extremely easy, but because the smallest dimension of the region 86A corresponding to the signal lines 12 has a comparatively high accuracy of 4 to 8 μm, fine patterns are needed for the black tone regions. However, compared with the source-drain wires 12 and 21 formed in the one exposure treatment and two etching treatments as described with the prior art example, the source-drain wires 12 and 21 of the present invention are formed with one exposure treatment and one etching treatment, so there are fewer causes of fluctuation in the pattern width, making it far easier to control the dimensions of the source-drain wires 12 and 21 as well as of the interval between the source 12 and the drain wire 21, that is, the channel length, than it is conventionally. In contrast to the channel etch-type insulating gate transistor, it is the dimensions of the protective insulating layers 32D that determine the "on" current of the etch stop-type insulating gate-type transistors, and what is desired to be understood is that while the process control is made easier yet, this is not due to the dimensions between the source 12 and the drain wire 21.

The said photosensitive organic insulating layer patterns 86A and 86B can be reduced by at least 1.5 μm using oxygen plasma or other ashing means after the source-drain wires 12 and 21 are formed to eliminate the photosensitive organic insulating layer patterns 86B, thereby exposing the drain electrodes 21, the electrode terminals 5 and 6, and the capacitor electrodes 72, and leaving the photosensitive organic insulating layer patterns 86C unchanged on only the signal lines 12 as shown in FIGS. 3(e) and 4(e), but it is desirable to increase the anisotropicity to suppress changes in the pattern dimension as the reliability decreases when the top surfaces of the signal lines 12 are exposed due to narrowing of the width of the photosensitive organic insulating layer patterns 86C in the said plasma treatment. In further detail, RIE oxygen plasma treatment is desirable, and ICP or TCP oxygen plasma treatment having a high-density plasma source are even more desirable. The manufacturing process of the active substrate 2 is thereby ended without removing the photosensitive organic insulating layer patterns 86C as in Embodiment 1.

The active substrate 2 thus obtained and a color filter 9 are attached together to form a liquid crystal panel, thereby completing Embodiment 2. In Embodiment 2, the photosensitive organic insulating layer patterns 86C are in contact with liquid crystal, so it is important to use a photosensitive organic insulating layer with a high heat-resistance including a highly pure acrylic resin or polyamide resin as the main ingredient, not an ordinary photosensitive resin having a Novolak-type resin as the main ingredient for the photosensitive organic insulating layers 86C. The construction of the storage capacitor 15 is identical to that in Embodiment 1. Making the shape of the transparent conductive patterns for connecting the short wires 40 disposed at the outer periphery of the active substrate 2 and the transparent conductive patterns 6A formed below the signal lines 12 and the part 5A of the scan lines long and narrow makes for high resistant lines as a countermeasure against static electricity, though other static electricity countermeasures using other conductive materials are also possible of course.

In Embodiment 2, organic insulating layers are formed only on the signal lines to expose the drain electrodes 21 while maintaining the conductivity, similar to the pixel electrodes 22, but even so, adequate reliability is obtained because the drive signal applied to the liquid crystal cells is basically alternating. And because the voltage of the opposing electrode 14 on CF 9 is adjusted (to decrease flickering) during the image testing such that the direct voltage component between the pixel electrodes 22 (the drain electrode the 21) and the opposing electrode the 14 decreases, insulating layers may be formed only on the signal lines 12 such that the direct current component does not flow.

By changing the design of the pattern for forming the signal lines 12 containing part of the transparent conductive electrode terminals 6A of the signal lines 12 without forming metal electrode terminals 5 on the transparent conductive electrode terminals 5A of the scan line, electrode terminals 5A and 6A comprising a transparent conductive layer can be made in place of the electrode terminals 5 and 6 comprising the source-drain wire material as shown in FIGS. 3(f) and 4(f) similarly as in Embodiment 1; whether to dispose photosensitive organic insulating layers on the capacitor electrodes 72 is an arbitrary design matter, so even if the component material for electrode terminals is changed, the construction of the device will not be altered in the image display area.

The manufacturing processes are decreased by selectively forming organic insulating layers in this manner only on the source-drain wires or only on the source wires (signal lines) in Embodiment 1 and Embodiment 2, but the thickness of the organic insulating layers is ordinarily 1 μm or thicker, so the possibility that the gap precision in the liquid crystal cells will not be maintained and the problem that the level differences in the organic insulating layer patterns will disturb the state of the orientation of the alignment film, decreasing the contrast, may arise. Therefore, a minimum number of processes are added in Embodiment 3 to provide passivation technology with few level differences in place of the organic insulating layers.

Embodiment 3

Figure 5:
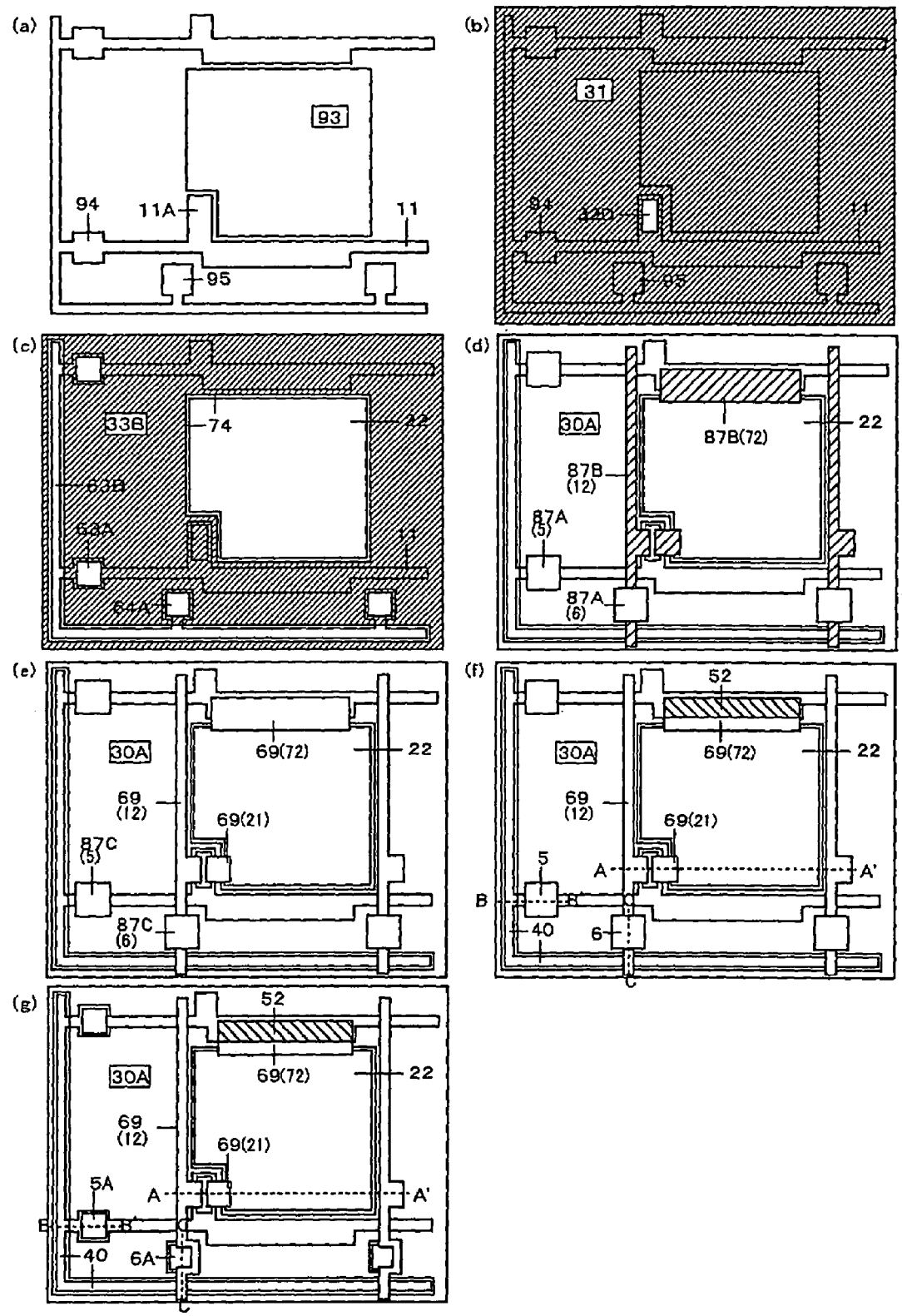
FIG. 5 shows a plane view of the active substrate in Embodiment 3 of the present invention
Figure 6:
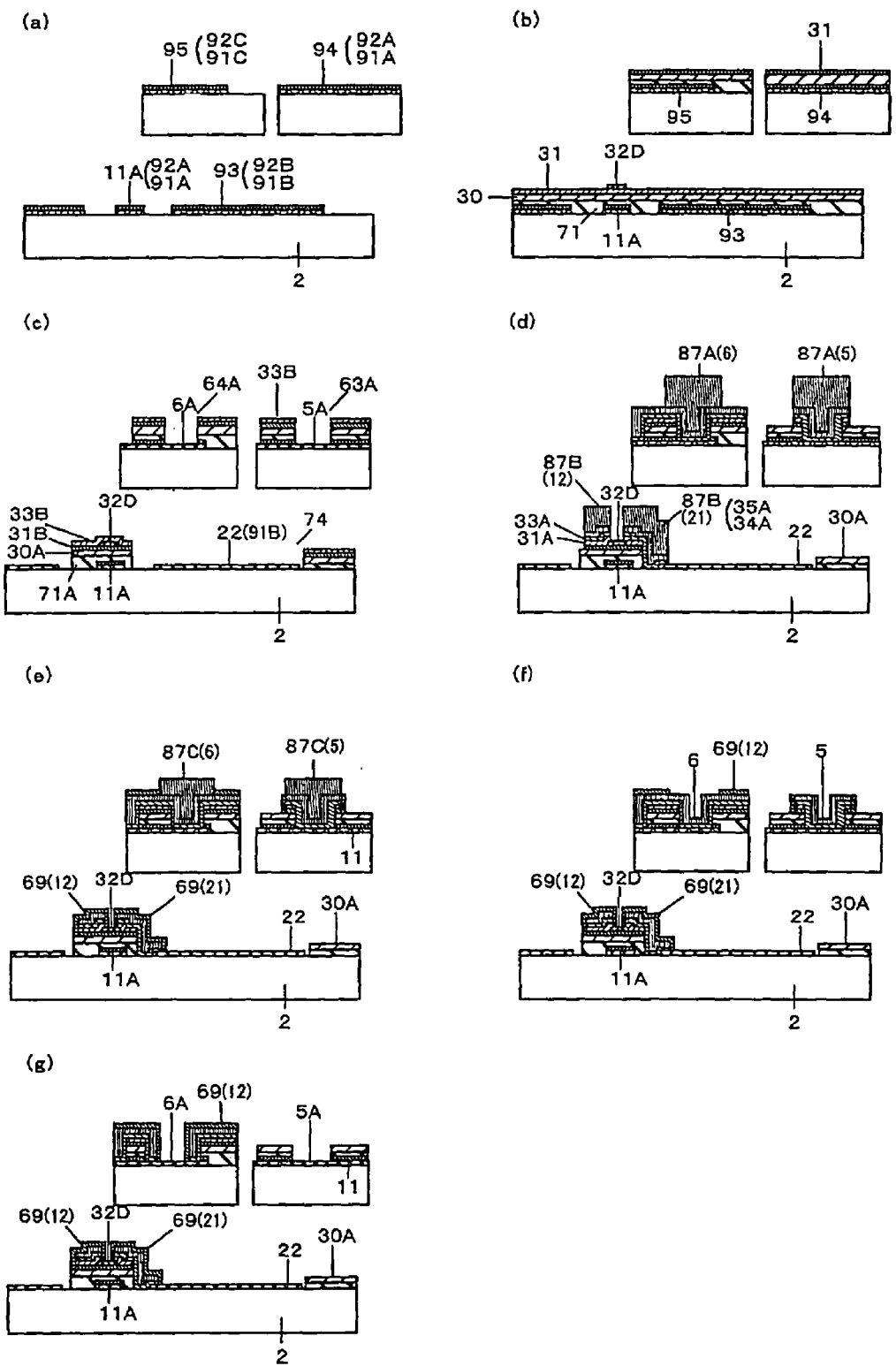
FIG. 6 shows a cross-sectional view for the manufacturing process of the active substrate in Embodiment 3 of the present invention.

In Embodiment 3, a process nearly identical to that in Embodiment 2 is carried out until where openings 63A are formed on part of the scan lines 11 outside the image display area to expose part of the scan lines 11 as shown in FIG. 5(c) and FIG. 6(c). Continuing, a thin film layer 34 of Ti, Ta, or the like, for example, is deposited about 0.1 μm thick as an anodizable heat-resistant metal layer, and then an Al thin film layer 35 is similarly deposited as an anodizable low-resistance wire layer about 0.3 μm thick using an SPT or other vacuum film depositing equipment in the source-drain wire formation process. Then, source-drain wire materials comprising these two thin film layers, the second amorphous silicon layer 33B, and the first amorphous silicon layer 31B are successively etched using the photosensitive resin patterns 87A and 87B using micro-fabrication technology to expose the protective insulating layers 32D and the gate insulating layer 30A. The drain electrodes 21 of the insulating gate type transistors containing part of the pixel electrodes 22 and the signal lines 6 doubling as source wires, both comprising a laminate made of 34A and 35A, are selectively formed on the gate insulating layer 30A as shown in FIG. 5 (d) and FIG. 6(d), and the electrode terminals 5 of the scan lines containing part of the exposed scan lines 11 in the openings 63A and the electrode terminals 6 composing part of the signal lines are formed at the same time as the formation of the source-wires 12 and 21. Forming photosensitive resin patterns 87A and 87B at this point thicker than the 1.5-μm thickness of 87B (gray-tone region) corresponding to the source-drain wires 12 and 21 and the 3-μm thickness, for example of 87A (black region) on the electrode terminals 5 and 6 using half-tone exposure technology, is an important feature of Embodiment 3.

After the source-drain wires 12 and 22 are formed, the said photosensitive resin patterns 87A and 87B can be reduced by at least 1.5 μm using oxygen plasma or other ashing means to eliminate the photosensitive resin patterns 87B, exposing the source-drain wires 12 and 21 as well as leaving the photosensitive resin patterns 87C unchanged only on the electrode terminals 5 and 6. At this point, the source-drain wires 12 and 21 are anodized to form the oxide layers 68 and 69, and the second amorphous silicon layer 33 and the first amorphous silicon layer 31A exposed on the bottom side surface of the source-drain wires 12 and 21 are anodized to form silicon oxide layers ($SiO_2$) 66 and 67, which are insulating layers, as shown in FIG. 5(e) and FIG. 6(e) using the photosensitive resin patterns 87C as masks while irradiating light.

It is disclosed in the prior art example that employing anodization while irradiating light to form anodized layers with a favorable film quality on the drain wires 21 is important. In further detail, if adequately powerful light is irradiated at about 10,000 luxes so the leak current of the insulating gate-type transistor exceeds μA, a current density can be obtained to obtain a favorable film quality by anodizing at about 10 mA/cm² as calculated from the areas of the drain electrodes 21.

Al is exposed on source-drain wires 12 and 21, and a laminate of Al, Ti, the second amorphous silicon layer 33A and the first amorphous silicon layer 31A is exposed on their side. Due to anodization, the second amorphous silicon layer 33A transmutes into a silicon oxide layer ($SiO_2$) 66 including impurities, the first amorphous silicon layer 31A transmutes into a silicon oxide layer ($SiO_2$) 67 not including impurities, Ti transmutes into titanium oxide ($TiO_2$) 68, which is a semiconductor, and Al transmutes into aluminum oxide ($Al_2O_3$), which is an insulating layer. The titanium oxide layer 68 is not an insulating layer, but it is extremely thin and the exposed area is small, so passivation is not a problem, but for the heat-resistant metal thin film layer 34A, selecting Ta is desirable. Unlike Ti, however, care is needed with Ta as it has a characteristic of lacking the function to easily absorb the surface oxide layer of the base material to make ohmic contact easily.

For wire passivation, about 0.1 to 0.2 μm is adequate for the thickness of each of the aluminum oxide 69, titanium oxide 68, and silicon oxide layers 66 and 67, layers formed with anodization; using a chemical liquid such as ethylene glycol similarly achieves an applied voltage exceeding 100 V. A matter for which care is required in the anodization of the source-drain wires 12 and 21 is that all of the signal wires 12 need to be formed in parallel or series electrically, though this is not illustrated, and it goes without saying that if this parallel or series configuration is not undone at some point in the subsequent manufacturing processes, trouble will occur not only in the electrical test of the active substrate 2 but in the actual operation of the resulting liquid crystal display device. Removal means using transpiration by laser light irradiation or mechanical excision by scribing are simple, and so a detailed explanation is omitted here.

After the anodization is complete, the photosensitive resin patterns 87C are removed, exposing the electrode terminals 5 and 6 comprising a low-resistance metal layer as shown in FIGS. 5(*f*) and 6(*f*). If the limitations of the resistance value are not strict, the construction of the source-drain wires 12 and 21 may be simplified by using a single layer of anodizable Ta. The active substrate 2 thus obtained and a color filter 9 is attached together to form a liquid crystal panel, thereby completing Embodiment 3 of the present invention. The construction of the storage capacitor 15 is identical to that in Embodiment 1. Because the intervals between the electrode terminals 5 of the scan lines and the electrode terminals 6 of the signal lines are connected with the short lines 40, thin anodized layers are formed in the sides of the electrode terminals 5 of the scan lines 11.

Because the pixel electrodes 22 electrically connected with the drain electrodes 21 are exposed when the source-drain wires 12 and 21, the second amorphous silicon layer 33A, and the first amorphous silicon layer 31A are anodized, the pixel electrodes 22 are also anodized at the same time. The resistance value may increase due to the nature of the transparent conductive layer composing the pixel electrodes 22, in which case it is necessary to arbitrarily change the film depositing conditions of the transparent conductive layer to make up for the lack of oxygen, though the transparency of the transparent conductive layer will not decrease in anodization. Electrical currents for anodizing the drain electrodes 21 and the pixel electrodes 22 are provided through the channels of insulating gate-type transistors but a large formation current and long formation period is required because of the large area of the pixel electrodes 22. Regardless of the strength of the light irradiated, the resistance of the channel parts hinder the formation of the anodized layer, and it is a problem that the formation of the anodized layer is difficult on the capacitor electrodes 72 and the drain electrodes 21 equivalent in thickness and film quality to the signal lines 12 only having recourse to lengthening the formation period of the anodized layers. Nevertheless, even if the anodized layers formed on the drain wires 21 are somewhat incomplete, the reliability obtained will generally not hinder practical use. The reason for this is that the drive signal applied to the liquid crystal cells is basically an alternating current, as described above, and because the voltage of the opposing electrode 14 is adjusted (to decrease flickering) during the image testing such that the direct voltage component between the pixel electrodes 22 (the drain electrodes 21) and the opposing electrode 14 decrease, an insulating layers may be formed only on the signal lines 12 such that the direct current component does not flow.

By changing the design of the pattern for forming the signal lines 12 containing part of the transparent conductive electrode terminals 6A of the signal lines 12 without forming metal electrode terminals 5 on the transparent conductive electrode terminals 5A of the scan lines, electrode terminals 5A and 6A comprising a transparent conductive layer can be obtained in place of the electrode terminals 5 and 6 comprising the source-drain wire material as shown in FIGS. 5(*f*) and 6(*f*) similarly as in Embodiment 1; even if the component material of electrode terminals are changed, the construction of the device will not be altered in the image display area. In this case, half-tone exposure technology is not needed in the formation of the photosensitive resin patterns to form the source-drain wires 12 and 21, but a care is needed in increasing the resistance values of the transparent conductive layers 5A and 6A.

In the liquid crystal display device described above, an active substrate 2 is formed in the sequence of forming scan lines and pseudo-pixel electrodes, forming etch-stop layers, forming contacts, and forming source-drain wires, but even if the formation order of the etch-stop layers and contacts is reversed, it is possible to obtain an active substrate 2 nearly equivalent as is described in the embodiment below.

Embodiment 4

In Embodiment 4, the manufacturing process proceeds nearly identically to that in Embodiment 1 up to where three thin film layers comprising a first SiNx layer 30 composing a gate insulating layer, a first amorphous silicon layer 31 composing an insulating gate-type transistor channel including hardly any impurities, and a second SiNx layer 32 composing an insulating layer for protecting the channel are successively deposited about 0.2, 0.05 and 0.1 μm thick, for example, respectively using a PCVD equipment. Here, the first SiNx layer may be formed also thinner than conventionally formed such that the gate insulating layer comprising a laminate of a plasma protective layer 71 and a first SiNx layer 30.

Figure 7:
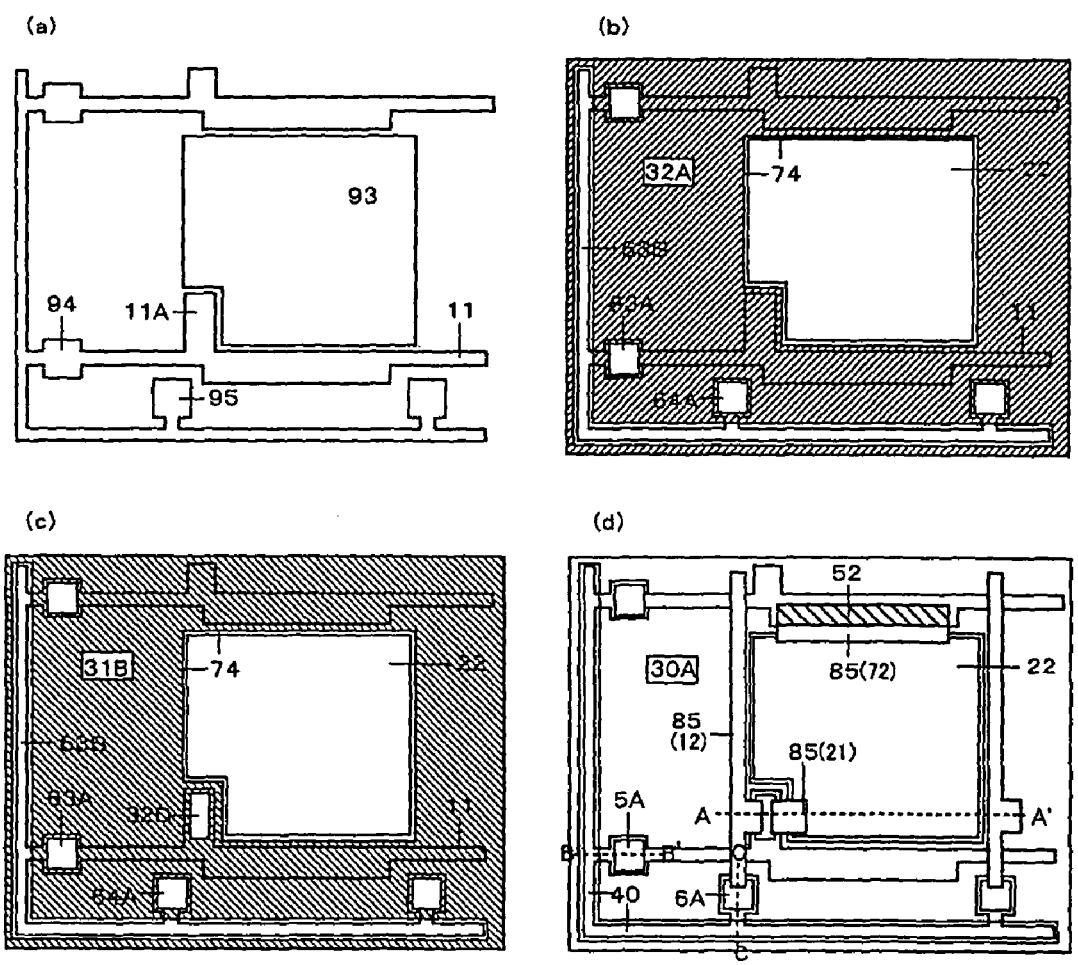
FIG. 7 shows a plane view of the active substrate in Embodiment 4 of the present invention.
Figure 8:
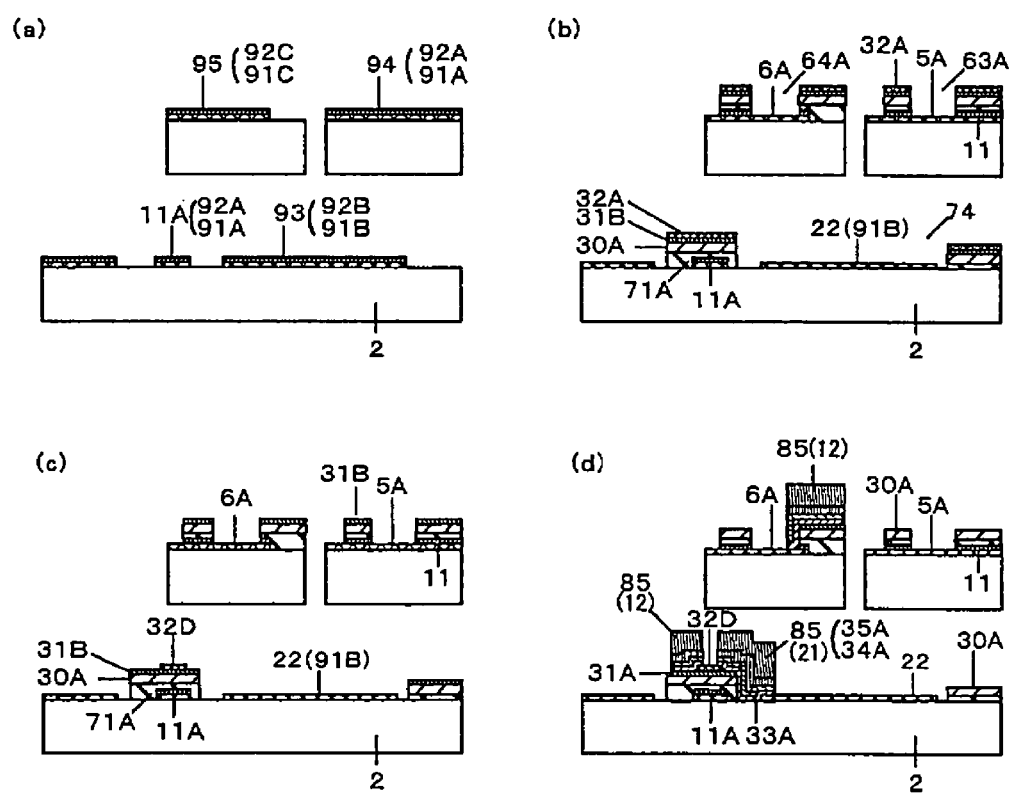
FIG. 8 shows a cross-sectional view for the manufacturing process of the active substrate in Embodiment 4 of the present invention.

Continuing, photosensitive resin patterns are used with micro-fabrication technology to form openings 74 on the pseudo-pixel electrodes 93, openings 63A and 64A on the pseudo-electrode terminals 94 and 95 outside the display region area, and to successively etch the second SiNx layer 32, the first amorphous silicon layer 31, the gate insulating layer 30 and the plasma protective layer 71 and then the first metal layers 92A to 92C in the respective openings as shown in FIG. 7(*b*) and FIG. 8(*b*); the transparent conductive layers 91A of the pseudo-electrode terminals 94 are exposed to make electrode terminals 5A of the scan lines, and similarly the transparent conductive layers 91C of the pseudo-electrode terminals 95 are exposed to make electrode terminals 6A of the signal lines, and the transparent conductive layers 91B of the pseudo-pixel electrodes 93 are exposed to make pixel electrodes 22.

Continuing, the second SiNx layer 32A is selectively etched using a photosensitive resin pattern with micro-fabrication technology to make second SiNx layers 32D (protective insulating layers) whose pattern width is narrower than the gate electrode 11A and to expose the first amorphous silicon layer 31B as shown in FIGS. 7(*c*) and 8(*c*).

Next, a second amorphous silicon layer 33 including phosphorous, for example, as an impurity is deposited about 0.05 μm thick, for example, over the entire surface of the glass substrate 2 using a PCVD equipment, then a thin film layer 34 of Ti, Cr, Mo, or the like, for example, is deposited as a heat-resistant layer about 0.1 μm thick and an Al thin film layer 35 is then deposited as a low-resistant wire layer about 0.3 μm thick using an SPT or other vacuum film depositing equipment. Then, the source-drain wire materials comprising these two thin film layers, the second amorphous silicon layer 33, and the first amorphous silicon layer 31B are successively etched using the photosensitive organic insulating layer patterns 85 using micro-fabrication technology to expose the protective insulating layers 32D and the gate insulating layer 30A as shown in FIG. 7 (*d*) and FIG. 8 (*d*), and drain electrodes 21 of the insulating gate-type transistors containing part of the pixel electrodes 22 and the signal lines 12 doubling as source electrodes and containing part of the electrode terminals 6A, both comprising a laminate made of 34A and 35A, are selectively formed. The manufacturing process of the active substrate 2 is thereby ended without removing the photosensitive organic insulating layer patterns 85.

The active substrate 2 thus obtained and a color filter 9 is attached together to form a liquid crystal panel, thereby completing Embodiment 4 of the present invention. The construction of the storage capacitor 15 is exemplified in FIG. 7(*d*) (a right-slanting oblique portion 52) where a protruding part provided at the scan line 11 in the upper pixel and the capacitor electrode 72 formed containing part of the pixel electrode 22 at the same time as the source-drain wires 12 and 21 are overlaid in a planar fashion via the plasma protective layer 71A, the gate insulating layer 30A, the first amorphous silicon layer 31E, and the second amorphous silicon layer 33E (all of which are not illustrated), identical to Embodiment 1.

In this manner, limitations in the construction of the device, in which both the electrode terminals of the scan lines and the signal lines are transparent conductive layers, arise in Embodiment 4, though those limitations may be overcome in the device and process as in Embodiment 2 as explained in Embodiment 5.

Embodiment 5

Figure 9:
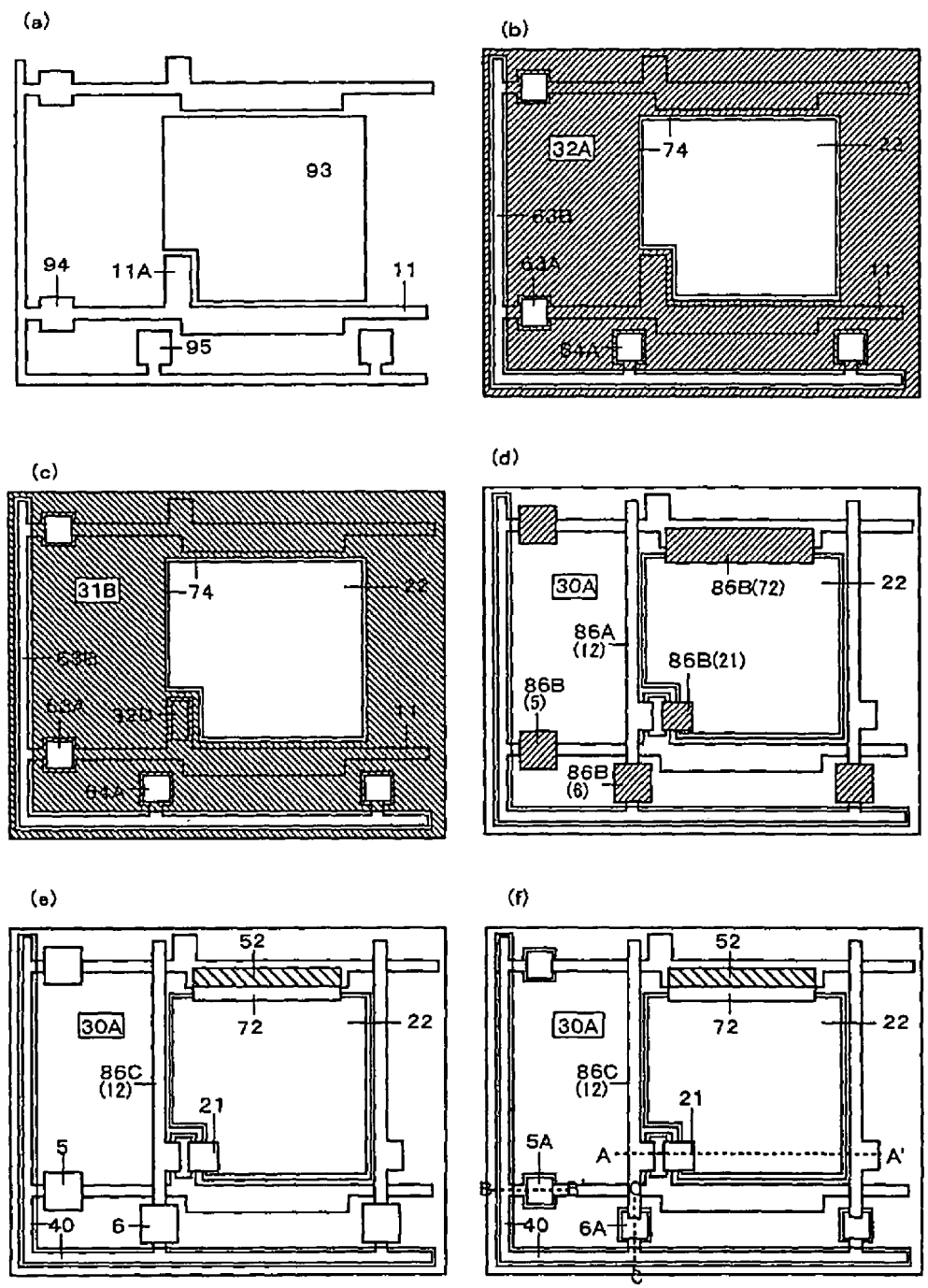
FIG. 9 shows a plane view of the active substrate in Embodiment 5 of the present invention.
Figure 10:
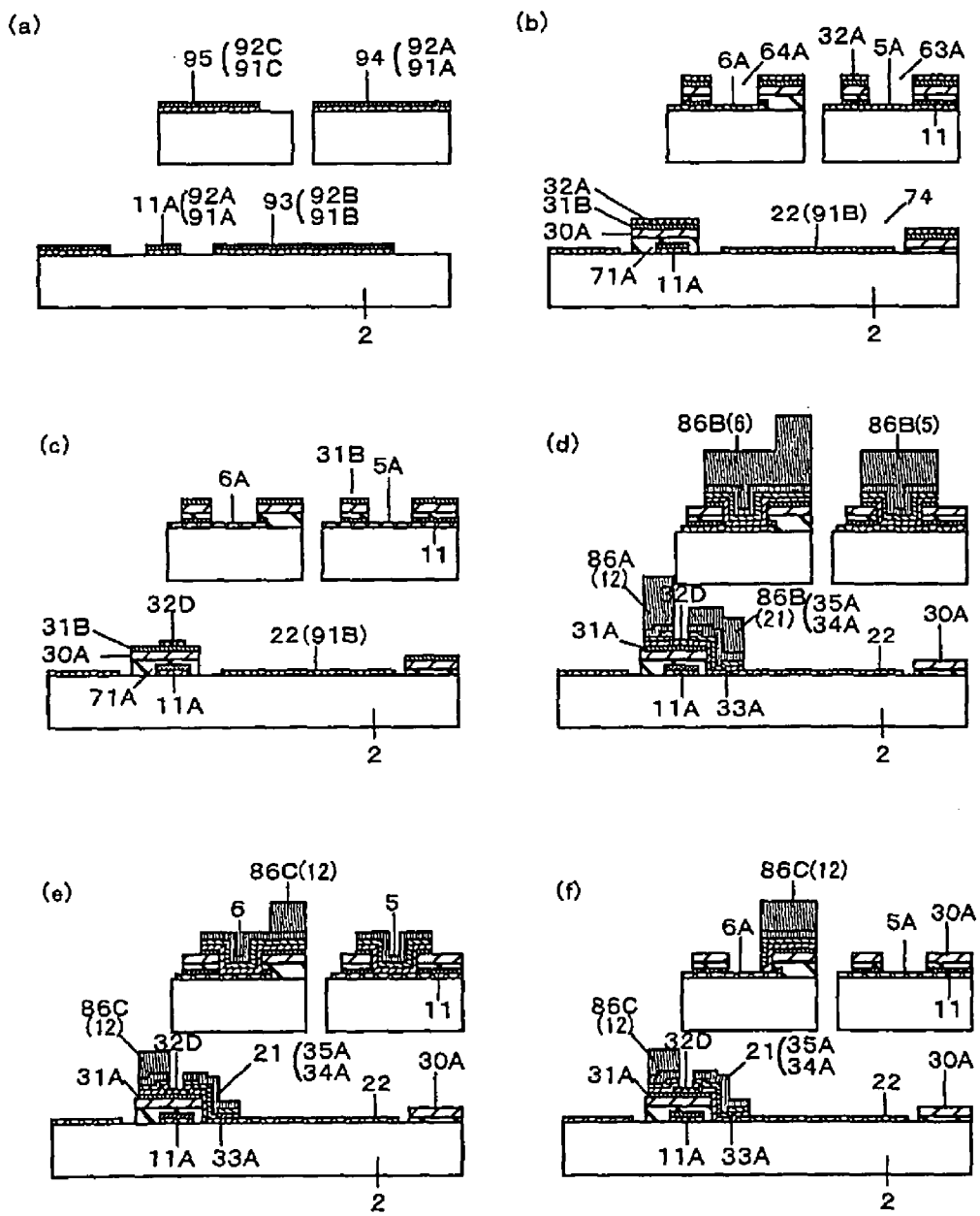
FIG. 10 a cross-sectional view for the manufacturing process of the active substrate in Embodiment 5 of the present invention.

In Embodiment 5, the process proceeds nearly identically to that in Embodiment 4 up to the formation process of the protective insulating layers 32D as shown in FIG. 9(*c*) and FIG. 10(*c*). Because of the reason described below, the pseudo-electrode terminals 95 are not necessarily required. A thin film layer 34 of Ti, Ta, or the like, for example, is deposited about 0.1 μm thick as a heat-resistant metal layer, and then an Al thin film layer 35 is subsequently deposited as a low resistance wire layer about 0.3 μm thick using an SPT or other vacuum film depositing equipment in the source-drain wire formation process. Then, the source-drain wire materials comprising these two thin film layers, the second amorphous silicon layer 33, and the first amorphous silicon layer 31B are successively etched using the photosensitive organic insulating layer patterns 86A and 86B with micro-fabrication technology to expose the protective insulating layers 32D and the gate insulating layer 30A as shown in FIG. 9(*d*) and FIG. 10(*d*). Drain electrodes 21 of the insulating gate-type transistors containing part of the pixel electrodes 22 and the signal lines 12 doubling as source wires, both comprising a laminate made of 34A and 35A, are selectively formed. Electrode terminals 5 of the scan lines containing part 5A of the exposed scan lines and electrode terminals 6 composing part of the signal lines are formed at the same time at the same time as the formation of the source-drain wires 12 and 21.

Forming photosensitive organic insulating layer patterns 86A and 86B at this point thicker than the 1.5-μm thickness of 86B on the drain electrodes 21, the electrode terminals 5 and 6 and the capacitor electrodes 72, and the 3-μm thickness, for example of 86A on the signal lines 12 using half-tone exposure technology is an important feature of Embodiment 4 similarly as in Embodiment 2.

After the source-drain wires 12 and 21 are formed, the said photosensitive organic insulating layer patterns 86A and 86B are reduced by at least 1.5 μm using oxygen plasma or other ashing means to eliminate the photosensitive organic insulating layer patterns 86B, exposing the drain electrodes 21, the electrode terminals 5 and 6 and the capacitor electrodes 72, and leaving the photosensitive organic insulating layer patterns 86C unchanged only on the signal lines 12 as shown in FIG. 9(*e*) and FIG. 10(*e*). The manufacturing process of the active substrate 2 is thereby ended without removing the photosensitive organic insulating layer patterns 86C.

The active substrate 2 thus obtained and a color filter 9 is attached together to form a liquid crystal panel, thereby completing Embodiment 5 of the present invention. The construction of the storage capacitor 15 is identical to that in Embodiment 4.

By changing the design of the pattern for forming the signal lines 12 containing part of the transparent conductive electrode terminals 6A of the signal lines 12 without forming metal electrode terminals 5 on the transparent conductive electrode terminals 5A of the scan lines as shown in FIG. 9(*f*) and FIG. 10(*f*), electrode terminals 5A and 6A comprising a transparent conductive layer can be made in place of electrode terminals 5 and 6 comprising the source-drain wire material similarly as in Embodiment 4.

The manufacturing processes are decreased by selectively forming organic insulating layers in this manner only on the source-drain wires or only on the source wires (signal lines) in Embodiment 4 and Embodiment 5, but the thickness of the organic insulating layer is 1 μm or thicker, so passivation technology is provided in place of an organic insulating layer by added a minimum number of processes in Embodiment 6 to avoid problems due to level differences.

Embodiment 6

Figure 11:
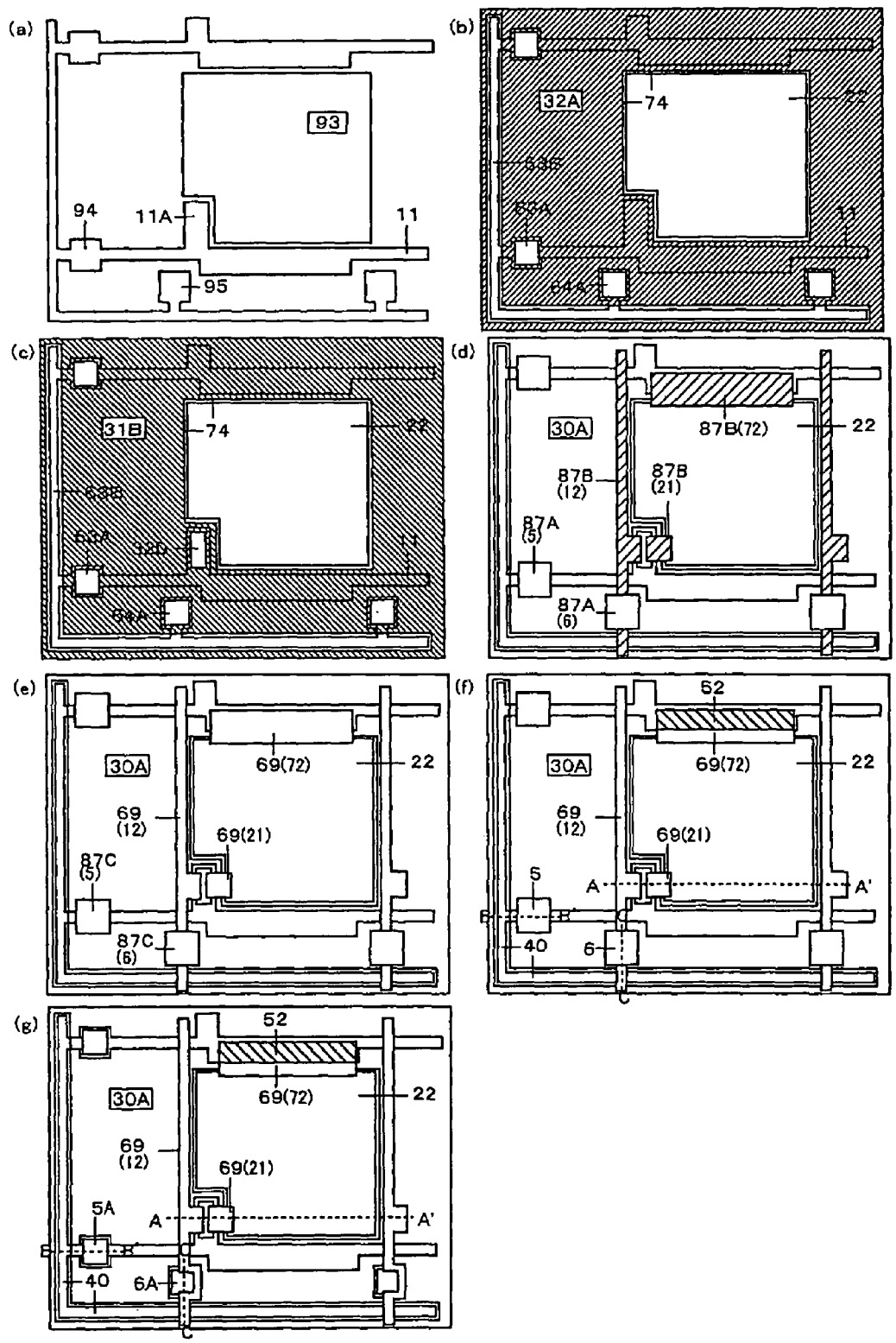
FIG. 11 shows a plane view of the active substrate in Embodiment 6 of the present invention.
Figure 12:
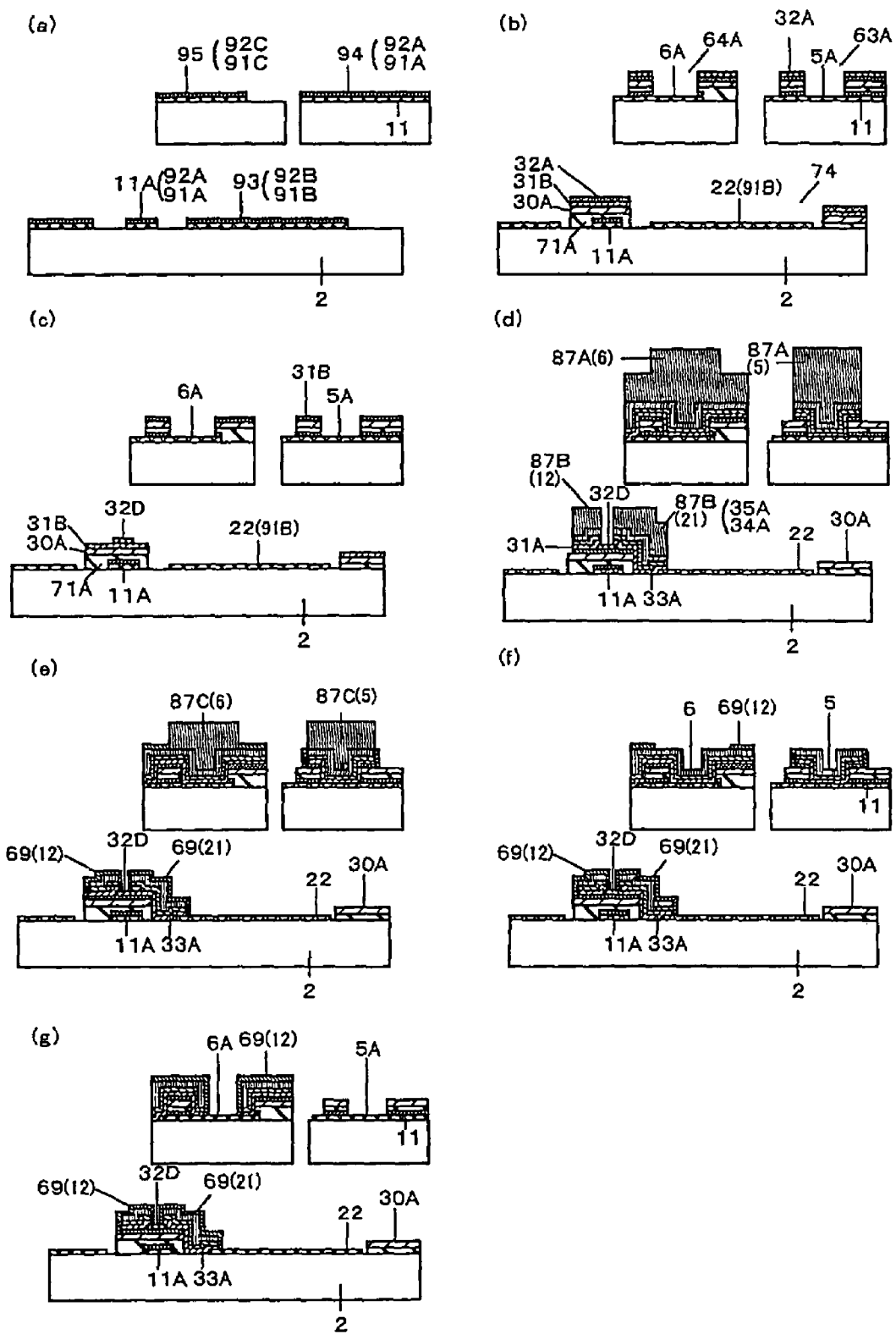
FIG. 12 shows a cross-sectional view for the manufacturing process of the active substrate in Embodiment 6 of the present invention.

In Embodiment 6, a process nearly identical to that in Embodiment 5 is carried out until openings 63A are formed on part of the scan lines 11 outside the image display area to expose the scan lines 11 as shown in FIG. 11 (*c*) and FIG. 12 (*c*). Continuing, a thin film layer 34 of Ti, Ta, or the like, for example, is deposited about 0.1 μm thick as an anodizable heat-resistant metal layer, and then an Al thin film layer 35 is similarly deposited as an anodizable low resistance wire layer about 0.3 μm thick using an SPT or other vacuum film depositing equipment in the source-drain wire formation process. Then, source-drain wire materials comprising these two thin film layers, the second amorphous silicon layer 33, and the first amorphous silicon layer 31B are successively etched using the photosensitive resin patterns 87A and 87B using micro-fabrication technology to expose the protective insulating layers 32D and the gate insulating layer 30. Drain electrodes 21 of the insulating gate-type transistors containing part of the pixel electrodes 22 and signal lines 12 doubling as source wires, both comprising a laminate made of 34A and 35A, are selectively formed on the gate insulating layer 30A as shown in FIG. 11 (*d*) and FIG. 12(*d*); and the electrode terminals 5 of the scan lines containing part of the exposed scan lines 11 in the openings 63A and the electrode terminals 6 composing part of the signal lines are formed at the same time as the formation of the source-drain wires 12 and 21. At this time, photosensitive resin patterns 87A and 87B are formed with half-tone exposure technology thicker than the 1.5 μm of the region 87B corresponding to the source-drain wires 12 and 21 and the 3 μm thickness, for example, of 87A on the electrode terminals 5 and 6 as in Embodiment 3.

When the said photosensitive resin patterns 87A and 87B are reduced by at least 1.5 μm using oxygen plasma or other ashing means after the source-drain wires 12 and 21 are formed, the reduced photosensitive resin patterns 87C are left unchanged only on the electrode terminals 5 and 6; the source-drain wires 12 and 21 are anodized to form oxide layers 68 and 69, and the second amorphous silicon layer 33A and the first amorphous silicon layer 31A exposed on the bottom side of the source-drain wires 12 and 21 are anodized to form silicon oxide layers (SiO$_2$) 66 and 67, which are insulating layers, using the photosensitive resin patterns 87C as masks while light is irradiated as shown in FIG. 11 (e) and 12 (e).

After the anodization, the photosensitive resin patterns 87C are removed, exposing the electrode terminals 5 and 6 comprising a low resistance thin film layer as shown in FIG. 11 (f) and FIG. 12 (f). The active substrate 2 thus obtained and a color filter 9 is attached together to form a liquid crystal panel, thereby completing Embodiment 6 of the present invention. The construction of the storage capacitor 15 is identical to that in Embodiment 4.

By changing the design of the pattern for forming the signal lines 12 containing part of the transparent conductive electrode terminals 6A of the signal line 12 without forming metal electrode terminals 5 on the transparent conductive electrode terminals 5A of the scan lines as shown in FIG. 11(g) and FIG. 12(g), electrode terminals 5A and 6A comprising a transparent conductive layer can be made in place of the electrode terminals 5 and 6 comprising the source-drain wire material as in Embodiment 4. In this case, half-tone exposure technology is not needed in the formation of the photosensitive resin patterns to form the source-drain wires 12 and 21, but a care is needed in increasing the resistance values of the transparent conductive layers 5A and 6A.

The number of processes is decreased for selective passivation formation (using half-tone exposure technology) of the source-drain wires by forming photosensitive organic insulating layers or anodized layers on the source-drain wires in this manner in the liquid crystal display device described in Embodiment 1 to Embodiment 6, but in the embodiment below, half-tone exposure technology is applied to the formation process of the etch-stop layers (protective insulating layers) and the formation process of the contacts (openings) to further reduce the number of processes.

Embodiment 7

Embodiment 7 of the present invention is explained below. In Embodiment 7, first, Cr, Ta, Mo, or the like, or an alloy or a silicide thereof is deposited as a first metal layer about 0.1 to 0.3 µm thick over the main surface of the glass substrate 2 using an SPT or other vacuum film depositing equipment as shown in FIG. 13(a) and FIG. 14(a), and scan lines 11 doubling as gate electrodes 11A and storage capacitor lines 16 are selectively formed using micro-fabrication technology.

Next, three thin film layers comprising a first SiN$_x$ layer 30 composing a gate insulating layer, a first amorphous silicon layer 31 composing an channel of an insulating gate-type transistor including hardly any impurities, and a second SiN$_x$ layer 32 composing an insulating layer for protecting the channel, are successively deposited about 0.3, 0.05, and 0.1 µm thick, for example, over the entire surface of the glass substrate 2 using a PCVD equipment. Then, having openings 63A on the scan lines 11 and openings 65A on the storage capacitor lines 16 outside an image display area; photosensitive resin patterns 82A and 82B are formed with half-tone exposure technology thicker than the 2-µm thickness, for example, of the protective insulating layer formation region, that is, the region 82A above the gate electrode 11A and the 1-µm thickness of the other region 82B; and the second SiN$_x$ layer 32, the first amorphous silicon layer 31 and the first SiN$_x$ layer 30 in the openings 63A and 65A are selectively removed using the photosensitive resin pattern 82A and 82B as masks to expose part of the scan lines 11 and part of the storage capacitor lines 16 respectively. Because the electrode terminal of the scan lines 11 is about half the electrode pitch of the driver LSI at the most, and normally larger than 20 µm, producing the photomask and controlling the finishing dimensions are extremely easy for forming the openings 63A and 65A (white regions).

Continuing, by reducing the said photosensitive resin patterns 82A and 82B by 1 µm or more using oxygen plasma or other ashing means, the photosensitive resin patterns 82B can be eliminated, exposing second SiNx layer 32 and leaving the photosensitive resin patterns 82C left unchanged on only the protective insulating layer formation regions above the gate electrodes 11A as shown in FIGS. 13(c) and 14(c). In the said oxygen plasma treatment, it is desirable to suppress change in the pattern dimensions by strengthening the anisotropy, though it is not necessary if the pattern accuracy is low. The width of the photosensitive resin pattern 82C, that is, the etch-stop layer, is the sum of the photo-mask alignment accuracy and the length between the source-drain wires, so if the interval between the source wire and the drain wire is 4 to 6 µm and the alignment accuracy is ±3 µm, then it becomes 10 to 12 µm, and not a strict condition for dimension accuracy. If the resist pattern is isotropically reduced 1 µm during the conversion from the resist pattern 82A to 82C, however, not only does the dimension decrease 2 µm, but the mask alignment accuracy decreases 1 µm to ±2 µm during the source-drain wires formation, with the effects of the latter more strict in terms of process than the former. In the said oxygen plasma treatment, it is therefore desirable to suppress change in the pattern dimensions by increasing the anisotropy. In further detail, RIE oxygen plasma treatment is desirable, and ICP or TCP oxygen plasma treatment having a high-density plasma source is even more desirable. Alternatively, measures such as providing for a process-based approach of designing beforehand the pattern dimension of the resist patterns 82A larger, anticipating the amount of dimension change in the resist pattern, are desirable.

Continuing, the second SiNx layer 32 is selectively etched finer than the gate electrodes 11A using the photosensitive resin patterns 82C as masks to make protective insulating layers 32D and expose the first amorphous silicon layer 31 as shown in FIGS. 13(d) and 14(d). The size of the protective insulating layer formation region, that is the photosensitive resin pattern 82C (the black region), is 10 µm at minimum. It should be understood that not only is it easy to produce a photomask for making the regions outside the white and black regions half-tone exposure regions, but that what determines the on current of the insulating gate-type transistor is the dimension of the channel protective insulating layer 32D, not the dimension of the interval between the source-drain wires 12 and 21, so process control is made yet easier than with a channel etch-type insulating gate transistor. In further detail, the length of the interval between the source-drain wires interval is 5±1 µm with the channel etch-type, but with the etch stop-type the length of the protective insulating layer is 10±1 µm, roughly halving the on current fluctuation under identical developing conditions. At this point, part of the exposed scan lines 11 are exposed with an etching gas or a chemical solution, so care is needed in the reduction of part of the scan lines 11 depending on its material, but even if Al alloy is exposed, it is easy to avoid oxidation effects by selecting Ti for the bottommost layer as the source-drain wiring material. As described in the prior art example, if a laminate made of Ti/Al/Ti, for example, is used for the scan lines 11, a production method may be employed where the Al is removed to expose the bottom Ti layer even if the top Ti layer has been eliminated.

After removing the said photosensitive resin patterns 82C, a second amorphous silicon layer 33 including phosphorous, for example, as an impurity is deposited over the entire surface of the glass substrate 2 using a PCVD equipment. Then, a thin film layer of Ti, Ta, or the like, for example, is deposited as an anodizable heat-resistant metal layer about 0.1 μm thick, an Al thin film layer 35 is deposited similarly as an anodizable low-resistant wiring layer about 0.3 μm thick, and then a Ta or other such thin film layer 36 is similarly deposited as an anodizable intermediate conductive layer about 0.1 μm thick using an SPT or other vacuum film depositing equipment.

Figure 13:
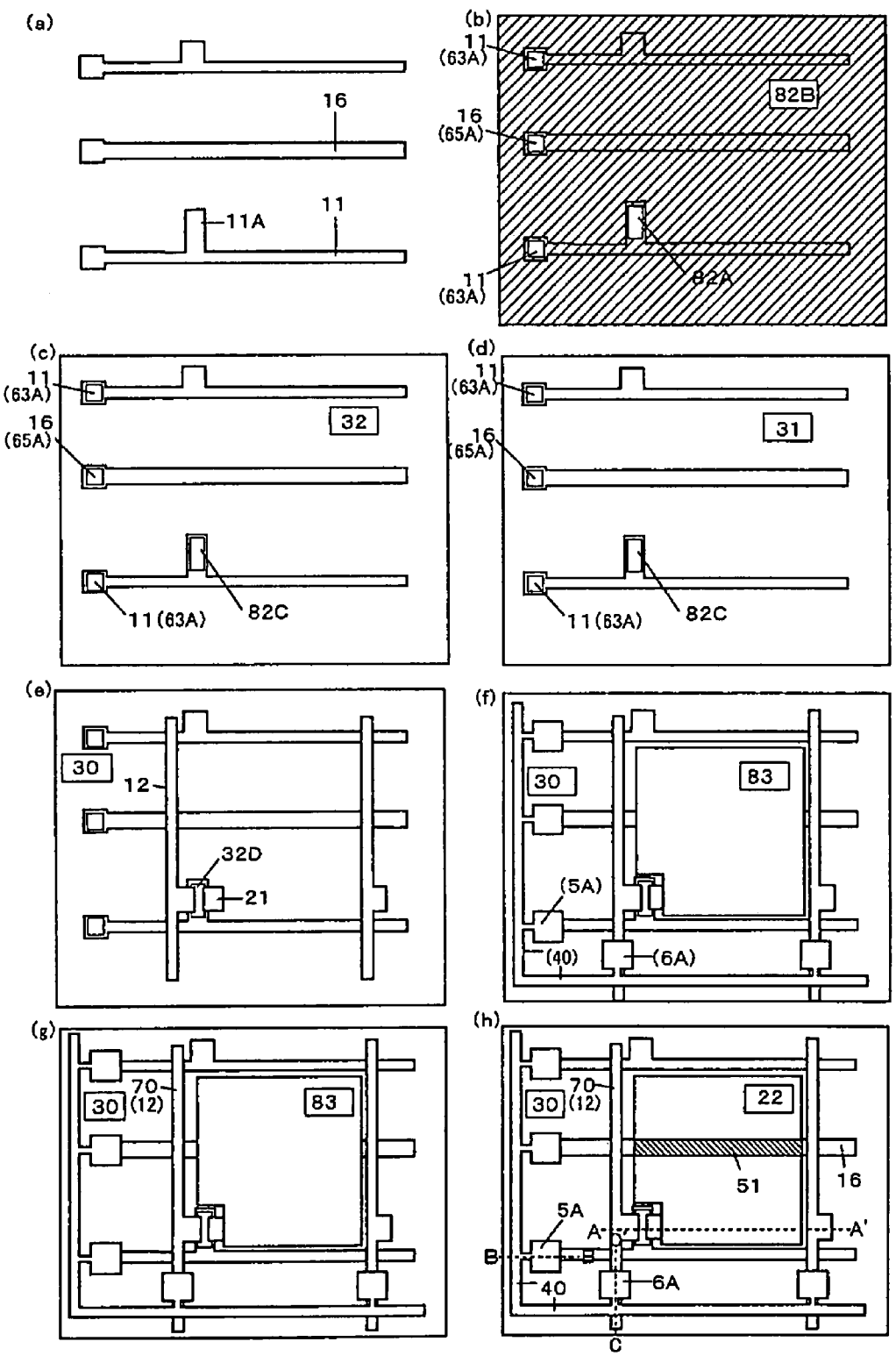
FIG. 13 shows a plane view of the active substrate in Embodiment 7 of the present invention.
Figure 14:
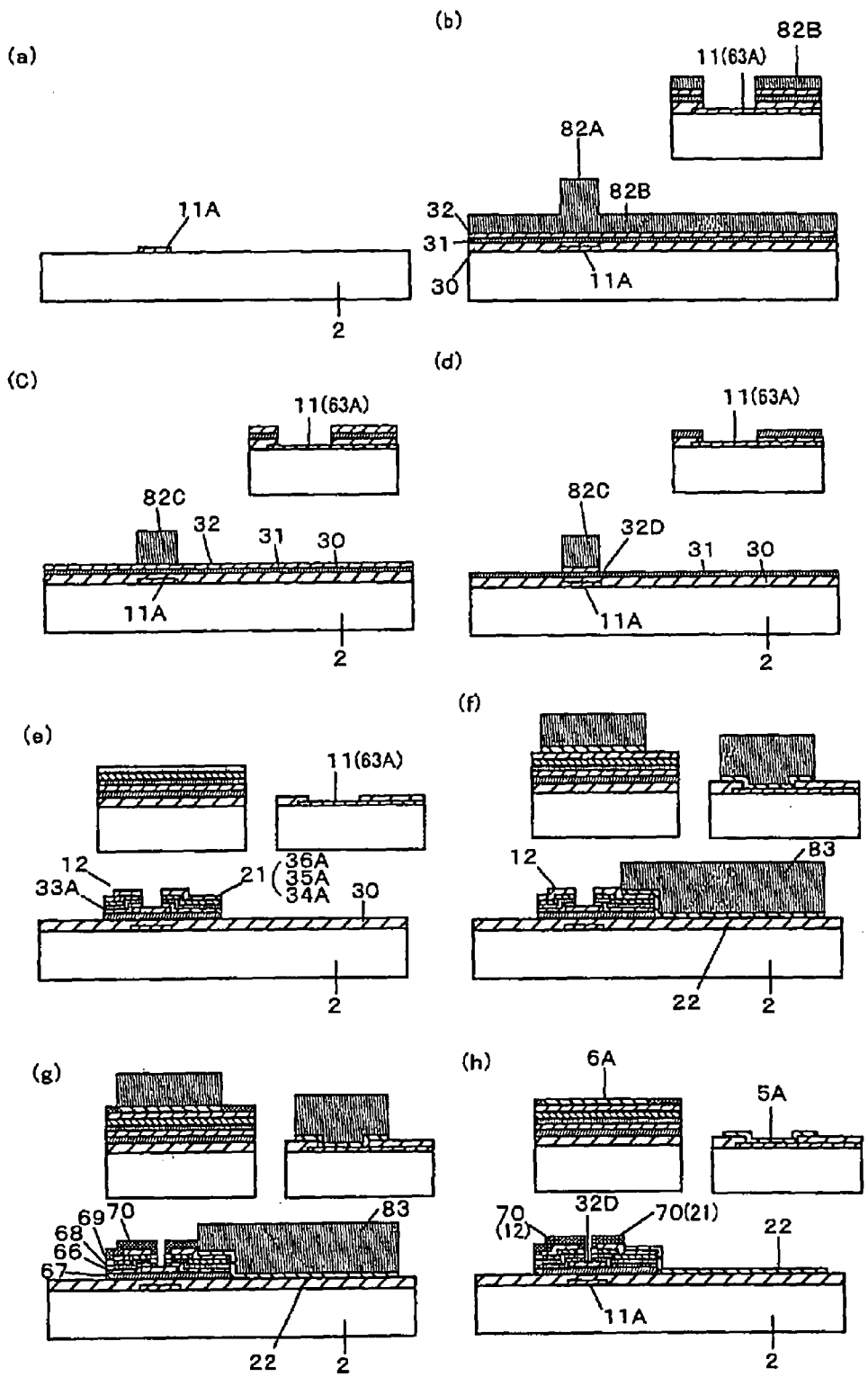
FIG. 14 shows a cross-sectional view for the manufacturing process of the active substrate in Embodiment 7 of the present invention.
Figure 15:
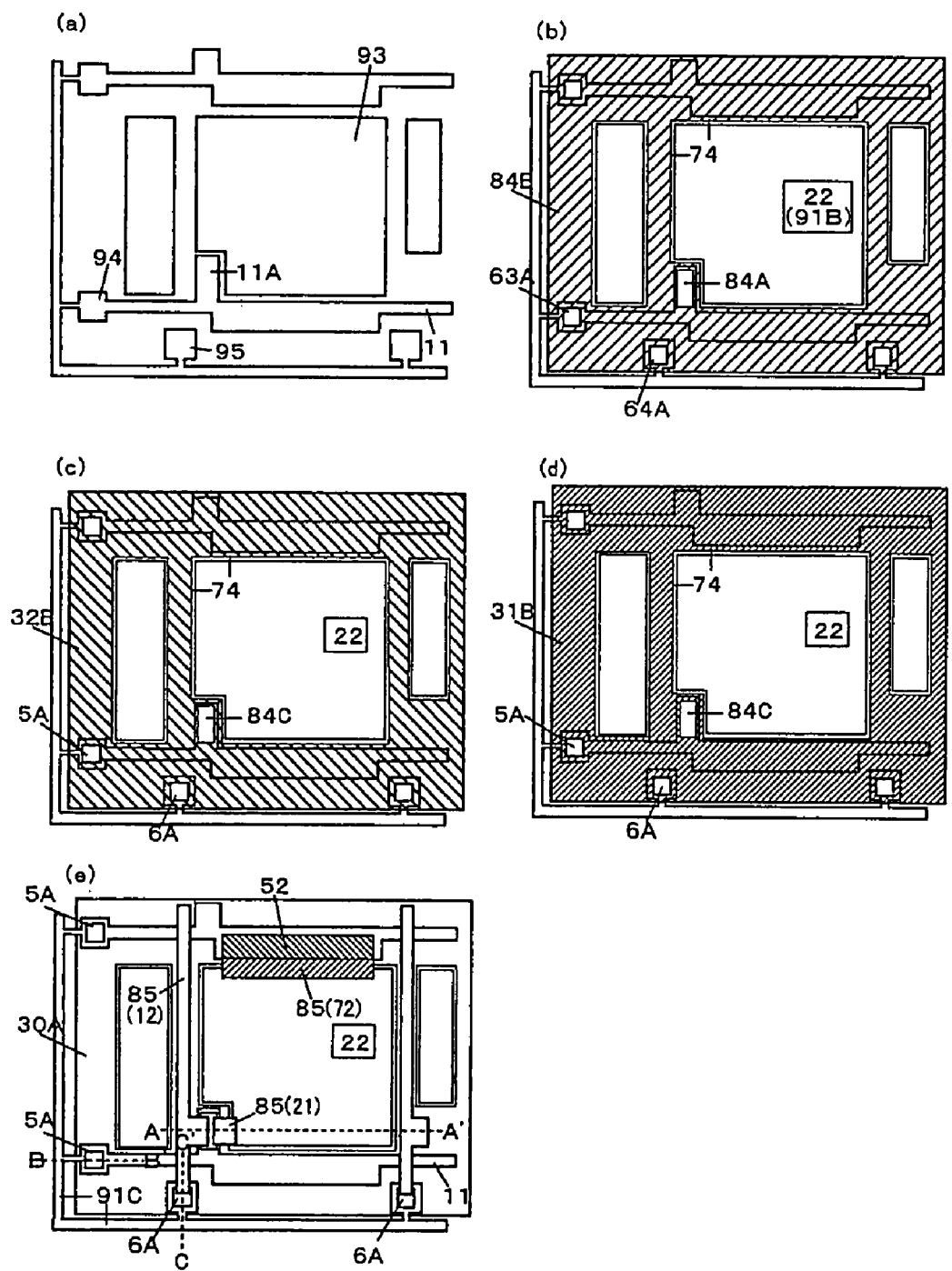
FIG. 15 shows a plane view of the active substrate in Embodiment 8 of the present invention.
Figure 16:
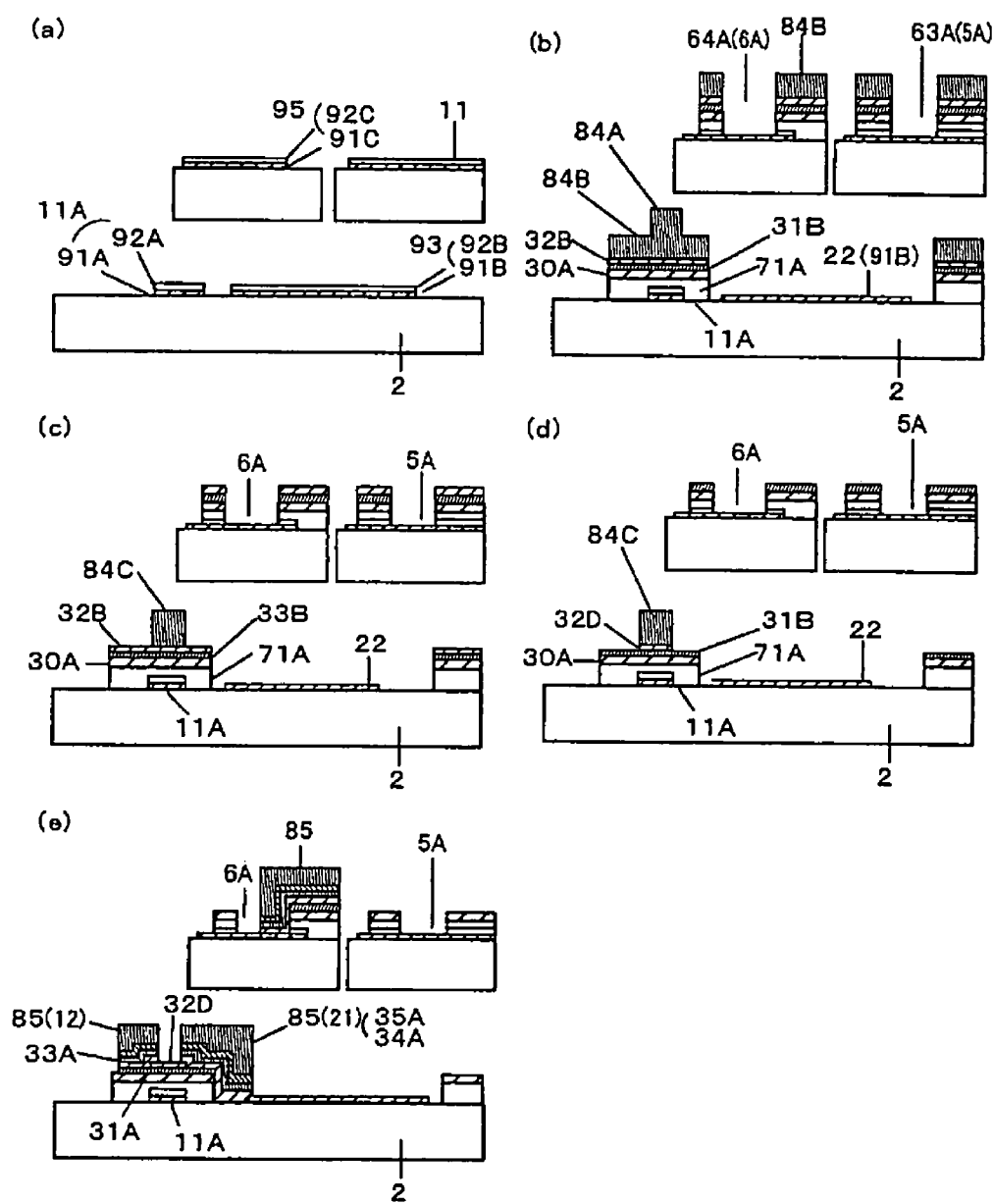
FIG. 16 shows a cross-sectional view for the manufacturing process of the active substrate in Embodiment 8 of the present invention.
Figure 17:
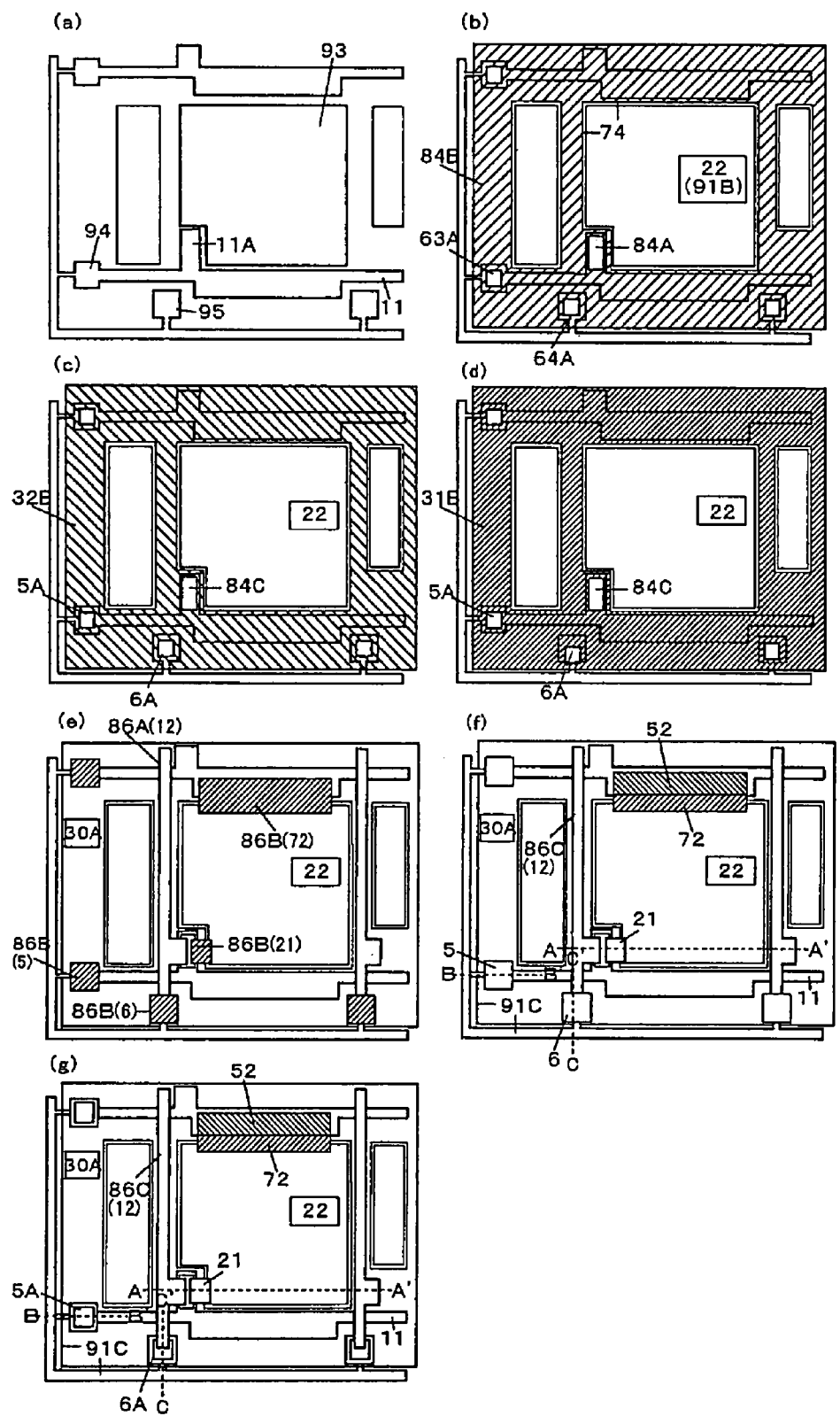
FIG. 17 shows a plane view of the active substrate in Embodiment 9 of the present invention.
Figure 18:
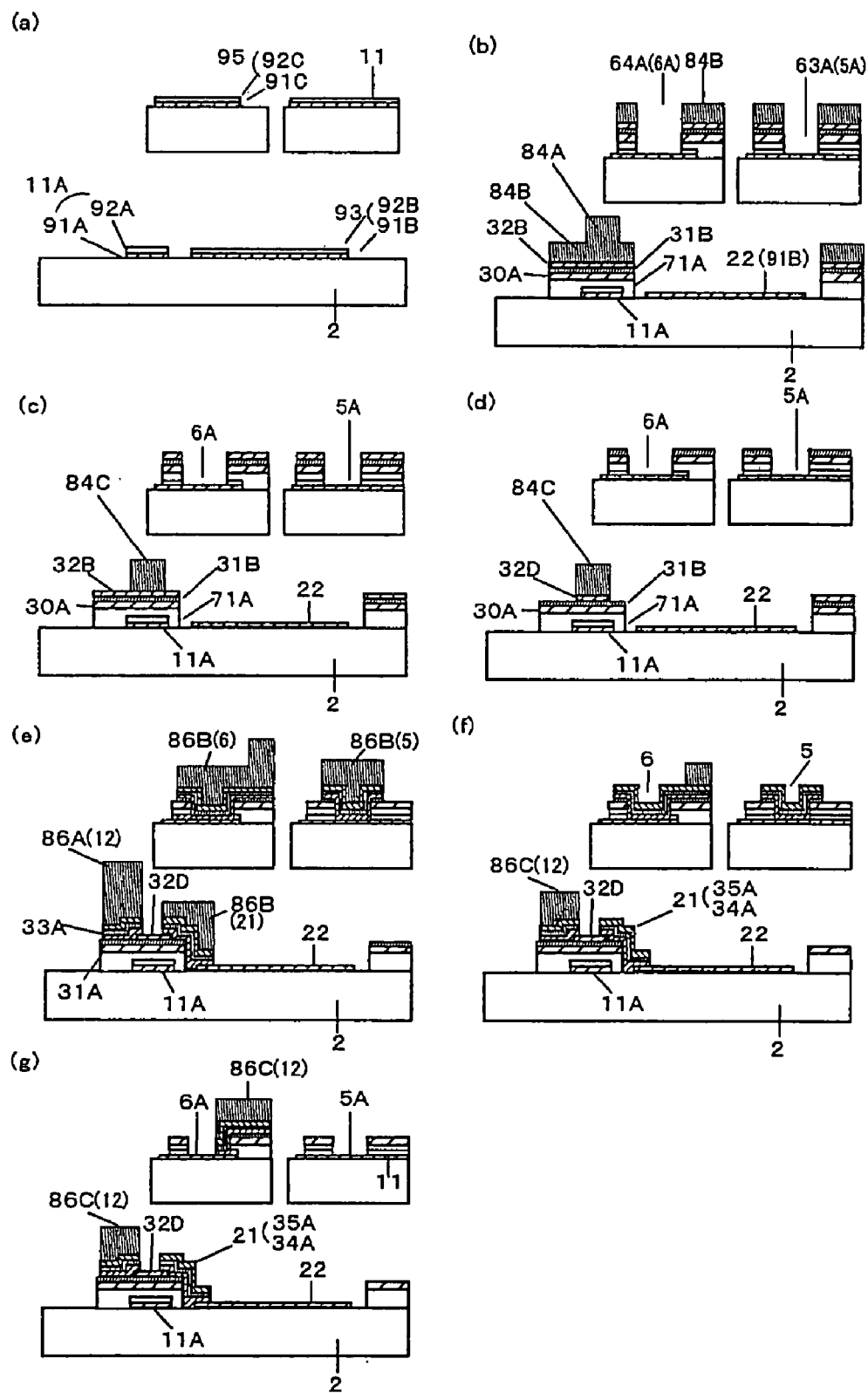
FIG. 18 shows a cross-sectional view for the manufacturing process of the active substrate in Embodiment 9 of the present invention.
Figure 19:
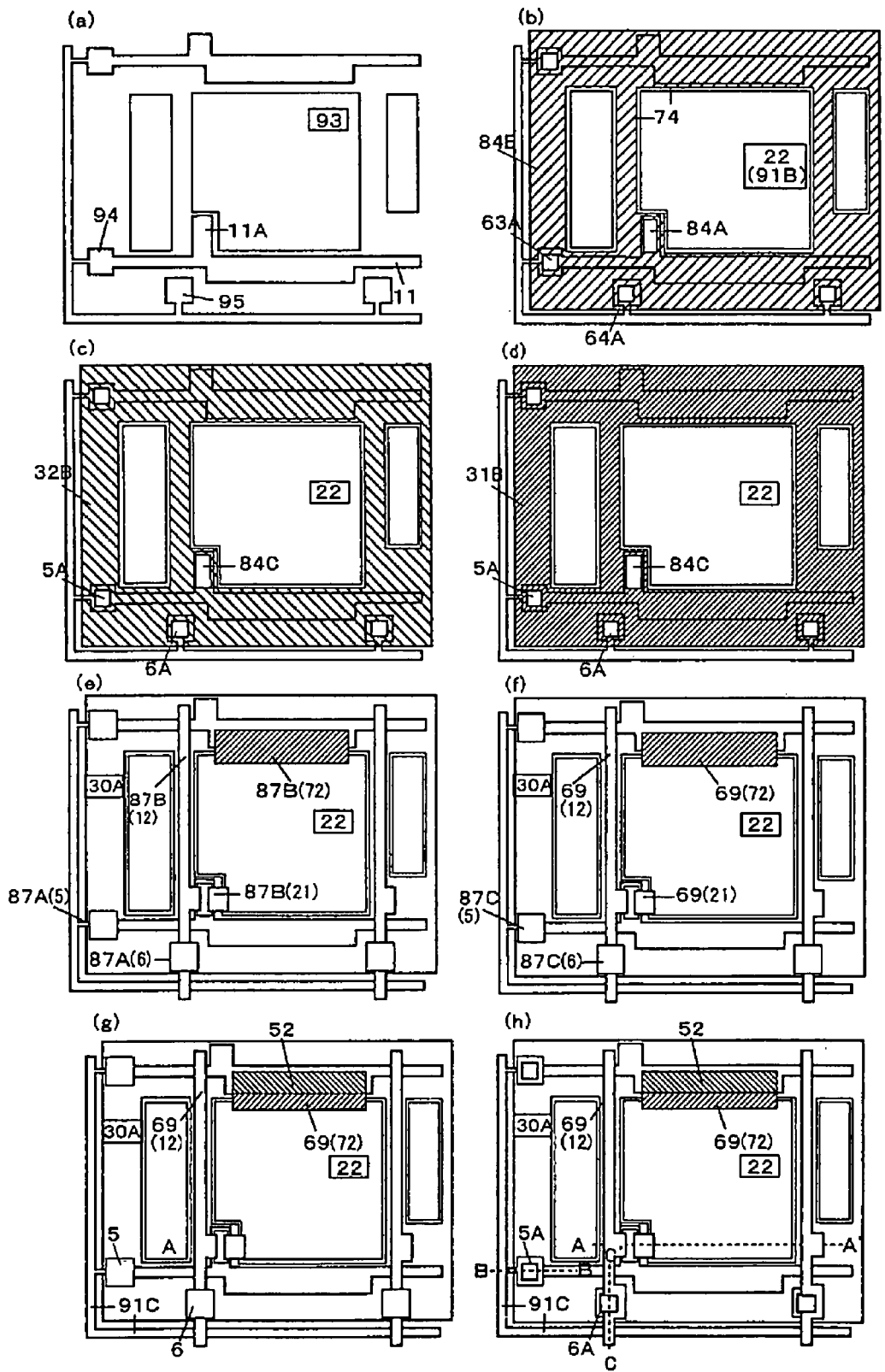
FIG. 19 shows a plane view of the active substrate in Embodiment 10 of the present invention.
Figure 20:
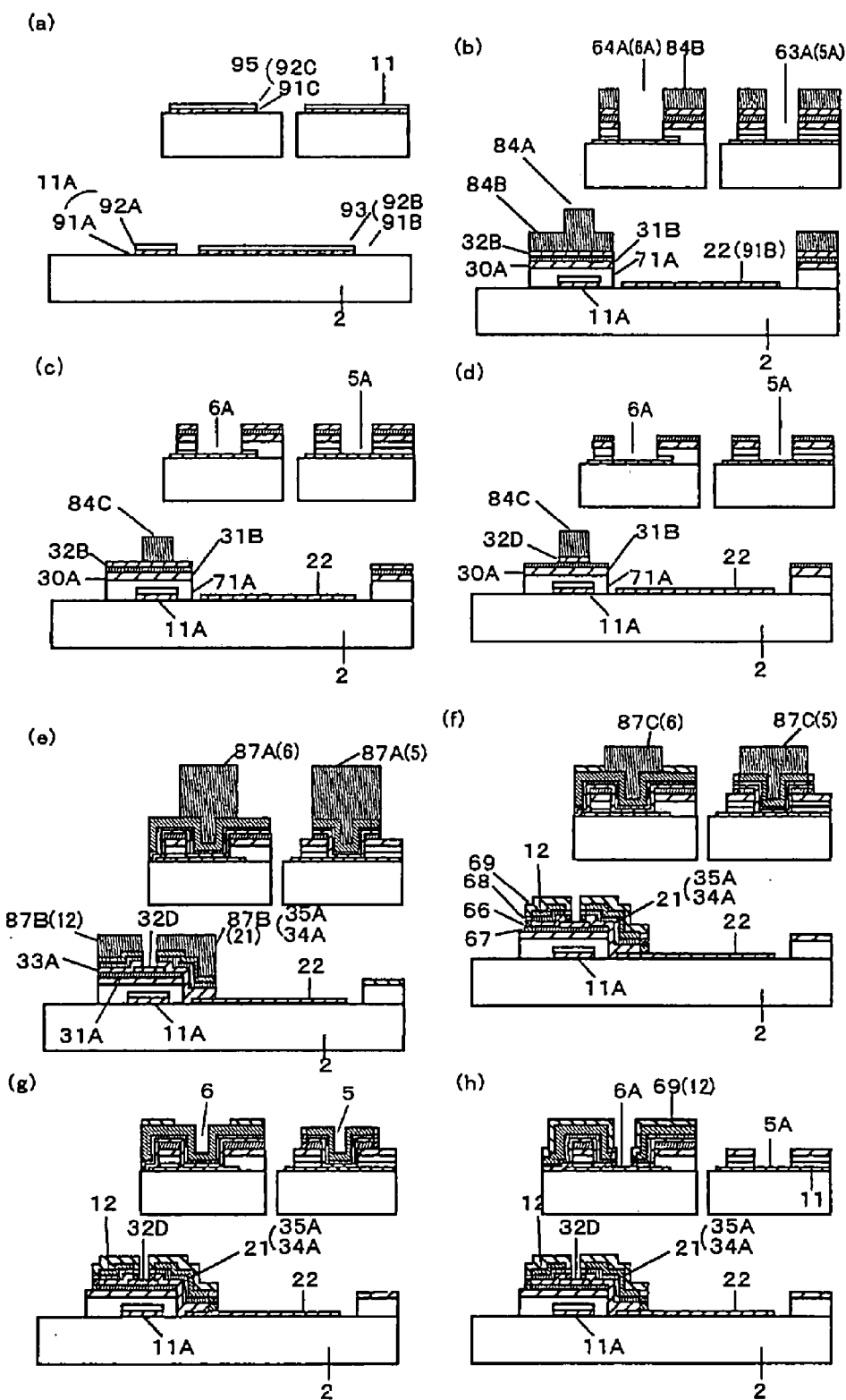
FIG. 20 shows a cross-sectional view for the manufacturing process of the active substrate in Embodiment 10 of the present invention.

Then, the source-drain wire materials comprising these three thin film layers, the second amorphous silicon layer 33, and the first amorphous silicon layer 31 are successively etched using photosensitive resin patterns using micro-fabrication technology to expose the protective insulating layers 32D and the gate insulating layer 30, and drain electrodes 21 of the insulating gate-type transistors and the signal lines 12 doubling as source wires, comprising a laminate made of 34A, 35A, and 36A, are selectively formed as shown in FIG. 13 (e) and FIG. 14(e). Electrode terminals 5 of the scan lines containing part of the scan lines are formed at the same time as the formation of the source-drain wires 12 and 21, but electrode terminals need not be formed at this point as illustrated depending on the material of the source-drain wires.

After the formation of the source-drain wires 12 and 21, ITO, for example, is deposited as a transparent conductive layer about 0.1 to 0.2 μm thick using an SPT or other vacuum film depositing equipment over the entire surface of the glass substrate 2, and pixel electrodes 22 are selectively formed on part of the drain electrodes 21 and on the gate insulating layer 30 using micro-fabrication technology as shown in FIG. 13(f) and FIG. 14(f). Transparent conductive layer patterns are formed on the exposed parts 5 (or the electrode terminals) of the scan lines and on the signal lines 12 outside the image display area, making transparent conductive electrode terminals 5A and 6A respectively Transparent conductive short lines 40 are provided similar to in the prior art example, and by forming the interval between the electrode terminals 5A and 6A and the short lines 40 into a long, narrow stripe form, high resistance may be provided as a countermeasure against static electricity.

Continuing, source-drain wires 12 and 21 are anodized while irradiating light to form oxide layer on their surfaces using the photosensitive resin patterns 83 used in the selective pattern formation of the pixel electrodes 22 as masks as shown in FIG. 13(g) and FIG. 14(g). Ta is exposed on the top surface of the source-drain wires 12 and 21, and the laminate made of Ta, Al, Ti, the second amorphous silicon layer 33A, and the first amorphous silicon layer 31A is exposed on the side surface. Through anodization, the second amorphous silicon layer 33A is transmuted to a silicon oxide layer (SiOx) 66 including impurities, the first amorphous silicon layer 31A is transmuted into a silicon oxide layer ($SiO_2$) 67 not including impurities, Ti is transmuted into titanium oxide ($TiO_2$), 68 which is a semiconductor, Al is transmuted into aluminum oxide ($Al_2O_3$) 69, which is an insulating layer, and Ta is transmuted into tantalum pentoxide ($Ta_2O_5$) 70, which is an insulating layer.

The reason for covering the pixel electrodes 22 with the photosensitive resin patterns 83 is not only so anodization of the pixel electrodes 22 is unnecessary, but so that the formation current flowing in the drain electrode 21 through the insulating gate type transistor is not maintained higher than necessary.

At the end, the said photosensitive resin patterns 83 are removed to complete the active substrate 2 as shown in FIG. 13(h) and FIG. 14(h). The active substrate 2 thus obtained and a color filter 9 is attached together to form a liquid crystal panel, thereby completing Embodiment 7 of the present invention. The composition of the storage capacitor 15 is exemplified by a construction where the pixel electrode 22 and the storage capacitor line 16 are overlaid in a planar fashion (a right-slanting oblique portion 51) via the gate insulating layer 30.

In Embodiment 7, half-tone exposure technology is applied to layers with such a low pattern accuracy, as the formation process of the contacts on the scan lines, and as the formation process of the protective insulating layers to reduce the number of photographic etching processes and produce an active substrate with four photomasks, but by coordinating streamlined technology where the formation of the pixel electrode and the scan line with one photomask as in Embodiment 1 to Embodiment 6, the number of processes can be further reduced, making it possible to produce an active substrate with three photomasks, which is described in Embodiment 8 to Embodiment 10.

Embodiment 8

In Embodiment 8, first, ITO, for example, is deposited as a transparent conductive layer 91 about 0.1 to 0.2 μm thick, and a first metal layer 92 is deposited about 0.1 to 0.3 μm thick on the main surface of a glass substrate 2 using an SPT or other vacuum film depositing equipment as in Embodiment 1, and scan lines 11 doubling as gate electrodes 11A, pseudo-electrode terminals 94, which are part of the scan lines, pseudo-pixel electrodes 93, and pseudo-electrode terminals 95 of the signal lines are selectively formed as shown in FIG. 15(a) and FIG. 16(a).

Next, a transparent insulating layer, for example, TaOx or $SiO_2$ composing a plasma protective layer, is deposited about 0.1 μm thick over the entire surface of the glass substrate 2, and three thin film layers comprising a first $SiN_x$ layer 30 composing a gate insulating layer, a first amorphous silicon layer 31 composing a insulating gate-type transistor channel and including hardly any impurities, and a second $SiN_x$ layer 32 composing an insulating layer for protecting the channel are successively deposited about 0.2, 0.05, and 0.1 μm thick, for example, using a PCVD equipment. Photosensitive resin patterns 84A and 84B having openings 74 on the pseudo-electrode terminals 93, openings 63A on the pseudo-electrode terminals 94 of the scan lines 11 and openings 65A on the pseudo-electrode terminals 95 outside the image display area, are formed with half-tone exposure technology thicker than the 2-μm thickness, for example, of the protective insulating layer formation region, that is, the region 84A above the gate electrode 11A, and the 1-μm thickness of the other region 84B. Then, the second $SiN_x$ layer 32, the first amorphous silicon layer 31, the gate insulating layer 30, and the plasma protective layer 71 are successively etched in the said openings as well as the first metal layers 92A to 92C as shown in FIG. 15(b) and FIG. 16(b) using the photosensitive resin patterns 84A and 84B as masks. The transparent conductive layers 91A of the pseudo-electrode terminals 94 are exposed to make electrode terminals 5A for the scan lines, the transparent conductive layers 91C of the pseudo-electrode terminals 95 are similarly exposed to make electrode terminals 6A of the signal lines, and the transparent conductive layers 91B of the pseudo-pixel electrodes 93 are exposed to make pixel electrodes 22.

Continuing, by reducing the said photosensitive resin patterns 84A and 84B by 1 μm or more using oxygen plasma or other ashing means, the photosensitive resin patterns 84B can be eliminated to expose the second SiNx layer 32B and leave the reduced photosensitive resin patterns 84C unchanged only on the protective insulating layer formation regions above the gate electrodes 11A as shown in FIGS. 15(c) and 16(c). Then, the second SiNx layer 32B is selectively etched using the photosensitive resin patterns 84C, whose film thickness has been reduced, as masks to make protective insulating layers 32D with narrower patterns than the gate electrodes 11A and expose the first amorphous silicon layer 31B as shown in FIGS. 15(d) and 16(d).

Continuing, after removing the said photosensitive resin patterns 84C, a second amorphous silicon layer 33 including phosphorous, for example, as an impurity is deposited 0.05 μm thick over the entire surface of the glass substrate 2 using a PCVD equipment. Then, a thin film layer of Ti, Ta, or the like, for example, is deposited as a heat-resistant metal layer about 0.1 μm thick, and Al thin film layer 35 is subsequently deposited as a low-resistance wiring layer about 0.3 μm thick using an SPT or other vacuum film depositing equipment. Then, source-drain wire material comprising these two thin film layers, the second amorphous silicon layer 33, and the first amorphous silicon layer 31B are successively etched using the photosensitive organic insulating layer patterns 85 using micro-fabrication technology to expose the protective insulating layers 32D and the gate insulating layer 30A. Drain electrode 21 of the insulating gate-type transistors containing part of the pixel electrodes 22 and the signal lines 12 doubling as source electrodes and containing part of the electrode terminals 6A of the signal lines, both comprising a laminate made of 34A and 35A, are selectively formed FIG. 15 (e) and FIG. 16(e).

The active substrate 2 thus obtained and a color filter 9 is attached together to form a liquid crystal panel, thereby completing Embodiment 8 of the present invention. The construction of the storage capacitor 15 is exemplified in FIG. 15(e) (a right-slanting oblique portion 52) where protruding part provided at the scan line 11 in the upper pixel and the capacitor electrode 72 formed containing part of the pixel electrode 22 at the same time as the source-drain wires 12 and 21 are overlaid in a planar fashion via the plasma protective layer 71A, the gate insulating layer 30A, the first amorphous silicon layer 31E, and the second amorphous silicon layer 33E (all of which are not illustrated), identical to Embodiment 1.

In this manner, limitations in the construction of the device, in which both the electrode terminals of the scan the signal line are transparent conductive layers, arise in Embodiment 8, though those limitations may be overcome in the device and process as is explained in Embodiment 9 and Embodiment 10.

Embodiment 9

The process proceeds in Embodiment 9 nearly identically to that in Embodiment 8 up to the formation process of the contacts and the formation process of the protective insulating layers as shown in FIG. 17(d) and FIG. 18(d). Because of the reason described below, the pseudo-electrode terminals 95 are not necessarily required. Then, the said photosensitive resin patterns 84C are removed, and the second amorphous silicon layer 33 including phosphorous, for example, as an impurity is deposited over the entire surface of the glass substrate 2 using a PCVD equipment. Next, a thin film layer 34 of Ti, Ta, or the like, for example, is deposited as a heat resistant metal layer about 0.1 μm thick, and an Al thin film layer 35 is deposited subsequently as a low-resistance metal layer about 0.3 μm thick using an SPT or other vacuum film depositing equipment in the source-drain wire formation process. Then, source-drain wire materials comprising these two thin film layers, the second amorphous silicon layer 33, and the first amorphous silicon layer 31B are successively etched using the photosensitive organic insulating layer patterns 86A and 86B using micro-fabrication technology to expose the protective insulating layers 32D and the gate insulating layer 30A as in Embodiment 2 and Embodiment 5. Drain electrodes 21 of the insulating gate-type transistors containing part of the pixel electrodes 22 and signal lines 12 doubling as source wires, both comprising a laminate made of 34A and 35A, are selectively formed; and the electrode terminals 5 of the scan lines containing part 5A of the exposed scan lines and the electrode terminals 6 composing part of the signal lines, are formed at the same time as the formation of the source-drain wires 12 and 21 as shown in FIG. 17(e) and FIG. 18(e). In further detail, the pseudo-electrode terminals 95 as used in Embodiment 8 are not necessarily required.

The said photosensitive organic insulating layer patterns 86A and 86B can be reduced by at least 1.5 μm using oxygen plasma or other ashing means after the source-drain wires 12 and 21 are formed to eliminate the photosensitive organic insulating layer patterns 86B, thereby exposing the electrode terminals 5 and 6 and the drain electrodes 21, and leaving the reduced photosensitive organic insulating layer patterns 86C unchanged on only the signal lines 12 as shown in FIG. 17(f) and FIG. 18(f); but it is desirable to increase the anisotropicity, suppressing changes in the pattern dimension as the reliability decreases when the top surface of the signal line 12 is exposed due to narrowing of the width of the photosensitive organic insulating layer patterns 86C in the said plasma treatment.

The active substrate 2 thus obtained and a color filter 9 is attached together to form a liquid crystal panel, thereby completing Embodiment 9 of the present invention. The construction of the storage capacitor 15 is identical to that in Embodiment 8. Making the shape of the transparent conductive layer pattern connecting the transparent conductive pattern 5A which is part of the scan line, and the transparent conductive pattern 6A formed below the signal line 12 to the short wire 40 long and narrow makes may compose a high-resistance line as a countermeasure against static electricity.

By changing the design of the pattern for forming the signal lines 12 containing part of the transparent conductive electrode terminals 6A of the signal line 12 without forming metal electrode terminals 5 on the transparent conductive electrode terminals 5A of the scan lines as shown in FIG. 17(g) and FIG. 18(g); electrode terminals 5A and 6A comprising a transparent conductive layer can be made in place of the electrode terminals 5 and 6 comprising the source-drain wire material similarly as in Embodiment 8. The construction of the device will not be altered in the image display part even if the component material of electrode terminals is changed.

In Embodiment 8 and Embodiment 9 of the present invention, the reduction of the number of manufacturing processes proceeds by forming organic insulating layers only on the source-drain wires or only on the signal lines, but the thickness of the organic insulating layer is 1 μm or more, so passivation technology is provided in Embodiment 10 instead of an organic insulating layer by adding a minimum number of processes to avoid the problem caused by level differences.

Embodiment 10

The process proceeds in Embodiment 10 nearly identically to that in Embodiment 9 up to the formation process of the contacts and the formation process of the protective insulating layers as shown in FIG. 19(d) and FIG. 20(d). After removing the said photosensitive resin patterns 84C, a second amorphous silicon layer 33 including phosphorous, for example, as an impurity is deposited over the entire surface of the glass substrate 2 using a PCVD equipment. Then, a thin film layer 34 of Ti, Ta, or the like, for example, is deposited as an anodizable heat-resistant metal layer about 0.1 µm thick, and an Al thin film layer 35 is deposited similarly as an anodizable low-resistance metal layer about 0.3 µm thick in the source-drain wires formation process. Then, source-drain wire material comprising these two thin film layers, the second amorphous silicon layer 33, and the first amorphous silicon layer 31B are successively etched using the photosensitive resin patterns 87A and 87B using micro-fabrication technology to expose the protective insulating layers 32D and the gate insulating layer 30A similar to in Embodiment 3 and Embodiment 6. Drain electrodes 21 of the insulating gate-type transistors containing part of the pixel electrodes 22 and signal lines 12 doubling as source wires, both comprising a laminate made of 34A and 35A, are selectively formed as shown in FIG. 19(e) and FIG. 20(e), and the electrode terminals 5 of the scan lines containing part 5A of the exposed scan lines 11, and the electrode terminals 6 composing part of the signal lines are formed at the same time as the formation of the source-drain wires 12 and 21.

After the source-drain wires 12 and 22 are formed, the said photosensitive resin patterns 87A and 87B can be reduced by at least 1.5 µm using oxygen plasma or other ashing means to eliminate the photosensitive resin patterns 87B, exposing the source-drain wires 12 and 21 and the capacitor electrodes 72 as well as leaving the reduced photosensitive resin patterns 87C unchanged only on the electrode terminals 5 and 6. Then, the source-drain wires 12 and 21 are anodized to form the oxide layers 68 and 69, and the second amorphous silicon layer 33A and the first amorphous silicon layer 31A exposed on the bottom surface of the source-drain wires 12 and 21 are anodized to form silicon oxide layers (SiO$_2$) 66 and 67, which are insulating layers, as shown in FIG. 19(f) and FIG. 20(f) using the photosensitive resin patterns 87C as masks while irradiating light.

After the anodization is complete, the photosensitive resin patterns 87C are removed, exposing the electrode terminals 5 and 6 comprising the low-resistance thin film layer and having anodized layers in the sides as shown in FIG. 19(g) and FIG. 20(g). Anodizing current flows in the sides of the electrode terminals 5 of the scan lines through high-resistance short lines 91C for a static electricity countermeasure, so it should be understood that the thicknesses of the insulating layers formed in the sides are thinner than the electrode terminals 6 of the signal lines. The active substrate 2 thus obtained and a color filter 9 is attached together to form a liquid crystal panel, thereby completing Embodiment 10 of the present invention. The construction of the storage capacitor is identical to that in Embodiment 8.

By changing the design of the pattern for forming the signal lines 12 containing part of the transparent conductive electrode terminals 6A of the signal lines 12 without forming metal electrode terminals 5 on the transparent conductive electrode terminals 5A of the scan lines as shown in FIG. 19(h) and FIG. 20(h), electrode terminals 5A and 6A comprising a transparent conductive layer can be made in place of the electrode terminals 5 and 6 comprising the source-drain wire material as in Embodiment 8. In this case, half-tone exposure technology is not needed in the formation of the photosensitive resin patterns to form the source-drain wires 12 and 21, but a care is needed in increasing the resistance values of the transparent conductive layers 5A and 6A.

The liquid crystal display device described above uses TN-type liquid crystal cells, but the process reduction proposed in the present invention is also effective in IPS (In-Plain-Switching) type liquid crystal display devices for controlling the horizontal electric field with a pair of a pixel electrode and an counter electrode formed with a prescribed distance apart from the said pixel electrode, so this is described in the below embodiments.

Embodiment 11

In Embodiment 11, first, a first metal layer is deposited about 0.1 to 0.3 µm thick on the main surface of a glass substrate 2 using an SPT or other vacuum film depositing equipment, and scan lines 11 doubling as gate electrodes 11A and counter electrodes 16 doubling as storage capacitance lines are selectively formed using micro-fabrication technology as shown in FIG. 21(a) and FIG. 22(a).

Next, three thin film layers comprising a first SiNx layer 30 composing a gate insulating layer, a first amorphous silicon layer 31 composing a channel for an insulating gate-type transistor and including hardly any impurities, and a second SiNx layer 32 composing an insulating layer for protecting the channel are successively deposited about 0.3, 0.05, and 0.1 µm thick, for example, over the entire surface of the glass substrate 2 using a PCVD equipment. Second SiNx layers on the gate electrodes 11A are selectively left narrower than the gate electrodes 11A to make protective insulating layers 32D using micro-fabrication technology, exposing a first amorphous silicon layer 31 as shown in FIG. 21(b). Then, a second amorphous silicon layer 33 including phosphorous, for example, as an impurity is deposited about 0.05 µm thick, for example, over the entire surface of the glass substrate 2 using a PCVD equipment as shown in FIG. 22(b).

Continuing, outside the image display area, openings 63A are formed on the scan lines 11, openings 65A are formed on the counter electrodes 16 doubling as storage capacitor lines, and the second amorphous silicon layer 33, the first amorphous silicon layer 31, and the gate insulating layer 30 in the openings 63A and 65A are removed to expose part of the scan lines 11 and part of the counter electrodes 16 as shown in FIG. 21(c) and FIG. 22(c) using micro-fabrication technology.

Figure 21:
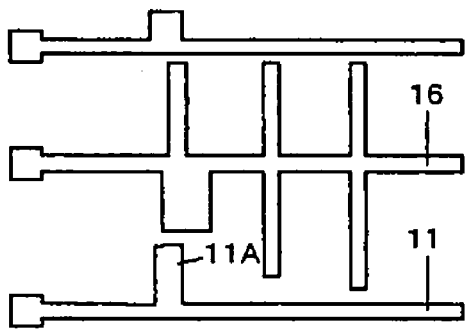
FIG. 21 shows a plane view of the active substrate in Embodiment 11 of the present invention.
Figure 21:
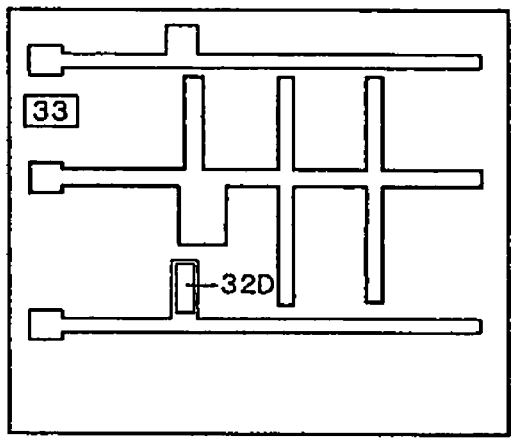
Figure 21:
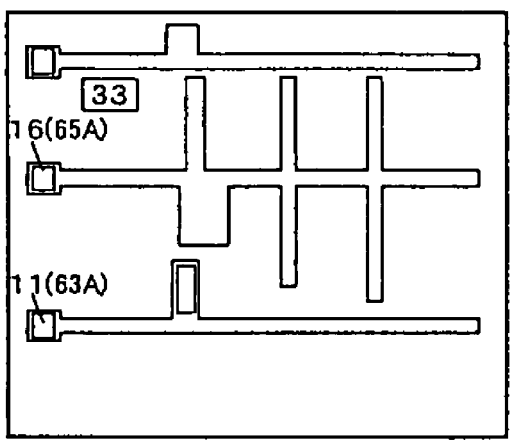
Figure 21:
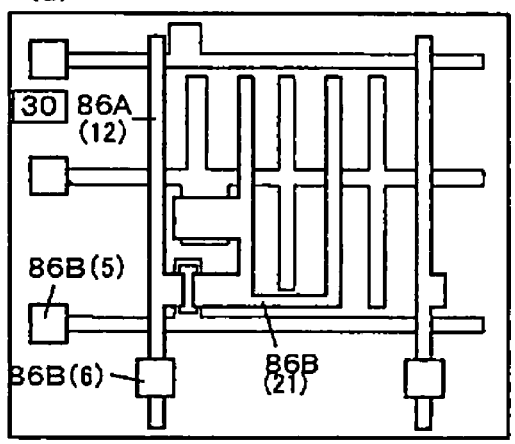
Figure 21:
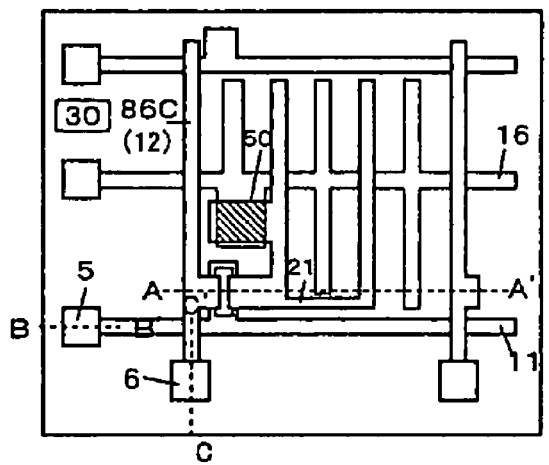
Figure 22:
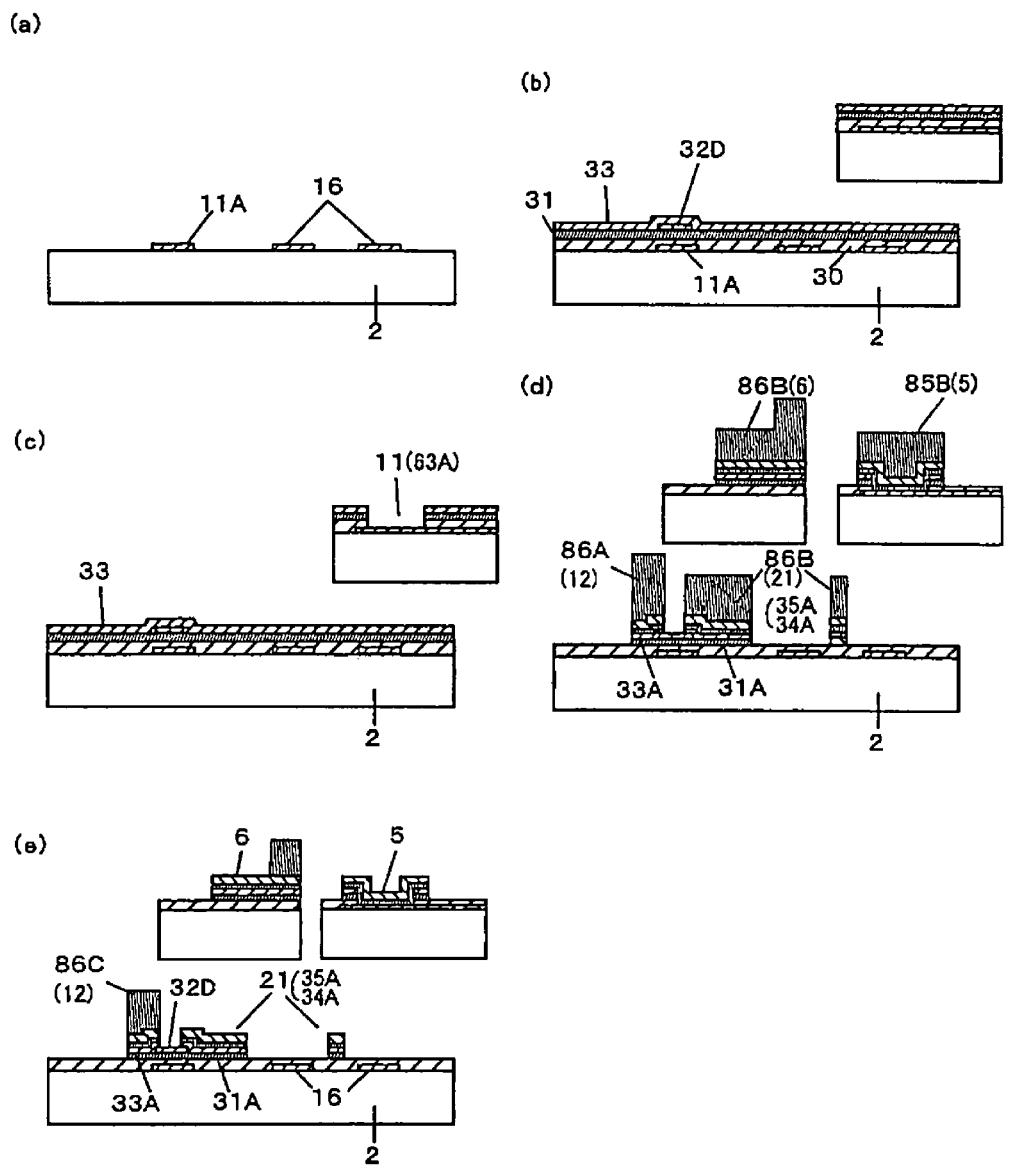
FIG. 22 shows a cross-sectional view for the manufacturing process of the active substrate in Embodiment 11 of the present invention.

A thin film layer 34 of Ti, Ta, or the like, for example, is deposited about 0.1 µm thick as a heat-resistant metal layer, and an Al thin film layer 35 is subsequently deposited as a low-resistance metal layer about 0.3 µm thick using an SPT or other vacuum film depositing equipment over the entire surface of the glass substrate 2. Then, source-drain wire material comprising these two thin film layers, the second amorphous silicon layer 33, and the first amorphous silicon layer 31 are successively etched using the photosensitive organic insulating layer patterns 86A and 86B using micro-fabrication technology to expose the protective insulating layers 32D and the gate insulating layer 30. Drain electrodes 21 of the insulating gate-type transistors doubling as pixel electrodes and signal lines 12 doubling as source wires, both comprising a laminate made of 34A and 35A, are selectively formed on the gate insulating layer 30 as shown in FIG. 21 (d) and FIG. 22 (d), and the electrode terminals 5 of the scan lines containing part of the exposed scan lines in the openings 63A and the electrode terminals 6 composing part of the signal lines are formed at the same time as the formation of the source-drain wires 12 and 21. Photosensitive organic insulating layer patterns 86A and 86B are formed at this point thicker than the 1.5 µm thickness of 86B on the drain electrodes 21 and the electrode terminals 5 and 6, and the 3-μm thickness, for example, of 86A on the signal lines 12 using half-tone exposure technology similarly as in Embodiment 9.

The said photosensitive organic insulating layer patterns 86A and 86B can be reduced by at least 1.5 μm using oxygen plasma or other ashing means after the source-drain wires 12 and 21 are formed to eliminate the photosensitive organic insulating layer patterns 86B, thereby exposing the drain electrodes 21 and the electrode terminals 5 and 6, and leaving the reduced photosensitive organic insulating layer patterns 86C unchanged only on the signal lines 12 as shown in FIGS. 21(*e*) and 22(*e*). As has already been described, it is desirable to strengthen the anisotropy to suppress changes in the pattern dimensions such that the pattern width of the photosensitive organic insulating layers 86C does not become narrow in the said oxygen plasma treatment.

The active substrate 2 thus obtained and a color filter 9 is attached together to form a liquid crystal panel, thereby completing Embodiment 11 of the present invention. The necessity of using photosensitive organic insulating layer with a high heat-resistance including a highly pure acrylic resin or polyimide resin as the main ingredient, not an ordinary photosensitive resin having a Novolak-type resin as the main ingredient for the photosensitive organic insulating layers 86C, has already been described. The construction of the storage capacitor 15 is exemplified by a region 50 (right-slanting oblique part) on which the counter electrodes (storage capacitor lines) 16 and the pixel electrodes (drain electrodes) 21 are overlaid as shown in FIG. 21(*e*) via the gate insulating layer 30, the first amorphous silicon layer 31E, and the second amorphous silicon layer 33E (none of which are illustrated). Although the static electricity countermeasure and design technology for connecting the interval between the electrode terminal 5 of the scan line and the electrode terminal 6 of the signal line with a high resistance material is not illustrated in FIG. 21, openings 63A are provided and a process is provided to expose part of the scan lines 11, furthermore a transparent conductive layer is not needed for an IPS-type liquid crystal display device, so a static electricity countermeasure may be easily added, constructed with a insulating gate-type transistor in an "off" state or a long-narrow conductive path using any of a scan line material, a signal line material, or a semiconductor layer.

In Embodiment 11 of the present invention, the decrease in the number of manufacturing processes proceeds by selectively forming the organic insulating layers only on the signal lines, but the organic insulating layer is 1 μm or thicker, so passivation technology is provided in Embodiment 12 instead of the organic insulating layer by adding a minimum number of processes to avoid problems due to the level differences.

Embodiment 12

Figure 23:
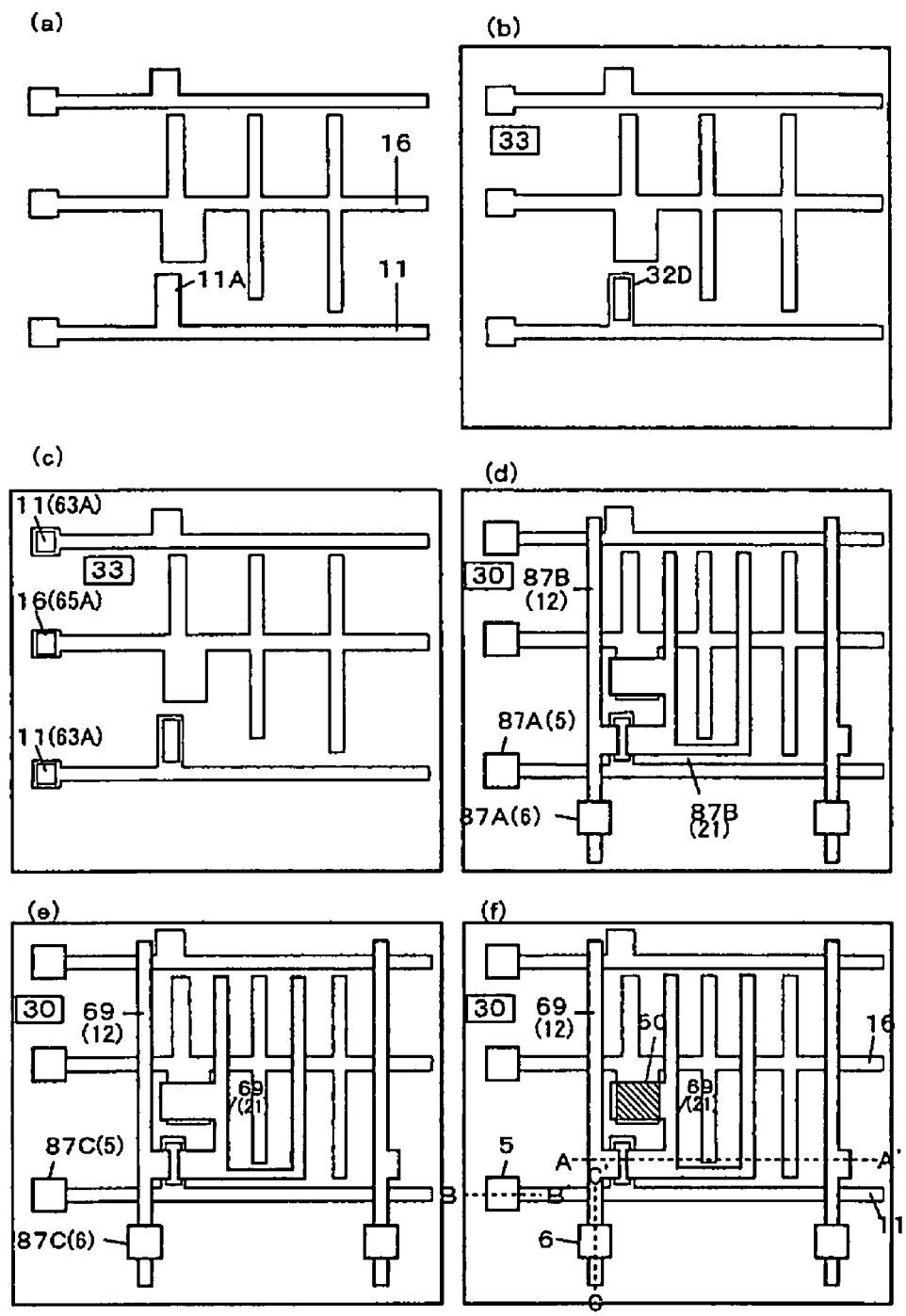
FIG. 23 shows a plane view of the active substrate in Embodiment 12 of the present invention.
Figure 24:
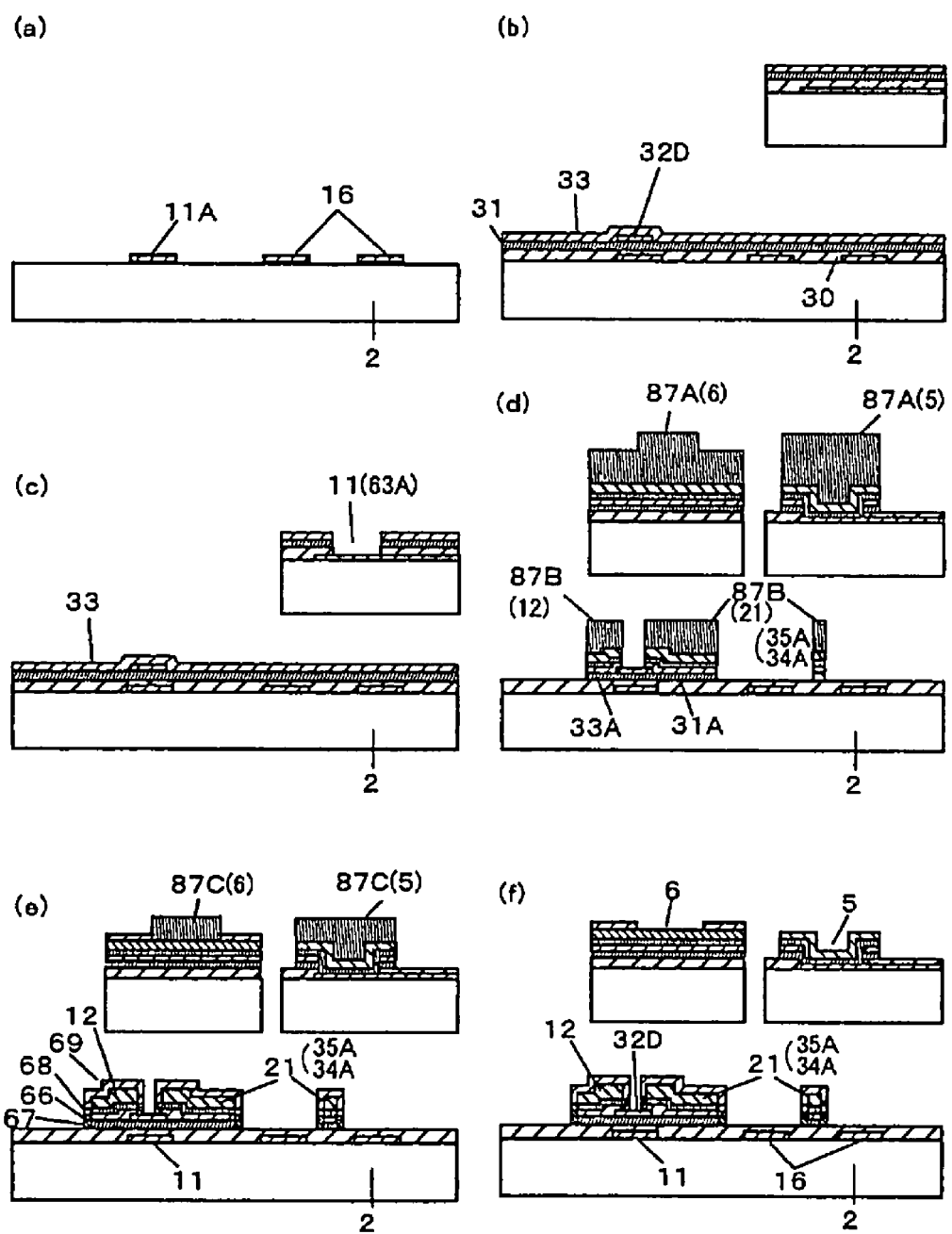
FIG. 24 shows a cross-sectional view for the manufacturing process of the active substrate in Embodiment 12 of the present invention.

The process proceeds in Embodiment 12 nearly identically to that in Embodiment 11 up to where outside the image display area, openings 63A are formed on the scan lines 11, openings 65A are formed on the counter electrodes 16 doubling as storage capacitor lines; and the second amorphous silicon layer 33, the first amorphous silicon layer 31, and the gate insulating layer 30 in the openings 63A and 65A are removed to expose part of the scan lines 11 and part of the counter electrodes 16 as shown in FIG. 23(*c*) and FIG. 24(*c*). Continuing, a thin film layer 34 of Ti, Ta, or the like, for example, is formed about 0.1 μm thick as an anodizable heat-resistant metal layer, and then an Al thin film layer 35 is formed similarly as an anodizable low resistance metal layer about 0.3 μm thick using an SPT or other vacuum film depositing equipment in the source-drain wire formation process. Then, source-drain wire material comprising these two thin film layers, the second amorphous silicon layer 33, and the first amorphous silicon layer 31 are successively etched using the photosensitive resin patterns 87A and 87B using micro-fabrication technology to expose the protective insulating layers 32D and the gate insulating layer 30. Drain electrode 21 of the insulating gate-type transistors doubling pixel electrodes and the signal lines 12 doubling as source wires, both comprising a laminate made of 34A and 35A, are selectively formed on the gate insulating layer 30, and the electrode terminals 5 of the scan lines containing part of the exposed scan lines 11 in the openings 63A and the electrode terminals 6 composing part of the signal lines 12 are formed at the same time at the same time as the formation of the source-drain wires 12 and 21 as shown in FIG. 23 (*d*) and FIG. 24 (*d*). At this time, photosensitive resin patterns 87A and 87B are formed with half-tone exposure technology thicker than the 1.5 μm of the region 87B corresponding to the source-drain wires 12 and 21 and the 3 μm thickness, for example, of 87A on the electrode terminals 5 and 6 as in Embodiment 10, and this is an important feature in Embodiment 12.

After the source-drain wires 12 and 22 are formed, the said photosensitive resin patterns 87A and 87B can be reduced by at least 1.5 μm using oxygen plasma or other ashing means to eliminate the photosensitive resin patterns 87B, exposing the source-drain wires 12 and 21 as well as leaving the reduced photosensitive resin patterns 87C unchanged only on the electrode terminals 5 and 6. Then, the source-drain wires 12 and 21 are anodized to form the oxide layers 68 and 69, and the second amorphous silicon layer 33A and the first amorphous silicon layer 31A exposed on the bottom side surface of the source-drain wires 12 and 21 are anodized to form silicon oxide layers ($SiO_2$) 66 and 67, which are insulating layers, as shown in FIG. 23(*e*) and FIG. 24(*e*) using the photosensitive resin patterns 87C as masks while irradiating light.

After the anodization is complete, the photosensitive resin patterns 87C are removed, exposing the electrode terminals 5 and 6 comprising a low-resistance metal layer as shown in FIGS. 23(*f*) and 24(*f*). The active substrate 2 thus obtained and a color filter 9 is attached together to form a liquid crystal display, thereby completing Embodiment 12 of the present invention. The construction of the storage capacitor 15 is identical to that in Embodiment 11.

By applying half-tone exposure technology in the formation of the source-drain wires in Embodiment 11 and Embodiment 12, novel passivation formation is carried out, and the number of processes is decreased so production of a liquid crystal display device is realized with four photomasks, but by applying half-tone exposure technology to the formation process of the protective insulating layers and the formation process of the contacts, it is possible to produce an IPS-type liquid crystal display device with three photomasks, giving an expectation of further decreasing the number of manufacturing processes. This is described in Embodiment 13 and Embodiment 14.

Embodiment 13

Figure 25:
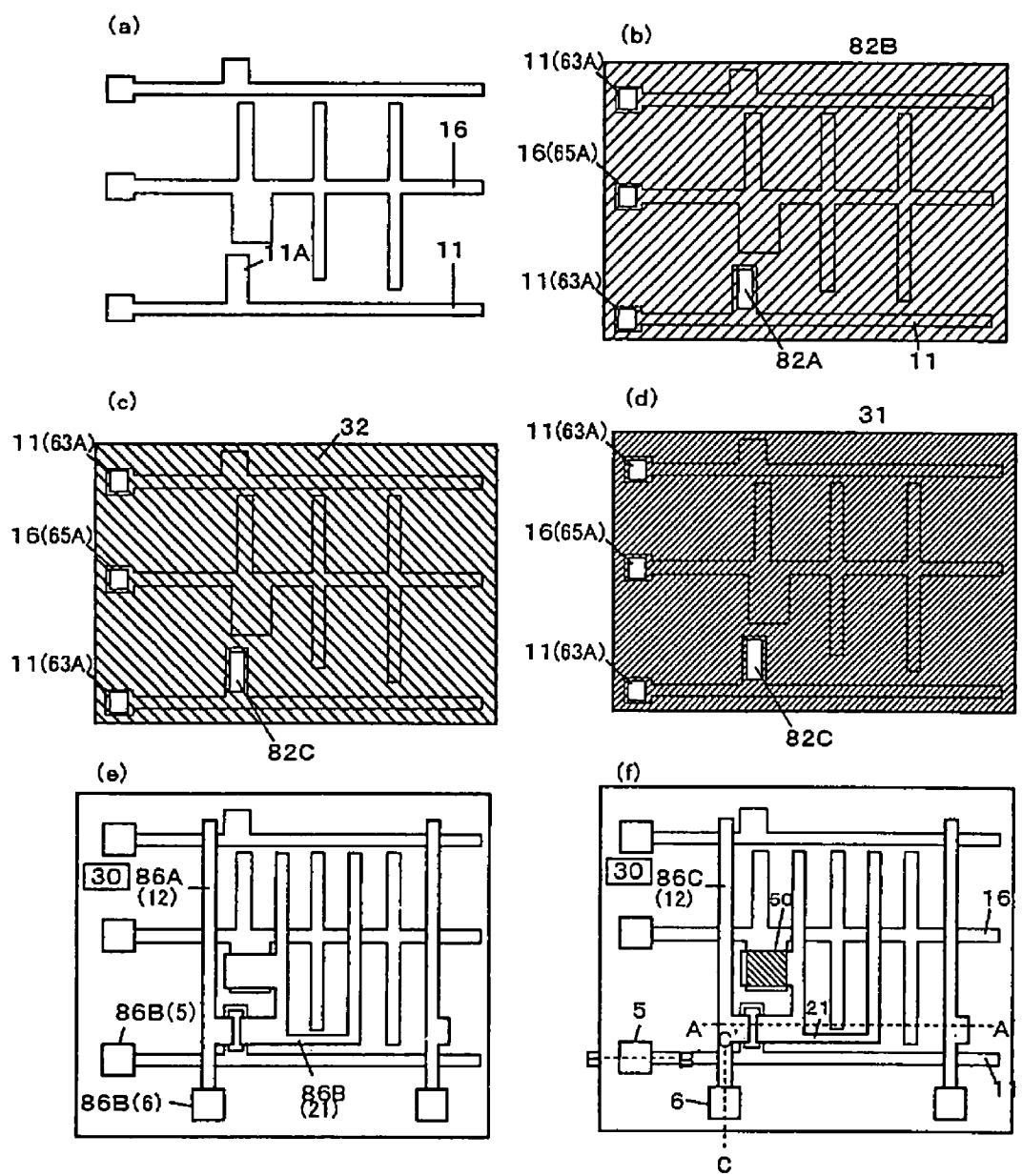
FIG. 25 shows a plane view of the active substrate in Embodiment 13 of the present invention.
Figure 26:
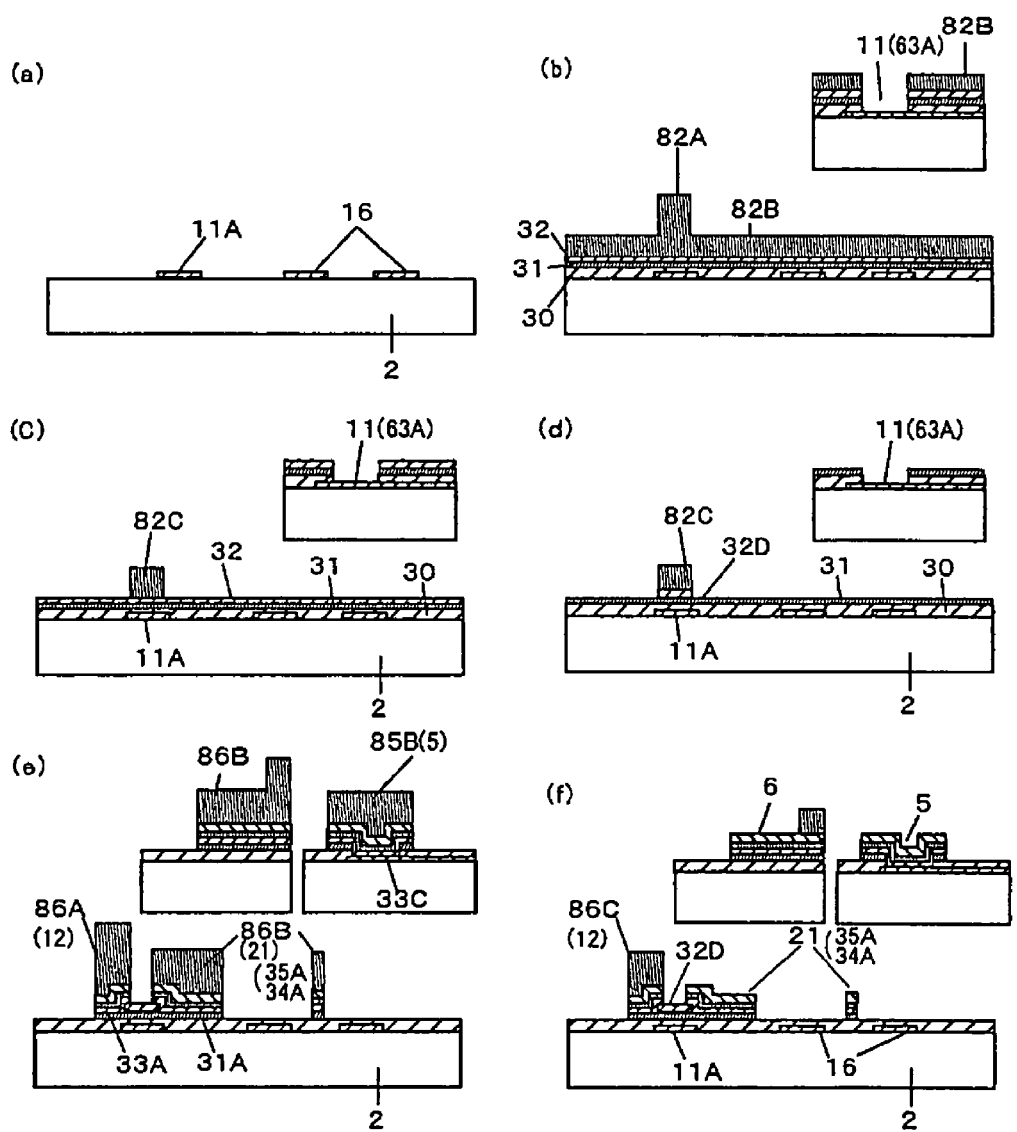
FIG. 26 shows a cross-sectional view for the manufacturing process of the active substrate in Embodiment 13 of the present invention.

In Embodiment 13, first, a first metal layer about 0.1 to 0.3 μm thick is deposited on the main surface of a glass substrate 2 using an SPT or other vacuum film depositing device, and scan lines 11 doubling as gate electrodes 11A and counter electrodes 16 are selectively formed with micro-fabrication technology as shown in FIG. 25(*a*) and FIG. 26(*a*).

Next, three thin layers comprising a first SiNx layer 30 composing a gate insulating layer, a first amorphous silicon layer 31 composing a channel of an insulating gate-type transistor including hardly impurities, and a second SiNx layer 32 composing an insulating layer for protecting the channel are successively deposited about 0.3, 0.05, and 0.1 μm thick, for example, over the entire surface of the glass substrate 2 using a PCVD equipment. Photosensitive resin patterns 82A and 82B are formed having openings 63A and 65A on part of the scan lines 11 and part of the counter electrodes 16 respectively, outside the image display area with half-tone exposure technology, and so as to be thicker than the 2-μm thickness, for example, of the protective insulating layer formation region, that is, the region 82A above the gate electrodes 11A and the 1-μm of the other region 82B. The second SiNx layer 32, the first amorphous silicon layer 31, and the gate insulating layer 30 in the openings 63A and 65A, are selectively removed to expose part of the scan line 11 and part of the counter electrode 16 using the photosensitive resin patterns 82A and 82B as masks as shown in FIG. 25(b) and FIG. 26(b).

Continuing, by reducing the said photosensitive resin patterns 82A and 82B by 1 μm or more using oxygen plasma or other ashing means, the photosensitive resin patterns 82B can be eliminated to expose the second SiNx layer 32, and leave the reduced photosensitive resin patterns 82C unchanged on only the protective insulating layer formation regions above the gate electrodes 11A as shown in FIGS. 25(c) and 26(c). Then, the second SiNx layer 32 is selectively etched using the reduced photosensitive resin patterns 82C as masks to make protective insulating layers 32D narrower than the gate electrodes 11A and expose the first amorphous silicon layer 31 as shown in FIGS. 25(d) and 26(d).

Continuing, the said photosensitive resin patterns 82C are removed, and a second amorphous silicon layer 33 including phosphorous, for example, as an impurity is deposited 0.05 μm thick over the entire surface of the glass substrate 2 using a PCVD equipment. Then, a thin film layer 34 of Ti, Ta, or the like, for example, is deposited over the entire surface of the glass substrate 2 as a heat-resistant metal layer about 0.1 μm thick, and an Al thin film layer 35 is subsequently deposited as a low-resistance wiring layer about 0.3 μm thick using an SPT or other vacuum film depositing equipment. Then, the source-drain wire material comprising these two thin film layers, the second amorphous silicon layer 33, and the first amorphous silicon layer 31 are successively etched using the photosensitive organic insulating layer patterns 86A and 86B using micro-fabrication technology to expose the protective insulating layers 32D and the gate insulating layer 30. Drain electrode 21 of the insulating gate-type transistors doubling pixel electrodes and the signal lines 12 doubling as source wires, both comprising a laminate made of 34A and 35A, are selectively formed on the gate insulating layer 30 as shown in FIG. 25 (e) and FIG. 26(e); the electrode terminals 5 of the scan lines containing the second amorphous silicon layers 33C near the openings 63A in addition to the openings 63A, and the electrode terminals 6 composing part of the signal lines 12 are formed at the same time at the same time as the formation of the source-drain wires 12 and 21. Photosensitive organic insulating layer patterns 86A and 86B are formed at this point thicker than the 1.5-μm thickness of 86B on the drain electrodes 21 and on the electrode terminals 5 and 6, and the 3-μm thickness, for example, of 86A on the signal lines 12 using half-tone exposure technology as in Embodiment 11.

After the source-drain wires 12 and 21 are formed, the said photosensitive resin layer patterns 86A and 86B are reduced by at least 1.5 μm using oxygen plasma or other ashing means to eliminate the photosensitive organic insulating layer patterns 86B, exposing the drain electrodes 21, and the electrode terminals 5 and 6, and leaving the reduced photosensitive organic insulating layer patterns 86C unchanged only on the signal lines 12 as shown in FIG. 25(f) and FIG. 26(f).

The active substrate 2 thus obtained and a color filter 9 is attached together to form a liquid crystal panel, thereby completing Embodiment 13 of the present invention. The construction of the storage capacitor 15 is exemplified by a region 50 (right-slanting oblique part) on which the counter electrode (storage capacitor line) 16 and the pixel electrode (drain electrode) 21 are overlaid as shown in FIG. 25(f) via the gate insulating layer 30, the first amorphous silicon layer 31E, and the second amorphous silicon layer 33E (none of which are illustrated) and is identical to that in Embodiment 11.

In Embodiment 13 of the present invention, the decrease in the number of manufacturing processes proceeds by forming organic insulating layers on the signal lines, but the organic insulating layer is 1 μm or thicker, so passivation technology is provided in Embodiment 14 instead of the organic insulating layer by adding a minimum number of processes to avoid problems due to level the differences.

Embodiment 14

In Embodiment 14, the manufacturing process is carried out nearly identically to that in Embodiment 13 up to the formation process of the openings 63A and 65A above the scan lines 11 and the counter electrodes 16 respectively outside the image display area to expose part of the scan lines 11 and part of the counter electrodes 16, and to form the protective insulating layers 32D as shown in FIGS. 27(d) and 28(d). Continuing, the said photosensitive resin patterns 82C are removed, and a second amorphous silicon layer 33 including phosphorous, for example, as an impurity is deposited 0.05 μm thick over the entire surface of the glass substrate 2 using a PCVD equipment. Then, a thin film layer 34 of Ti, Ta, or the like, for example, is deposited as an anodizable heat-resistant metal layer about 0.1 μm thick, and an Al thin film layer 35 is subsequently deposited as an anodizable low-resistance metal layer about 0.3 μm thick using an SPT or other vacuum film depositing equipment. Then, source-drain wire material comprising these two thin film layers, the second amorphous silicon layer 33, and the first amorphous silicon layer are successively etched using the photosensitive resin patterns 87A and 87B using micro-fabrication technology to expose the protective insulating layers 32D and the gate insulating layer 30. Drain electrodes 21 of the insulating gate-type transistors doubling pixel electrodes and signal lines 12 doubling as source wires, both comprising a laminate made of 34A and 35A, are selectively formed on the gate insulating layer 30 as shown in FIG. 27(e) and FIG. 28(e), and the electrode terminals 5 of the scan lines containing the second amorphous silicon layers 33C near the openings 63A in addition to the openings 63A, and the electrode terminals 6 composing part of the signal lines, are formed at the same time as the formation of the source-drain wires 12 and 21. At this time, photosensitive resin patterns 87A and 87B are formed with half-tone exposure technology thicker than the 1.5 μm of the region 87B on source-drain wires 12 and 21 and the 3 μm thickness, for example, of 87A on the electrode terminals 5 and 6 as in Embodiment 12.

After the source-drain wires 12 and 21 are formed, the said photosensitive resin patterns 87A and 87B can be reduced by at least 1.5 μm using oxygen plasma or other ashing means to eliminate the photosensitive resin patterns 87B, exposing the source-drain wires 12 and 21 as well as leaving the reduced photosensitive resin patterns 87C unchanged only on the electrode terminals 5 and 6. Then, the source-drain wires 12 and 21 are anodized to form the oxide layers 68 and 69, and the first amorphous silicon layer 33A and the first amorphous silicon layer 31A exposed on the bottom side surface of the source-drain wires 12 and 21 are anodized to form silicon oxide layers (SiO2) 66 and 67, which are insulating layers, as shown in FIG. 27(*f*) and FIG. 28(*f*) using the photosensitive resin patterns 87C as masks.

Figure 27:
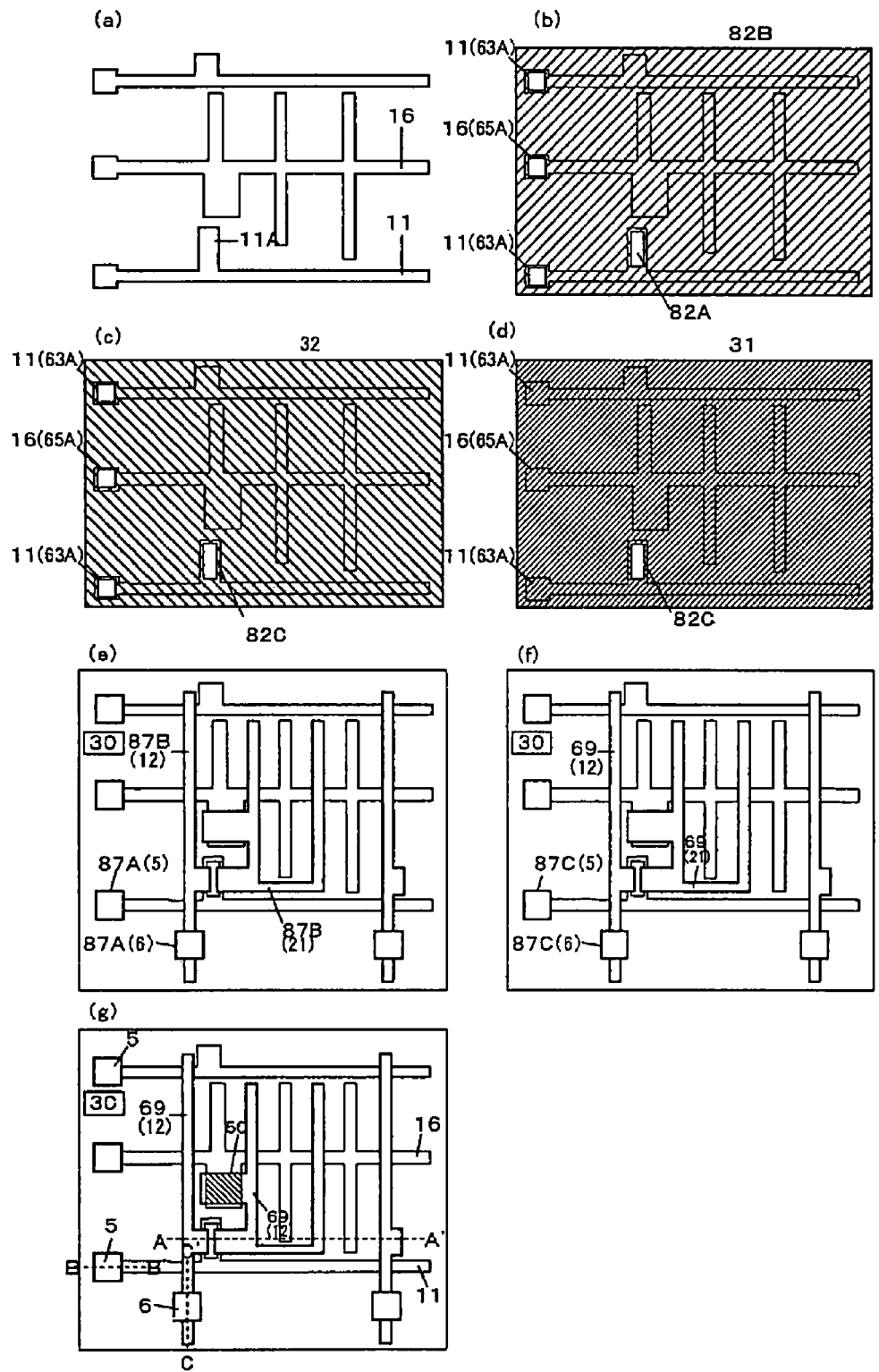
FIG. 27 shows a plane view of the active substrate in Embodiment 14 of the present invention.
Figure 28:
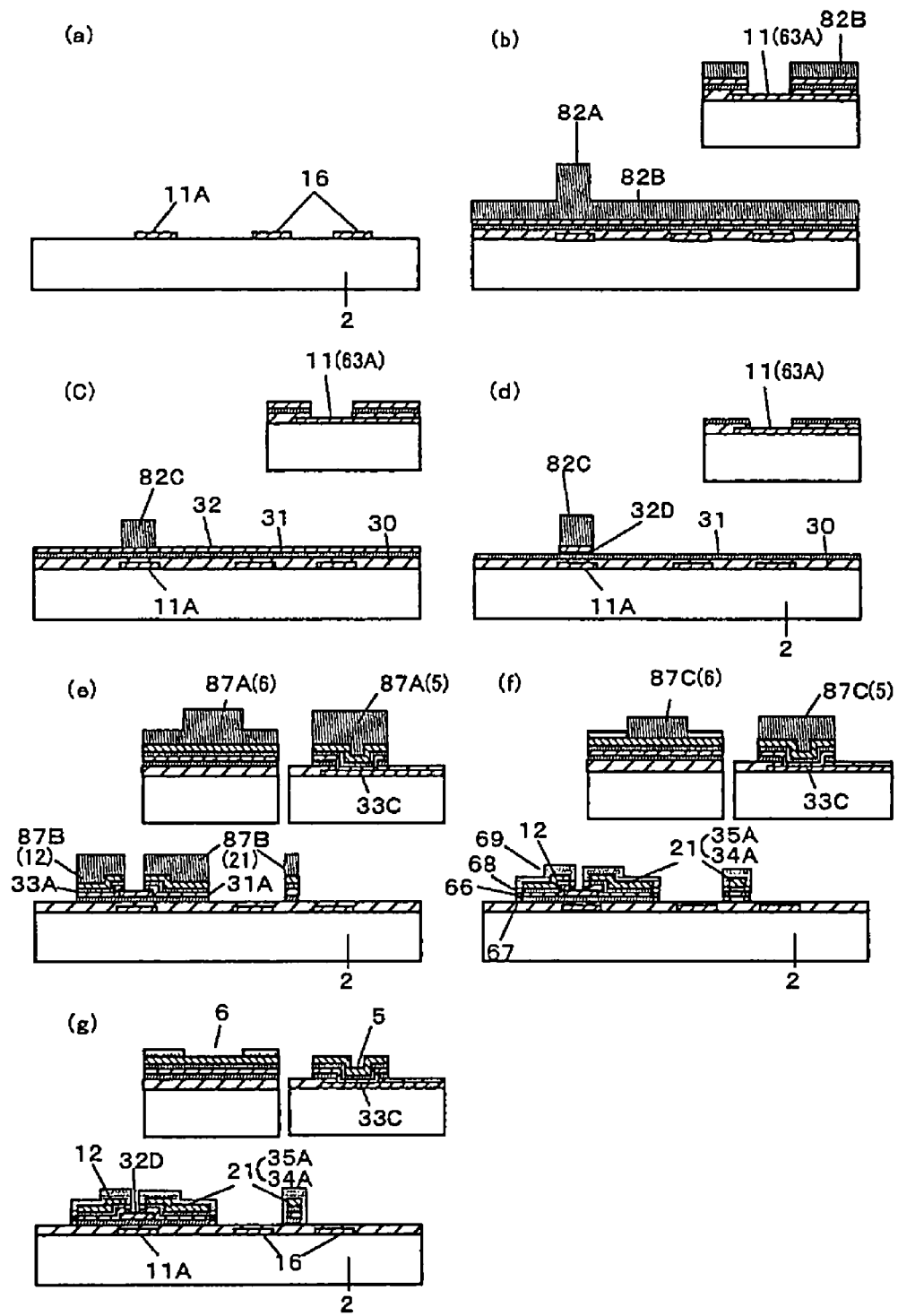
FIG. 28 shows a cross-sectional view for the manufacturing process of the active substrate in Embodiment 14 of the present invention.
Figure 29:
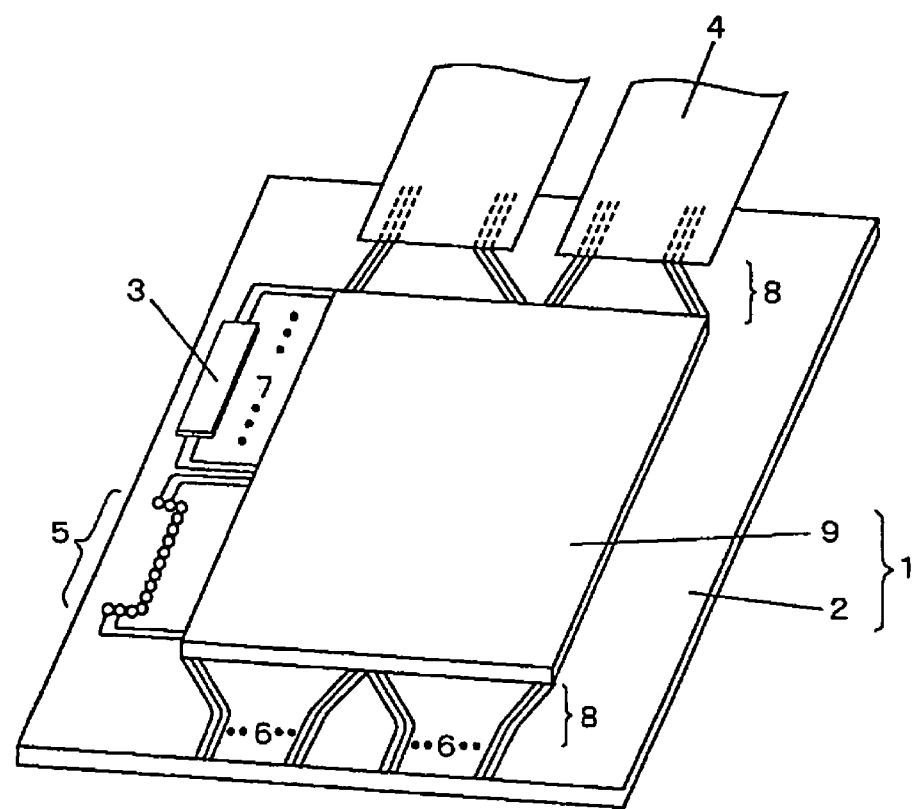
FIG. 29 shows a perspective view showing the mounted state of the liquid crystal panel.
Figure 30:
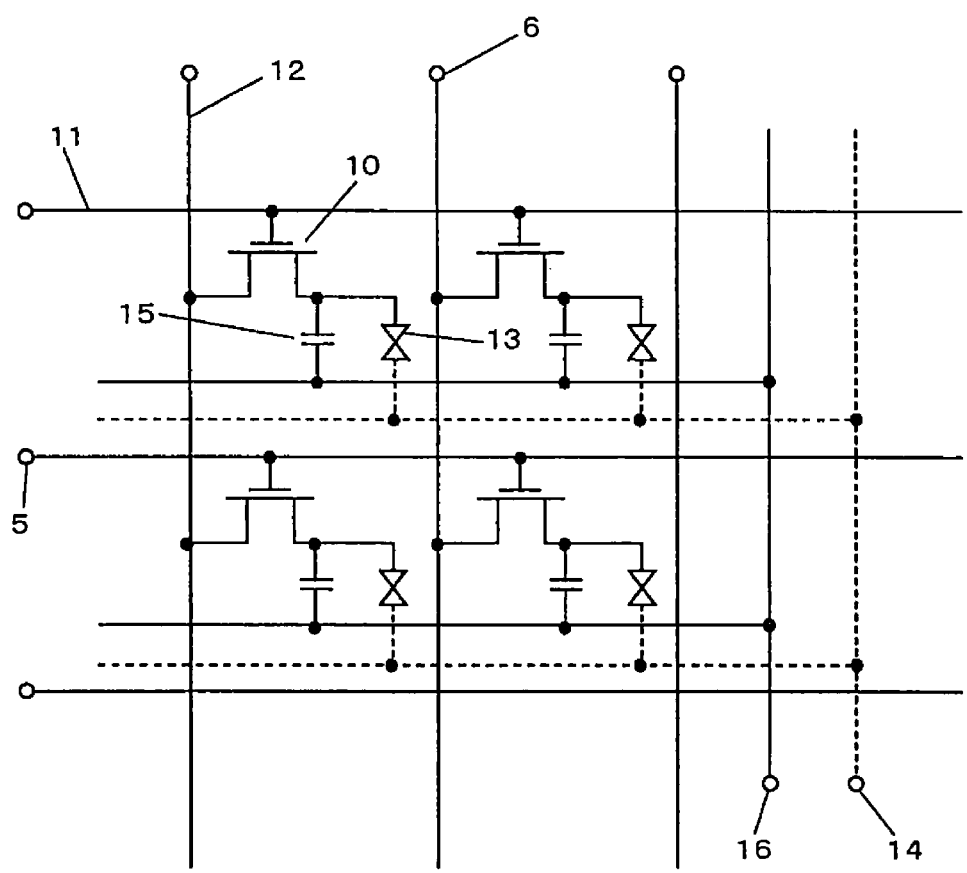
FIG. 30 shows an equivalent circuit of the liquid crystal panel.
Figure 31:
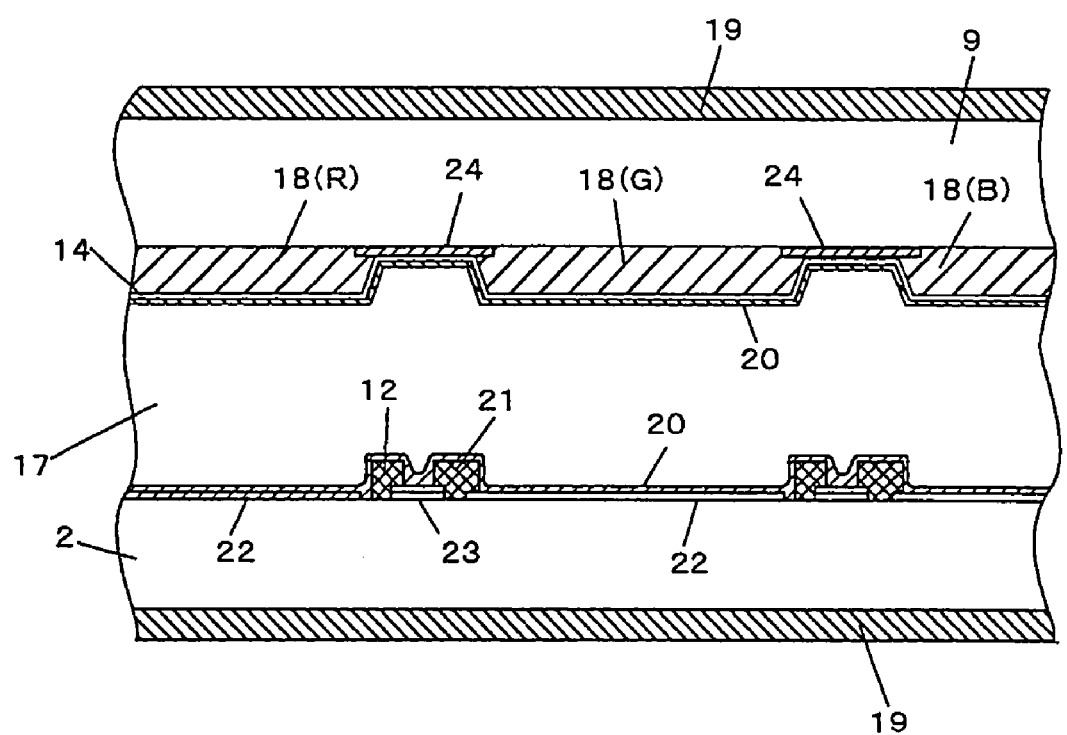
FIG. 31 shows a cross-sectional view of a conventional liquid crystal panel.
Figure 32:
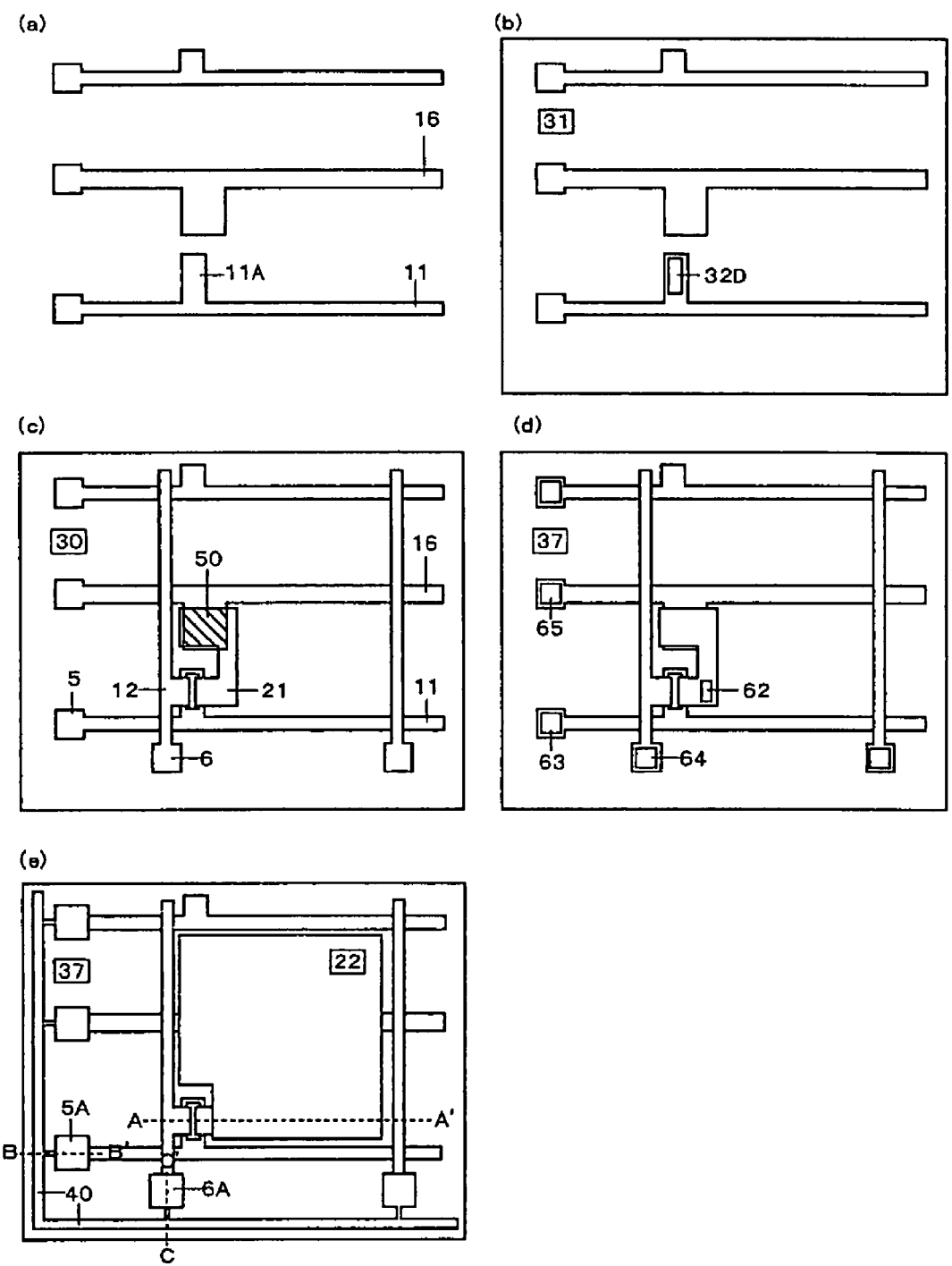
FIG. 32 shows a plane view of the active substrate in the prior art example.
Figure 33:
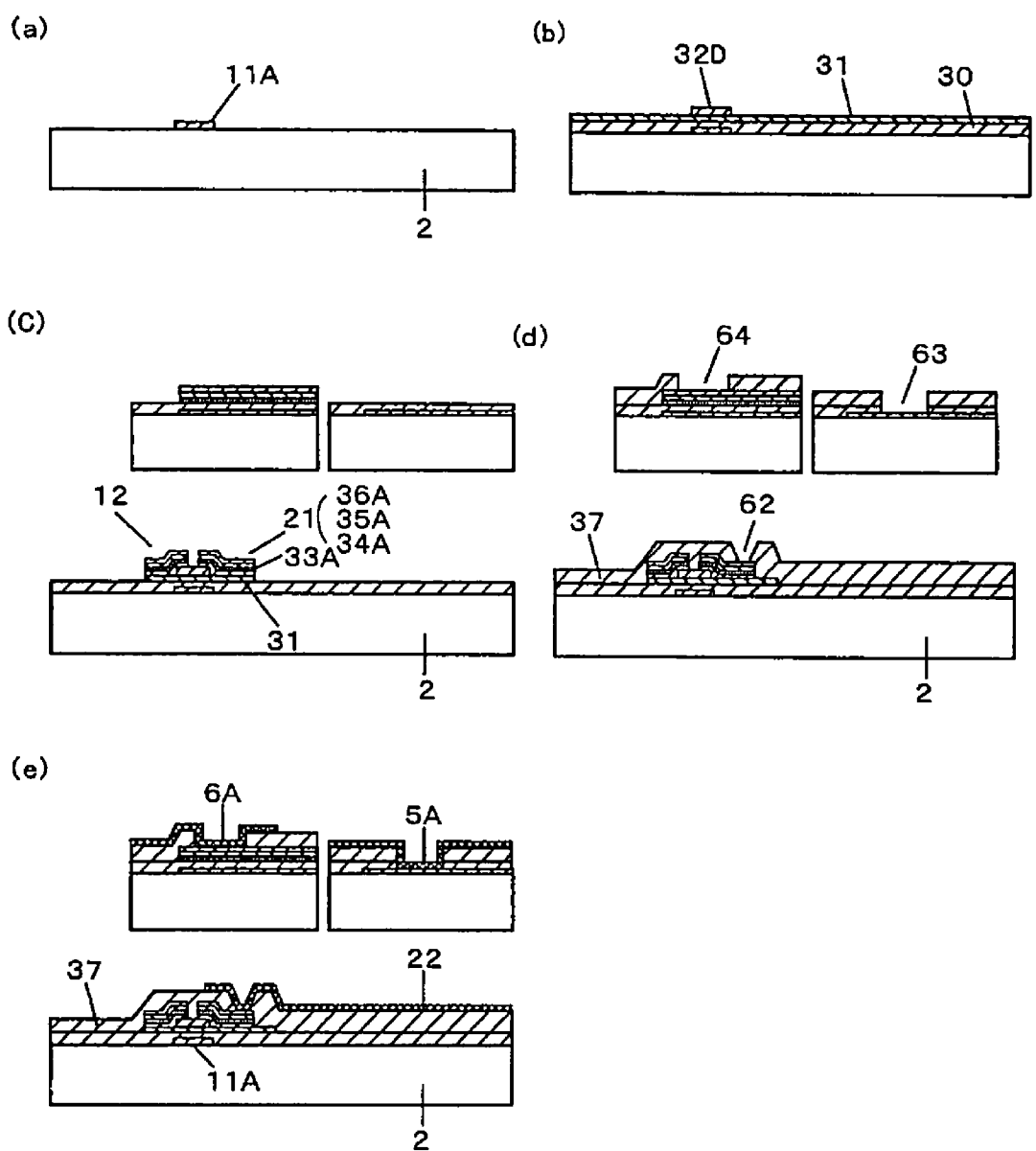
FIG. 33 shows a cross-sectional view of the manufacturing process for the active substrate in the prior art example.
Figure 34:
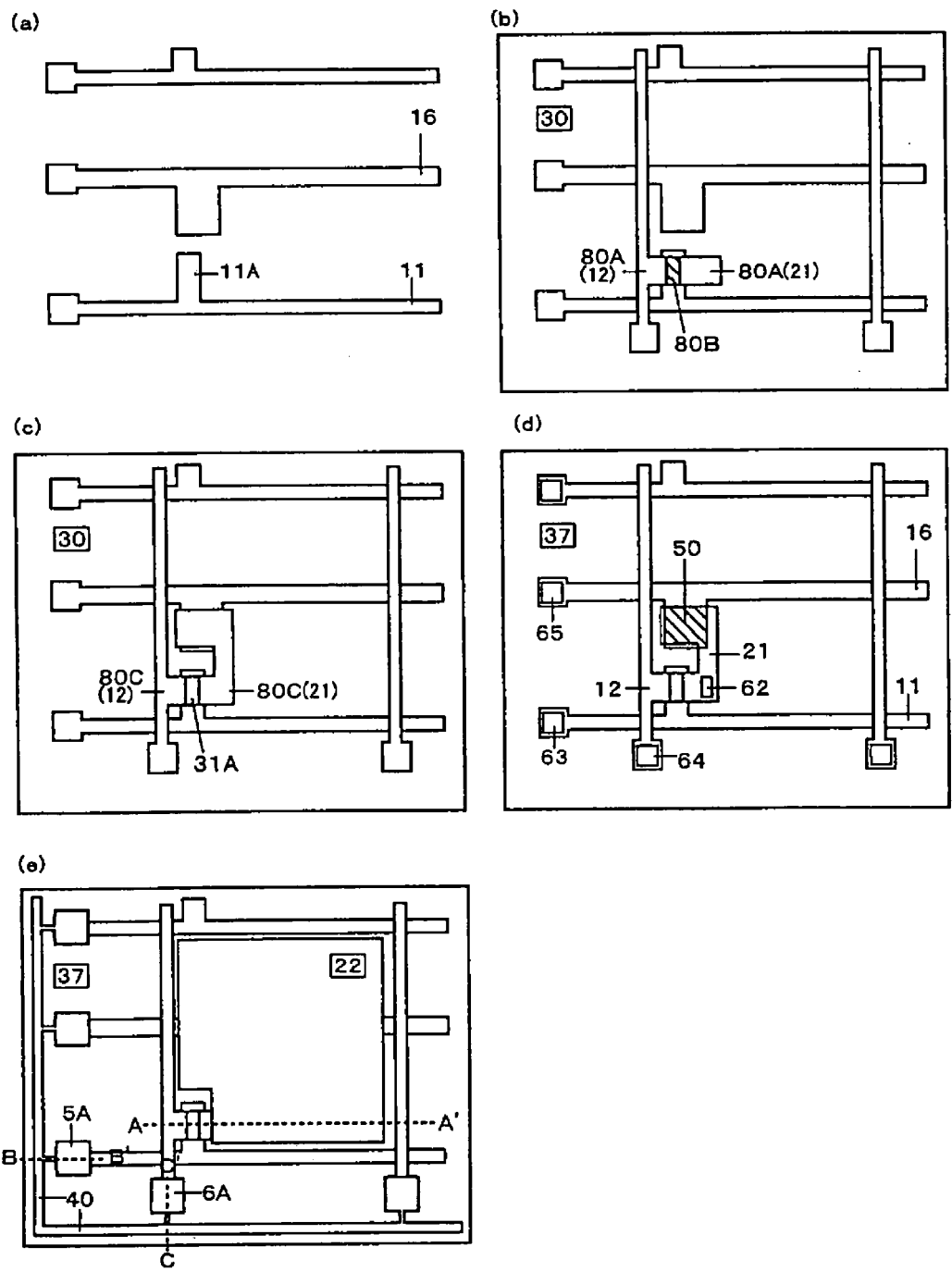
FIG. 34 a plane view of a streamlined active substrate.
Figure 35:
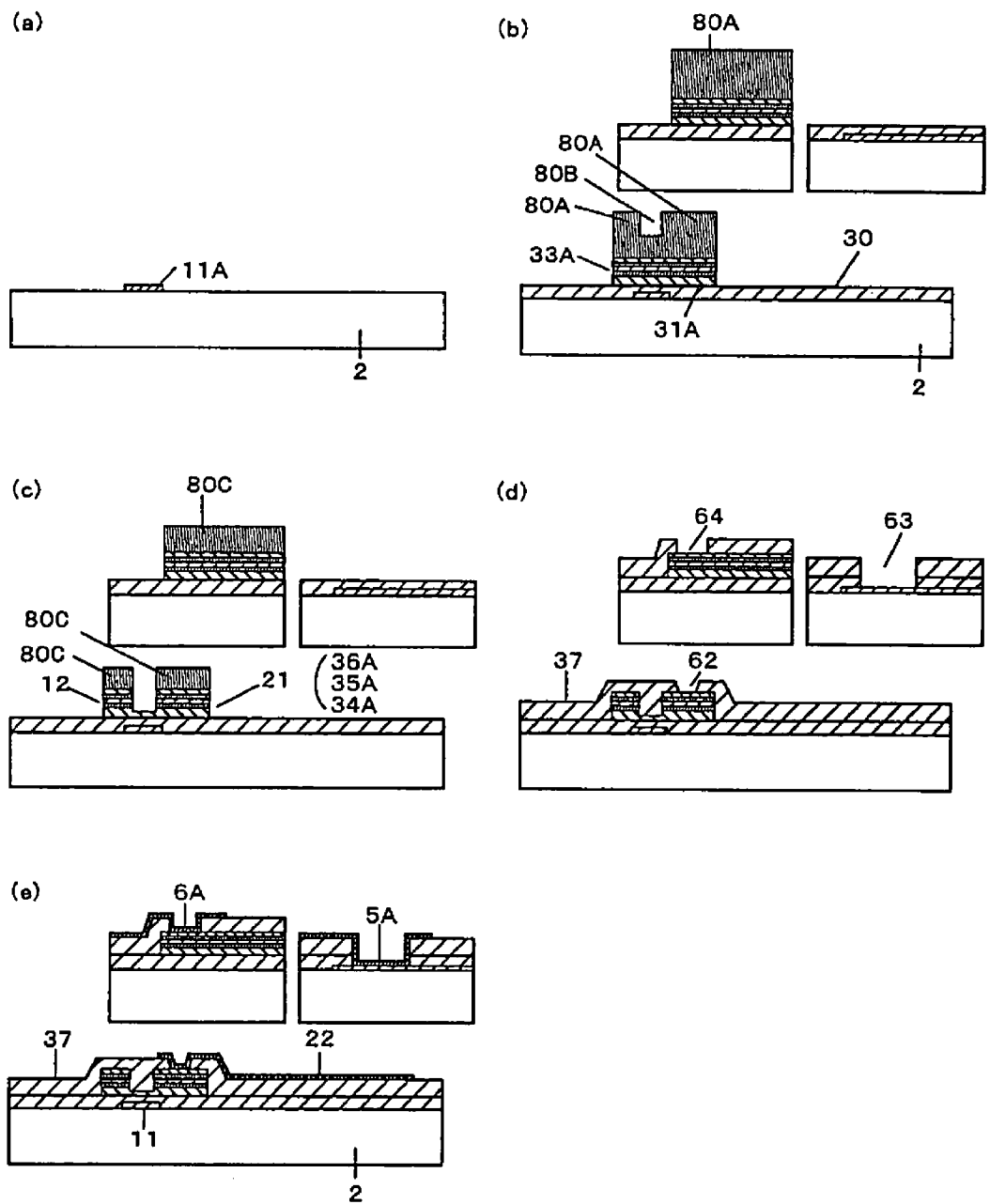
FIG. 35 shows a cross-sectional view of the manufacturing process for a streamlined active substrate.

After the anodization is complete, the photosensitive resin patterns 87C are removed, exposing the electrode terminals 5 and 6 comprising a low-resistance metal layer as shown in FIG. 27(*g*) and FIG. 28(*g*). The active substrate 2 thus obtained and a color filter 9 is attached together to form a liquid crystal panel, thereby completing Embodiment 14 of the present invention. The construction of the storage capacitor 15 is identical to that in Embodiment 13.

What is claimed is:

1. A method for manufacturing a liquid crystal display device in which liquid crystal is filled between 1) a first insulating substrate in which unit pixels are arranged in a 2-dimensional matrix on a principal plane, having at least an insulating gate transistor, a scan line doubling as a gate electrode and a signal line doubling as a source wire of the insulating gate transistor, and a pixel electrode connected to a drain, and 2) a second insulating substrate or a color filter opposing the first insulating substrate, the manufacturing method comprising the steps of:

forming the scan line on a main surface of the first insulating substrate, sequentially depositing one or more gate insulating layers, a first amorphous silicon layer with absence or near absence of impurities, and a protective insulating layer, forming a photosensitive resin pattern with an opening at the scan line outside an image display area and with a thickness at the protective insulating layer area above the gate electrode thicker than in other areas, removing the protective insulating layer, the first amorphous silicon layer, and the gate insulating layer, within the opening and to expose part of the scan line, reducing the thickness of the photosensitive resin pattern to expose the protective insulating layer, leaving the protective insulating layer narrower than the gate electrode on the first amorphous silicon layer above the gate electrode, using the photosensitive resin pattern that has been reduced in thickness as mask, and to expose the first amorphous silicon layer, removing the photosensitive resin pattern that has been reduced in thickness, and depositing a second amorphous silicon layer including impurities, and depositing one or more second metal layers including a heat resistant metal layer to form the source wire and the drain wire with a laminate of the second metal layer and the second amorphous silicon layer.

2. The liquid crystal display device according to claim 1, wherein said unit pixel further comprises a counter electrode separated at a prescribed distance from said pixel electrode.

* * * * *